United States Patent
Yamazaki et al.

(10) Patent No.: US 7,955,907 B2
(45) Date of Patent: Jun. 7, 2011

(54) SEMICONDUCTOR DEVICE, TELEVISION SET, AND METHOD FOR MANUFACTURING THE SAME

(75) Inventors: Shunpei Yamazaki, Tokyo (JP); Hironobu Shoji, Tokyo (JP); Yasuyuki Arai, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 1357 days.

(21) Appl. No.: 10/586,663

(22) PCT Filed: Jan. 24, 2005

(86) PCT No.: PCT/JP2005/001280
§ 371 (c)(1),
(2), (4) Date: Jul. 19, 2006

(87) PCT Pub. No.: WO2005/071756
PCT Pub. Date: Aug. 4, 2005

(65) Prior Publication Data
US 2008/0246036 A1    Oct. 9, 2008

(30) Foreign Application Priority Data

Jan. 26, 2004  (JP) ................. 2004-017634
Jan. 26, 2004  (JP) ................. 2004-017652

(51) Int. Cl.
*H01L 21/00* (2006.01)
*H01L 21/84* (2006.01)

(52) U.S. Cl. ............... 438/149; 438/161; 257/E51.005; 257/E29.151

(58) Field of Classification Search .......... 438/149, 438/161, FOR. 184, FOR. 201; 257/E51.005, 257/E29.151
See application file for complete search history.

(56) References Cited

U.S. PATENT DOCUMENTS

| | | | |
|---|---|---|---|
| 5,132,248 A | 7/1992 | Drummond et al. | |
| 6,416,583 B1 | 7/2002 | Kitano et al. | |
| 6,426,595 B1 | 7/2002 | Odake et al. | |
| 6,586,155 B2 | 7/2003 | Furuse et al. | |
| 6,627,263 B2 | 9/2003 | Kitano et al. | |
| 6,638,359 B2 | 10/2003 | Yajima et al. | |
| 6,833,224 B2 | 12/2004 | Furuse et al. | |
| 6,855,377 B2 | 2/2005 | Yajima et al. | |
| 6,908,796 B2* | 6/2005 | Furusawa | 438/149 |
| 7,365,805 B2 | 4/2008 | Maekawa et al. | |
| 2002/0012868 A1 | 1/2002 | Furuse et al. | |
| 2002/0136829 A1 | 9/2002 | Kitano et al. | |
| 2003/0030689 A1* | 2/2003 | Hashimoto et al. | 347/20 |
| 2005/0121674 A1 | 6/2005 | Kamata et al. | |
| 2007/0093002 A1 | 4/2007 | Maekawa et al. | |

FOREIGN PATENT DOCUMENTS

| | | |
|---|---|---|
| JP | 05-114504 A | 5/1993 |
| JP | 06-061257 A | 3/1994 |
| JP | 11-254237 | 9/1999 |
| JP | 2000-188251 | 7/2000 |
| JP | 2000-258921 A | 9/2000 |
| JP | 2000-340928 | 12/2000 |
| JP | 2001-179167 | 7/2001 |
| JP | 2002-313226 | 10/2002 |
| JP | 2003-258265 | 9/2003 |
| JP | 2003-318133 A | 11/2003 |

OTHER PUBLICATIONS

International Search Report (Application No. PCT/JP2005/001280; PCT7695/7696) Dated Apr. 19, 2005.
Written Opinion (Application No. PCT/JP2005/001280; PCT7695/7696) Dated Apr. 19, 2005.

* cited by examiner

*Primary Examiner* — Michelle Estrada
(74) *Attorney, Agent, or Firm* — Nixon Peabody LLP; Jeffrey L. Costellia

(57) ABSTRACT

An object of the invention is to provide a method for manufacturing a substrate having a film pattern such as an insulating film, a semiconductor film, or a conductive film with an easy process, and further, a semiconductor device and a television set having a high throughput or a high yield at low cost and a manufacturing method thereof. One feature of the invention is that a first film pattern is formed by a droplet discharge method, a photosensitive material is discharged or applied to the first film pattern, a mask pattern is formed by irradiating a region where the first film pattern and the photosensitive material are overlapped with a laser beam and by developing, and a second film pattern having a desired shape is formed by etching the first film pattern using the mask pattern as a mask.

23 Claims, 35 Drawing Sheets

(A)     (B)

1703, 1705, 1702a, 1704a, 1706, 1707, 1704b, 1702b, 1701

1704a, 1704b, 1703, 1705, 1713, 1712a, 1711a, 1711b, 1712b, 1702a, 1702b, 1701

1722a, 1704a, 1704b, 1722b, 1703, 1723, 1702a, 1721, 1701, 1702b 1703, 1732, 1704a, 1706, 1708, 1704b, 1731

1900  1901

1900  1901

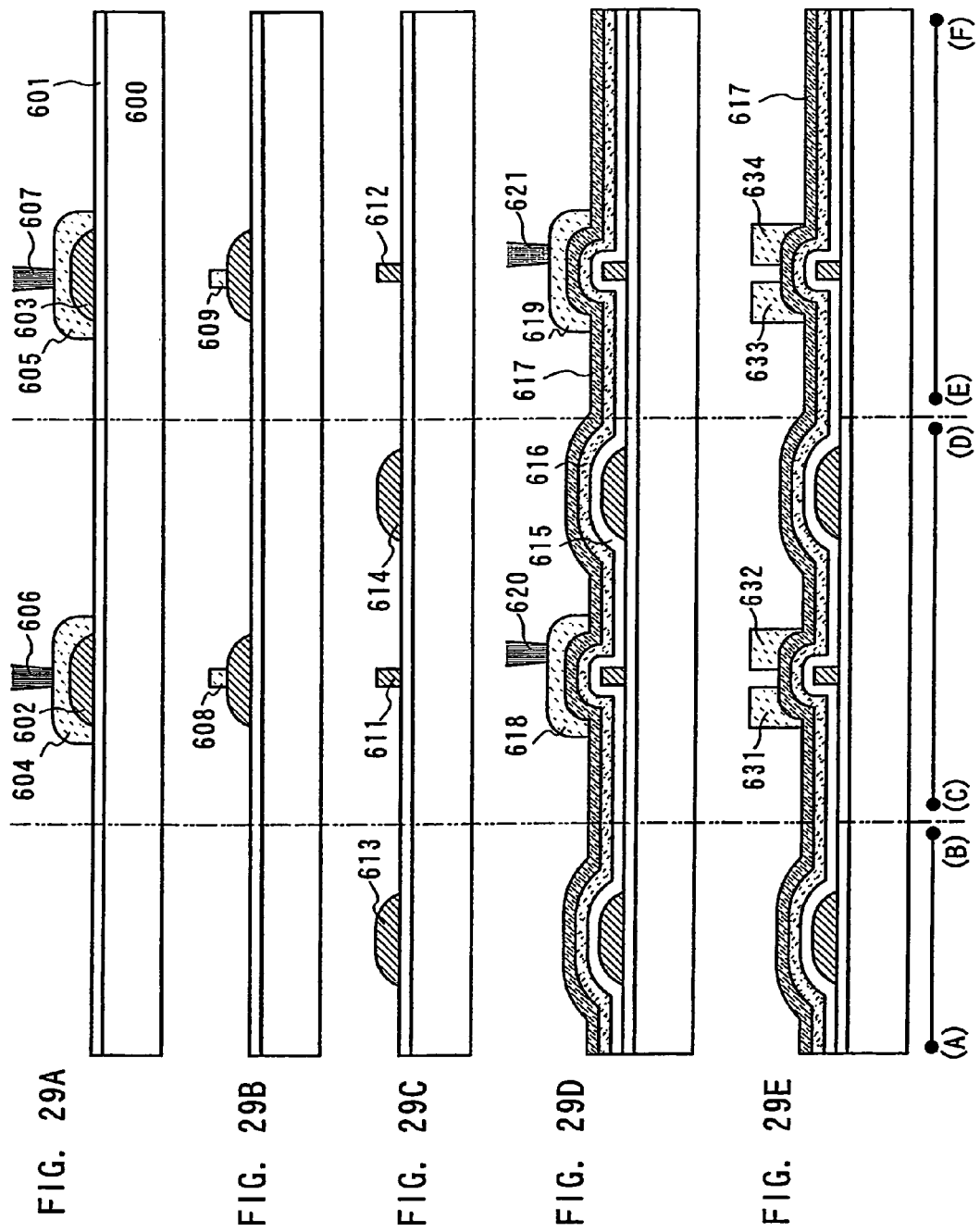

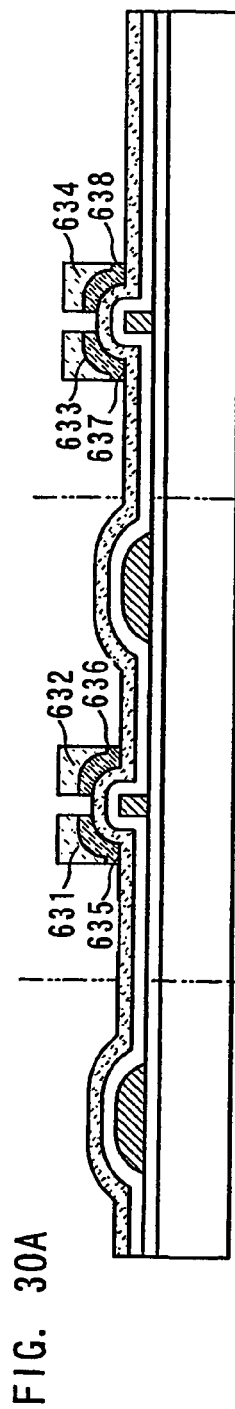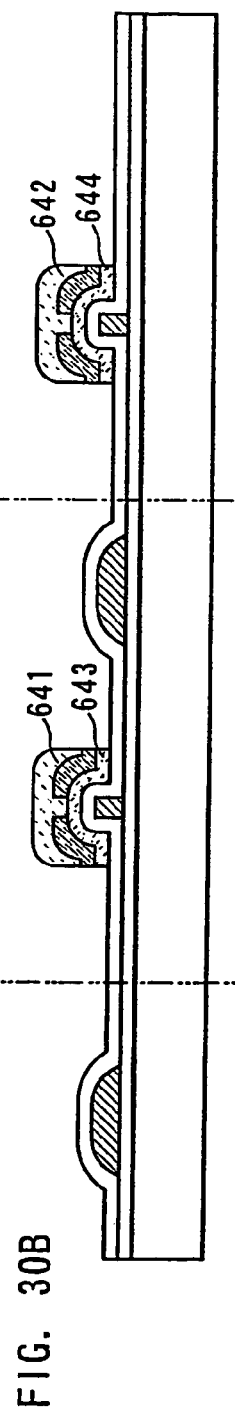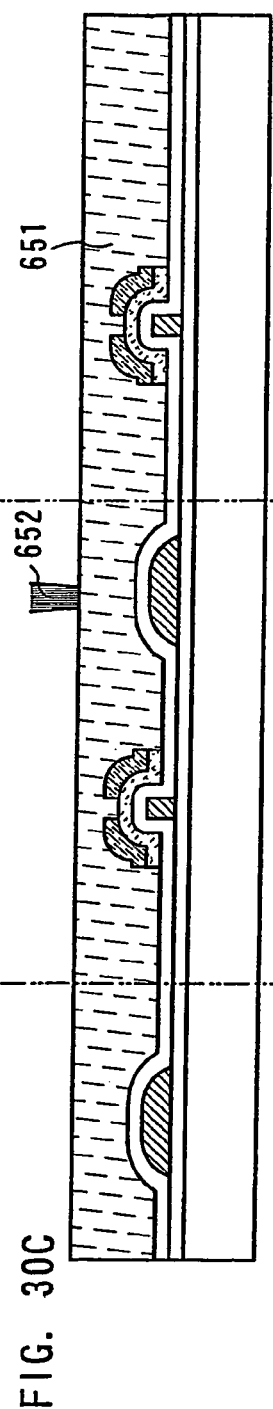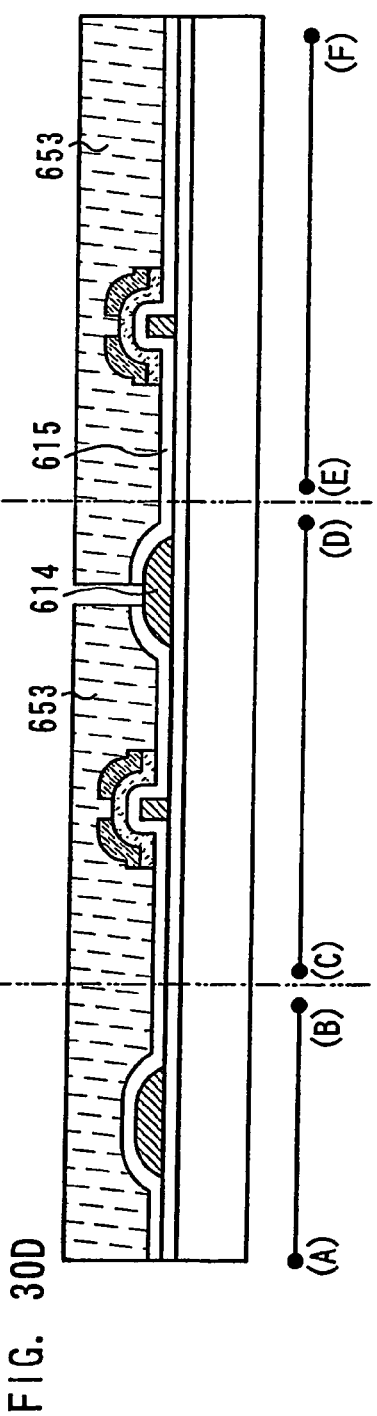
FIG. 30A
FIG. 30B
FIG. 30C
FIG. 30D

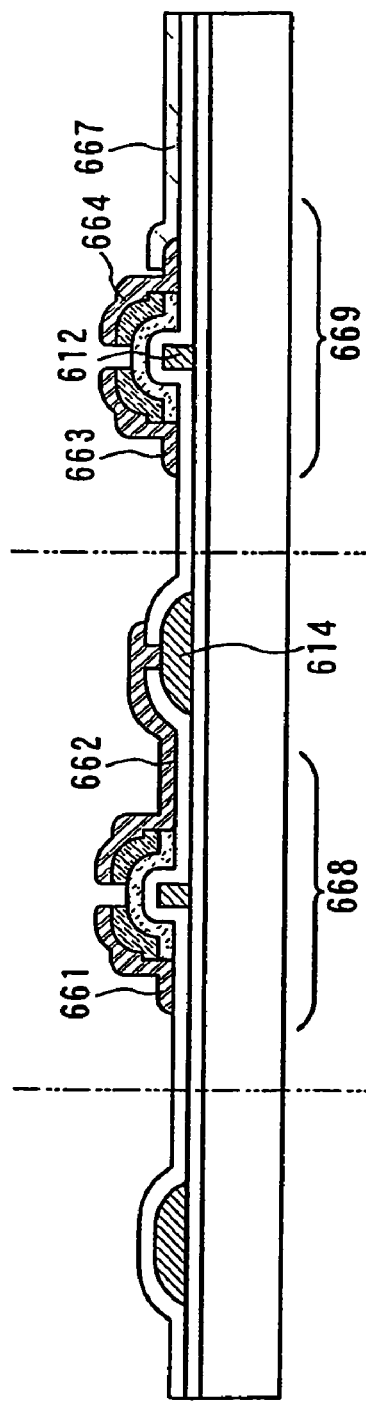
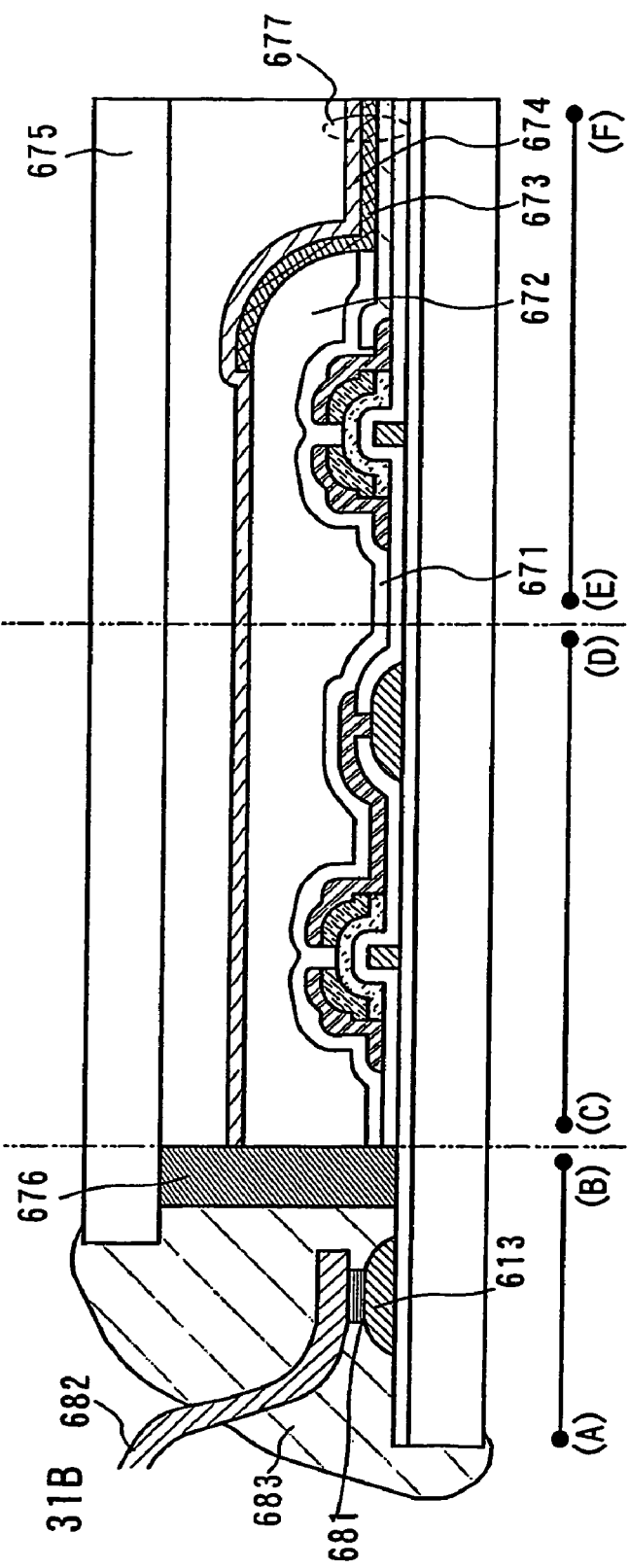
FIG. 31A
FIG. 31B

SEMICONDUCTOR DEVICE, TELEVISION SET, AND METHOD FOR MANUFACTURING THE SAME

TECHNICAL FIELD

The present invention relates to a semiconductor device and a television set having a semiconductor element formed by a droplet discharge method typified by an ink-jet method and to a method for manufacturing the semiconductor device and the television set.

BACKGROUND ART

In manufacturing of a semiconductor device, consideration is given to using a droplet discharge method to form a pattern of a thin film or a wiring used for a semiconductor element with a view to reduction in cost of equipment and simplification of a process.

On this occasion, in forming a film pattern in a semiconductor element, a film pattern is formed by performing a photolithography step of applying a resist to an entire surface of a substrate, prebaking, and then irradiating with ultraviolet rays or the like with a mask pattern therebetween and developing to form a resist pattern, and by etching and removing a film existing in a portion to be a film pattern (a film formed of a semiconductor material, an insulating material, or a conductive material) using the resist pattern as a mask pattern.

In addition, a technique for forming a film over a semiconductor wafer by using an apparatus capable of continuously discharging a resist in a linear shape with a fine diameter from a nozzle in order to improve a yield of a liquid required for film formation is disclosed in Reference 1 (Reference 1: Japanese Patent Laid-Open No. 2000-188251).

DISCLOSURE OF INVENTION

However, a droplet of a solution with a small diameter needs to be discharged to form a semiconductor element having small occupied area by a droplet discharge method according to the technique disclosed in Reference 1. When a diameter of a discharge opening is made small for this reason, a composition of a discharge solution may be attached to an a discharge opening, dried, and solidified, and a clogged opening or the like may be caused. Thus, it is difficult to continuously and stably discharge a certain amount of discharge solution. Consequently, there is a problem of causing decrease in a throughput or a yield of a semiconductor device formed with the semiconductor element.

The present invention is made in view of such problems and, it is an object of the invention to provide a method for manufacturing a semiconductor element having a minute structure, and further, a semiconductor device and a television set having a high throughput or a high yield at low cost and a manufacturing method thereof.

One feature of the invention is that a first film pattern is formed by a droplet discharge method, a photosensitive material is discharged or applied to the first film pattern, a mask pattern is formed by irradiating a region where the first film pattern and the photosensitive material are overlapped with a laser beam and by developing, and a second film pattern having a desired shape is formed by etching the first film pattern using the mask pattern as a mask.

Another feature of the invention is that a first film pattern is formed by a droplet discharge method, a photosensitive material is discharged or applied to the first film pattern, a mask pattern is formed by irradiating a region where the first film pattern and the photosensitive material are overlapped with a laser beam and by developing, a second film pattern having a desired shape is formed by etching the first film pattern using the mask pattern as a mask, and a third film pattern to be connected to the second film pattern is formed by a droplet discharge method.

The photosensitive material is either a negative photosensitive resin or a positive photosensitive resin.

The first film pattern is a conductive film, the second film pattern is a gate electrode, a source electrode, or a drain electrode, and then, the third film pattern is a wiring.

The first film pattern is a semiconductor film, and the second film pattern has a channel formation region, a source region, and a drain region.

The first film pattern is an insulating film, and the second film pattern is an insulating film having an opening.

Another feature of the invention is that a first film pattern is formed by discharging a conductive material with a droplet discharge method, a first photosensitive material is discharged or applied to the first film pattern, a first mask pattern is formed by irradiating a region where the first film pattern and the first photosensitive material are overlapped with a laser beam and by developing, a gate electrode having a desired shape is formed by etching the first film pattern using the first mask pattern as a mask, an insulating film and a semiconductor film are formed over the gate electrode, a second photosensitive material is applied or discharged to the semiconductor film, a second mask pattern is formed by irradiating the second photosensitive material with a laser beam and by developing, a semiconductor region having a desired shape is formed by etching the semiconductor film using the second mask pattern as a mask, and a source electrode and a drain electrode to be in contact with the semiconductor region are formed.

Another feature of the invention is that a first film pattern is formed by discharging a conductive material by a droplet discharge method, a first photosensitive material is discharged or applied to the first film pattern, a first mask pattern is formed by irradiating a region where the first film pattern and the first photosensitive material are overlapped with a laser beam and by developing, a gate electrode having a desired shape is formed by etching the first film pattern using the first mask pattern as a mask, an insulating film and a first semiconductor film are formed over the gate electrode, a protective film is formed over the first semiconductor film, a second semiconductor film is formed over the first semiconductor film and the protective film, a second photosensitive material is applied or discharged to the second semiconductor film, a second mask pattern is formed by irradiating the second photosensitive material with a laser beam and by developing, a semiconductor region having a desired shape is formed by etching the first semiconductor film and the second semiconductor film using the second mask pattern as a mask, and a source electrode and a drain electrode to be in contact with the semiconductor region are formed.

Another feature of the invention is that a first film pattern is formed by discharging a conductive material with a droplet discharge method, a first photosensitive material is discharged or applied to the first film pattern, a first mask pattern is formed by irradiating a region where the first film pattern and the first photosensitive material are overlapped with a laser beam and by developing, a source electrode and a drain electrode having a desired shape are formed by etching the first film pattern using the first mask pattern as a mask, a semiconductor film is formed over the source electrode and the drain electrode, a second photosensitive material is applied or discharged to the semiconductor film, a second mask pattern is formed by irradiating the second photosensitive material with a laser beam and by developing, a semiconductor region having a desired shape is formed by etching the semiconductor film using the second mask pattern as a mask, and an insulating film and a gate electrode are formed over the semiconductor region.

The invention is a method for manufacturing a television set, characterized in that a first film pattern is formed by discharging a conductive material with a droplet discharge method, a first photosensitive material is discharged or applied to the first film pattern, a first mask pattern is formed by irradiating a region where the first film pattern and the first photosensitive material are overlapped with a laser beam and by developing, a gate electrode having a desired shape is formed by etching the first film pattern using the first mask pattern as a mask, an insulating film and a semiconductor film are formed over the gate electrode, a second photosensitive material is applied or discharged to the semiconductor film, a second mask pattern is formed by irradiating the second photosensitive material with a laser beam and by developing, a semiconductor region having a desired shape is formed by etching the semiconductor film using the second mask pattern as a mask, a source electrode and a drain electrode to be in contact with the semiconductor region are formed, and a pixel electrode to be connected to the drain electrode is formed.

The invention is a method for manufacturing a television set, characterized in that a first film pattern is formed by discharging a conductive material with a droplet discharge method, a first photosensitive material is discharged or applied to the first film pattern, a first mask pattern is formed by irradiating a region where the first film pattern and the first photosensitive material are overlapped with a laser beam and by developing, a gate electrode having a desired shape is formed by etching the first film pattern using the first mask pattern as a mask, an insulating film and a first semiconductor film are formed over the gate electrode, a protective film is formed over the first semiconductor film, a second semiconductor film is formed over the first semiconductor film and the protective film, a second photosensitive material is applied or discharged to the second semiconductor film, a second mask pattern is formed by irradiating the second photosensitive material with a laser beam and by developing, a semiconductor region having a desired shape is formed by etching the first semiconductor film and the second semiconductor film using the second mask pattern as a mask, a source electrode and a drain electrode to be in contact with the semiconductor region are formed, and a pixel electrode to be connected to the drain electrode is formed.

The invention is a method for manufacturing a television set, characterized in that a first film pattern is formed by discharging a conductive material with a droplet discharge method, a first photosensitive material is discharged or applied to the first film pattern, a first mask pattern is formed by irradiating a region where the first film pattern and the first photosensitive material are overlapped with a laser beam and by developing, a source electrode and a drain electrode having a desired shape are formed by etching the first film pattern using the first mask pattern as a mask, a semiconductor film is formed over the source electrode and the drain electrode, a second photosensitive material is applied or discharged to the semiconductor film, a second mask pattern is formed by irradiating the second photosensitive material with a laser beam and by developing, a semiconductor region having a desired shape is formed by etching the semiconductor film using the second mask pattern as a mask, an insulating film and a gate electrode are formed over the semiconductor region, and a pixel electrode to be connected to the drain electrode is formed.

The first photosensitive material and the second photosensitive material are negative photosensitive resins.

The first photosensitive material and the second photosensitive material are positive photosensitive resins.

One of the first photosensitive material and the second photosensitive material is a negative photosensitive resin, and the other thereof is a positive photosensitive resin.

In the invention, the laser beam has any wavelength of from ultraviolet light to infrared light.

In addition, the invention is a semiconductor device having a wiring formed by a droplet discharge method and an electrode connected to the wiring, characterized in that the electrode has widths of 5 µm or less.

The invention is a semiconductor device having a thin film transistor provided with a gate electrode, a gate insulating film, a semiconductor region, a source electrode, and a drain electrode and a gate wiring connected to the gate electrode, characterized in that the gate electrode has widths of 5 µm or less and the gate wiring is formed by a droplet discharge method.

The invention is a television set provided with a display device having a wiring formed by a droplet discharge method and an electrode connected to the wiring, in which the electrode has widths of 5 µm or less.

The invention is a television set provided with a display device having a thin film transistor with a gate electrode, a gate insulating film, a semiconductor region, a source electrode, and a drain electrode and a gate wiring connected to the gate electrode, in which the gate electrode has widths of 5 µm or less and the gate wiring is formed by a droplet discharge method.

As a typical example of the television set, a liquid crystal television set or an EL television set can be given.

As a semiconductor element included in a pixel, a TFT, a field effect transistor (FET), a MOS transistor, a bipolar transistor, an organic semiconductor transistor, a MIM element, a memory element, a diode, a photoelectric conversion element, a capacitor element, a resistor element, or the like can be given.

In the invention, a display device that is one of typical examples of a semiconductor device means a device with the use of a display element, that is, an image display device. Further, a display device includes: a module having a display panel attached with a connector such as an FPC (Flexible Printed Circuit), a TAB (Tape Automated Bonding) tape, or a TCP (Tape Carrier Package); a module having a TAB tape or a TCP provided with a printed wiring board at the end thereof; and a module having a display element directly mounted with an IC (Integrated Circuit) or a CPU by a COG (Chip On Glass) method.

A minute mask pattern can be formed without using a photomask by performing etching with a mask pattern formed by directly irradiating with a laser beam as in the invention. Thus, microfabrication of a film pattern formed by a droplet discharge method can be performed, and a semiconductor element with a minute structure can be formed.

When a droplet discharge method is employed in forming a film pattern, a droplet can be discharged to an arbitrary position by changing a relative position of a nozzle that is a discharge opening of a droplet including a film material thereofs and a substrate. In addition, a thickness and a width of a pattern to be formed can be adjusted depending on a nozzle diameter, the discharge amount of droplets, and a relative relationship between movement speed of a nozzle and that of a substrate to be provided with a discharged droplet. Accordingly, a film pattern can be formed in a desired portion with high accuracy by discharging even over a large area semiconductor element substrate having a side of 1 m to 2 m or more. Since light exposure and development process using a photomask can be omitted, simplification of a process and reduction in cost can be achieved.

Further, a semiconductor device such as a highly integrated circuit or a display device having a high aperture ratio, or a television set can be manufactured at low cost with high throughput and yield by using a semiconductor element with a minute structure.

BRIEF DESCRIPTION OF DRAWINGS

FIGS. 29A to 29E are cross-sectional views showing a manufacturing step of a semiconductor device according to the present invention.

FIGS. 30A to 30D are cross-sectional views showing a manufacturing step of a semiconductor device according to the present invention.

FIGS. 31A and 31B are cross-sectional views showing a manufacturing step of a semiconductor device according to the present invention.

BEST MODE FOR CARRYING OUT THE INVENTION

Figure 1A:
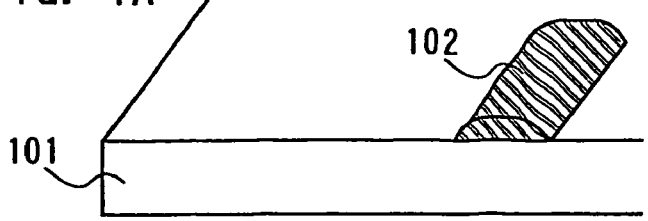
FIGS. 1A to 1E are perspective views showing a step of forming a film pattern according to the present invention.

Hereinafter, the best mode for carrying out the invention is described with reference to drawings. The present invention is not limited to the following description. As is easily known to a person skilled in the art, the mode and the detail of the invention can be variously changed without departing from the purpose and the scope of the present invention. The present invention is not interpreted while limiting to the following description of the embodiment mode. In addition, the same reference numeral is given to a common portion in each drawing, and detailed description is omitted.

Embodiment Mode 1

A step of forming a narrow wiring using a mask pattern formed by being irradiated with a laser beam (hereinafter, also referred to as laser light) is described in this embodiment mode with reference to FIGS. 1A to 1E and FIG. 2.

Figure 2:
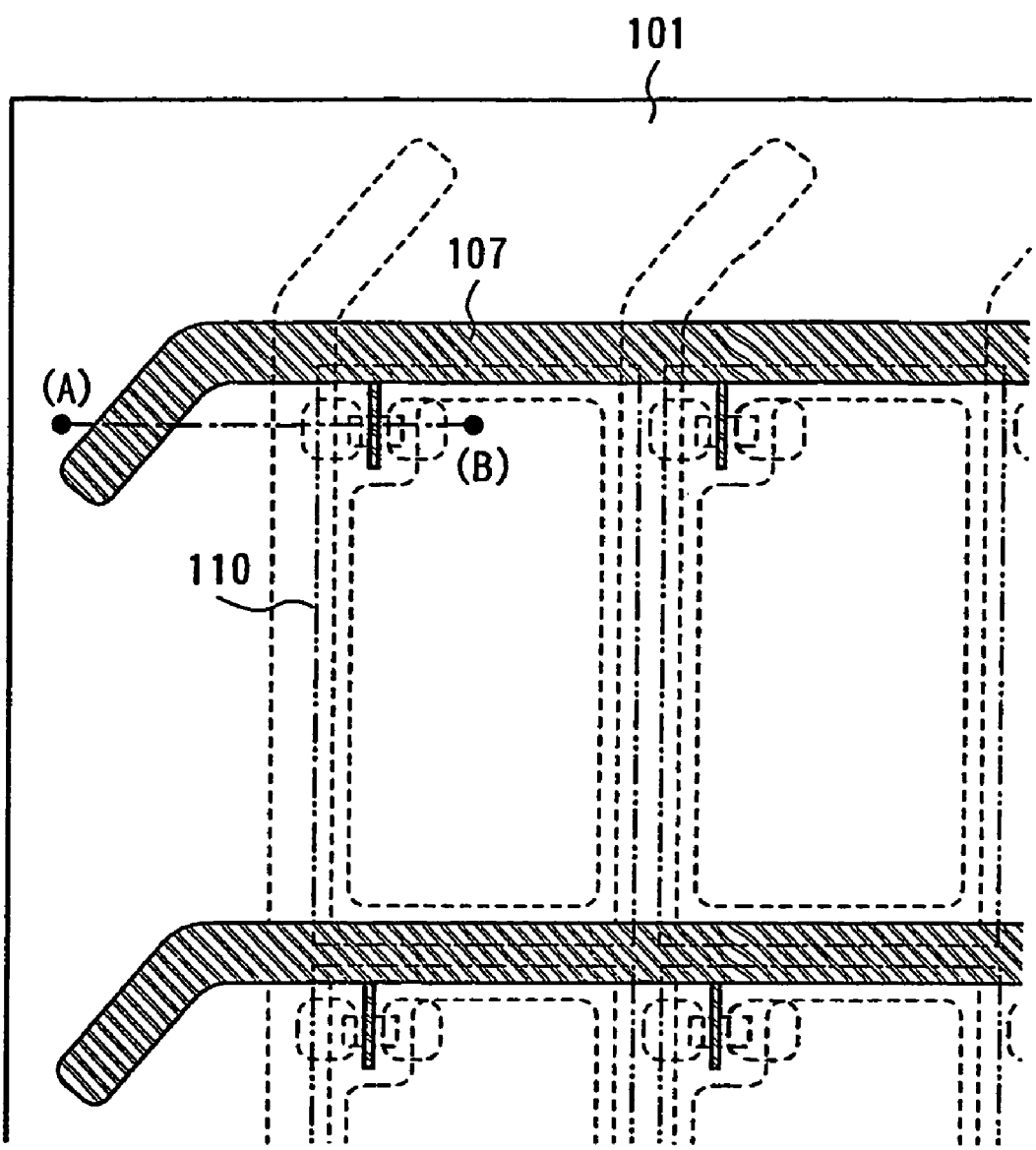
FIG. 2 is a surface view showing a step of forming a film pattern according to the present invention.

FIG. 2 is a plan view of a substrate 101 in which a pixel 110 is arranged in a matrix. A third conductive layer 107 which functions as a gate wiring of a semiconductor element to be formed later is shown in solid line over the substrate 101. In addition, a source wiring, a semiconductor region, a source electrode, a drain electrode, a pixel electrode, and the like of a semiconductor element to be formed later are shown in dashed line.

FIGS. 1A to 1E are front perspective views of the substrate in FIG. 2 taken along a line A-B. A manufacturing process of the invention is described with reference to FIGS. 1A to 1E.

A first conductive layer 102 is formed over the substrate 101 by a droplet discharge method as shown in FIG. 1A.

As the substrate 101, a glass substrate, a quartz substrate, a substrate made of an insulating material of ceramic or the like such as alumina, a heat-resistant plastic substrate which can withstand a processing temperature of post-process, a silicon wafer, a metal plate, or the like can be used. In addition, a large area substrate of 320 mm×400 mm, 370 mm×470 mm, 550 mm×650 mm, 600 mm×720 mm, 680 mm×880 mm, 1000 mm×1200 mm, 1100 mm×1250 mm, 1150 mm×1300 mm, or the like can be used as the substrate 101.

A conductor dissolved or dispersed in a solvent is used as a composition to be discharged from a discharge opening as a material of the first conductive layer. A particle of a metal such as Ag, Au, Cu, Ni, Pt, Pd, Ir, Rh, W, Al, Ta, Mo, Cd, Zn, Fe, Ti, Si, Ge, Zr, or Ba, a dispersant nanoparticle thereof, or a fine particle of silver halide can be used as the conductor. Alternatively, ITO (indium tin oxide), ITO containing silicon oxide as a composition, organic indium, organic tin, zinc oxide (ZnO), titanium nitride (TiN), which is typically used as a transparent conductive film or the like, can be used. In addition, the first conductive layer can be formed by laminating a conductive layer made of the material.

As for the composition to be discharged from a discharge opening, it is preferable to use any material of gold, silver, and copper, which is dissolved or dispersed in a solvent, taking a specific resistance value into consideration. It is more preferable to use silver or copper which is low resistant and inexpensive. When silver or copper is used, a barrier film may be additionally provided as a measure for an impurity. As for the solvent, an organic solvent of esters such as butyl acetate and ethyl acetate, alcohols such as isopropyl alcohol and ethyl alcohol, methyl ethyl ketone, or acetone or the like may be used.

Here, an insulating or conductive material containing nitrogen such as silicon nitride, silicon oxynitride, aluminum nitride, titanium nitride, or tantalum nitride (TaN) is preferably used as the barrier film in the case of using copper as a wiring, and the material may be formed by a droplet discharge method.

The viscosity of the composition used for a droplet discharge method is preferably from 5 mPa·s to 20 mPa·s. This is because the composition can be prevented from drying or the composition can be smoothly discharged from a discharge opening. The surface tension of the composition is preferably 40 mN/m or less. Note that the viscosity of the composition and the like may be appropriately adjusted in accordance with a solvent to be used and intended use. For example, the viscosity of a composition in which ITO, ITO containing silicon oxide as a composition, organic indium, or organic tin is dissolved or dispersed in the solvent may be from 5 mPa·s to 20 mPa·s, the viscosity of a composition in which silver is dissolved or dispersed in the solvent may be from 5 mPa·s to 20 mPa·s, and the viscosity of a composition in which gold is dissolved or dispersed in the solvent may be from 10 mPa·s to 20 mPa·s.

The diameter of a particle of the conductor is preferably made as small as possible for the purpose of preventing clogged nozzles and manufacturing a high-definition pattern, although it depends on the diameter of each nozzle, a desired shape of a pattern, and the like. Preferably, the diameter of the particle of the conductive material is 0.1 μm or less. The composition is formed by a known method such as an electrolyzing method, an atomizing method, a wet reducing method, or the like, and the particle size thereof is typically about from 0.5 μm to 10 μm. However, when a gas evaporation method is employed, a nanomolecule protected with a dispersant is minute, about 7 nm. When each surface of nanoparticles is covered with a coating, the nanoparticles do not cohere in the solvent and are uniformly dispersed in the solvent at a room temperature, and show a property similar to that of liquid. Accordingly, it is preferable to use a coating.

The step of discharging a composition may be performed under reduced pressure. This is because the solvent of the composition is evaporated during a period from discharging the composition until the composition lands on an object to be treated, and thus, later steps of drying and baking the composition can both be omitted or shortened. After discharging the solution, either or both steps of drying and baking is/are performed at normal pressure or under reduced pressure depending on the kind of solution by laser light irradiation, rapid thermal annealing, a heating furnace, or the like. Each step of drying and baking is a step of heat treatment. For example, drying is performed for three minutes at 100° C. and baking is performed for from 15 minutes to 120 minutes at a temperature of from 200° C. to 350° C., each of which has a different purpose, temperature, and period. The substrate may be heated to favorably perform the steps of drying and baking. The temperature of heating the substrate at the time depends on a material of the substrate or the like, but it is set from 100° C. to 800° C. (preferably, from 200° C. to 350° C.). According to the steps, fusion and welding are accelerated by evaporating the solvent in the solution or chemically removing the dispersant and hardening and shrinking a peripheral resin. The steps are performed in an oxygen atmosphere, a nitrogen atmosphere, or an atmospheric air. The steps are preferably performed in an oxygen atmosphere where the solvent in which a metal element is dissolved or dispersed is easily removed.

A continuous wave or pulsed wave gas laser or solid laser may be used for laser light irradiation. An excimer laser, a YAG laser, and the like can be given as a gas laser, and a laser using a crystal of YAG, YVO$_4$, or the like which is doped with Cr, Nd, or the like can be given as a solid laser. Note that it is preferable to use a continuous wave laser in relation to the absorptance of laser light. Moreover, a so-called hybrid laser irradiation method which combines a pulsed wave and a continuous wave may be used. However, the heat treatment by laser light irradiation is preferably instantaneously performed within several microseconds to several tens of seconds, depending on heat resistance of the substrate. Rapid thermal annealing (RTA) is carried out by raising the temperature rapidly and heating for several microseconds to several minutes using an infrared lamp or a halogen lamp emitting light of from ultraviolet to infrared in an inert gas atmosphere. Since the treatment is performed instantaneously, the treatment has the advantage that only a thin film on a top surface can be substantially heated and a lower layer film is not affected.

Here, a first conductive layer having thicknesses of from 600 nm to 800 nm is formed by selectively discharging a composition containing Ag (hereinafter, referred to as Ag paste) and appropriately drying and baking with laser beam irradiation or heat treatment as described above. When the baking is performed in an O$_2$ atmosphere, an organic material such as a binder (thermosetting resin) contained in Ag paste is decomposed and an Ag film which hardly contains an organic material can be obtained. In addition, a film surface can be made smooth. Since a solvent in the paste is evaporated by discharging the Ag paste under reduced pressure, later heat treatment can be omitted or heat treatment time can be shortened.

In this embodiment mode, a conductive layer which includes silver as a main component is formed as a first film pattern. Note that the conductive layer is formed so that conductive fine particles three-dimensionally and irregularly overlap each other. That is, the conductive film is composed of three-dimensional cohering particles. Therefore, a surface of the conductive layer is slightly uneven. Additionally, the particles are melted to form a cluster, depending on a temperature and time of heating the conductive layer. The cluster is increased in size depending on a temperature and time of heating the conductive layer. In this case, a surface of the conductive layer becomes uneven markedly. Note that a region where the particle is melted may have a polycrystalline structure in some cases.

In this embodiment mode, the first conductive layer is described; however, a semiconductor layer or an insulating layer can be appropriately applied in place of the conductive layer.

Figure 1B:
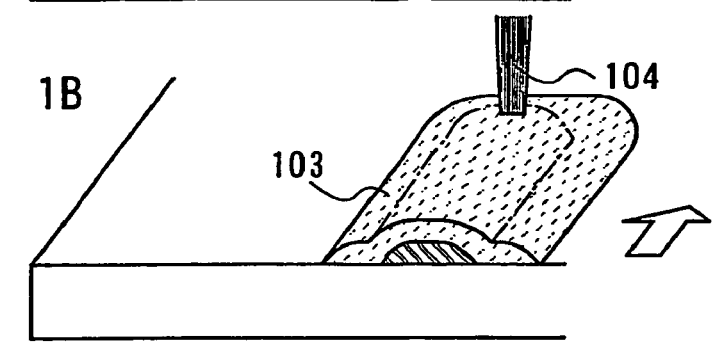

Subsequently, a photosensitive resin 103 is discharged or applied to the first conductive layer 102 as shown in FIG. 1B. A negative photosensitive resin or positive photosensitive resin which is photosensitive to from ultraviolet light to infrared light is used as the photosensitive resin. A photosensitive resin material such as an epoxy resin, an acrylic resin, a phenol resin, a novolac resin, a melamine resin, or a urethane resin is used as the photosensitive resin. Alternatively, a photosensitive organic material such as benzocyclobutene, parylene, flare, or polyimide can be used. Further, a photosensitive resin having a novolac resin and a naphthoquinone diazide compound which is a photosensitive agent can be given as a typical positive photosensitive resin, and a photosensitive resin having a base resin and diphenylsilanediol, an acid generation agent, and the like can be given as a typical negative photosensitive resin. In this embodiment mode, a negative photosensitive resin is used.

Subsequently, the photosensitive resin 103 is irradiated with a laser beam 104 by using a laser beam direct drawing apparatus. In this embodiment mode, laser beam irradiation is performed with the substrate moved as indicated by an arrow in the drawing.

Figure 8:
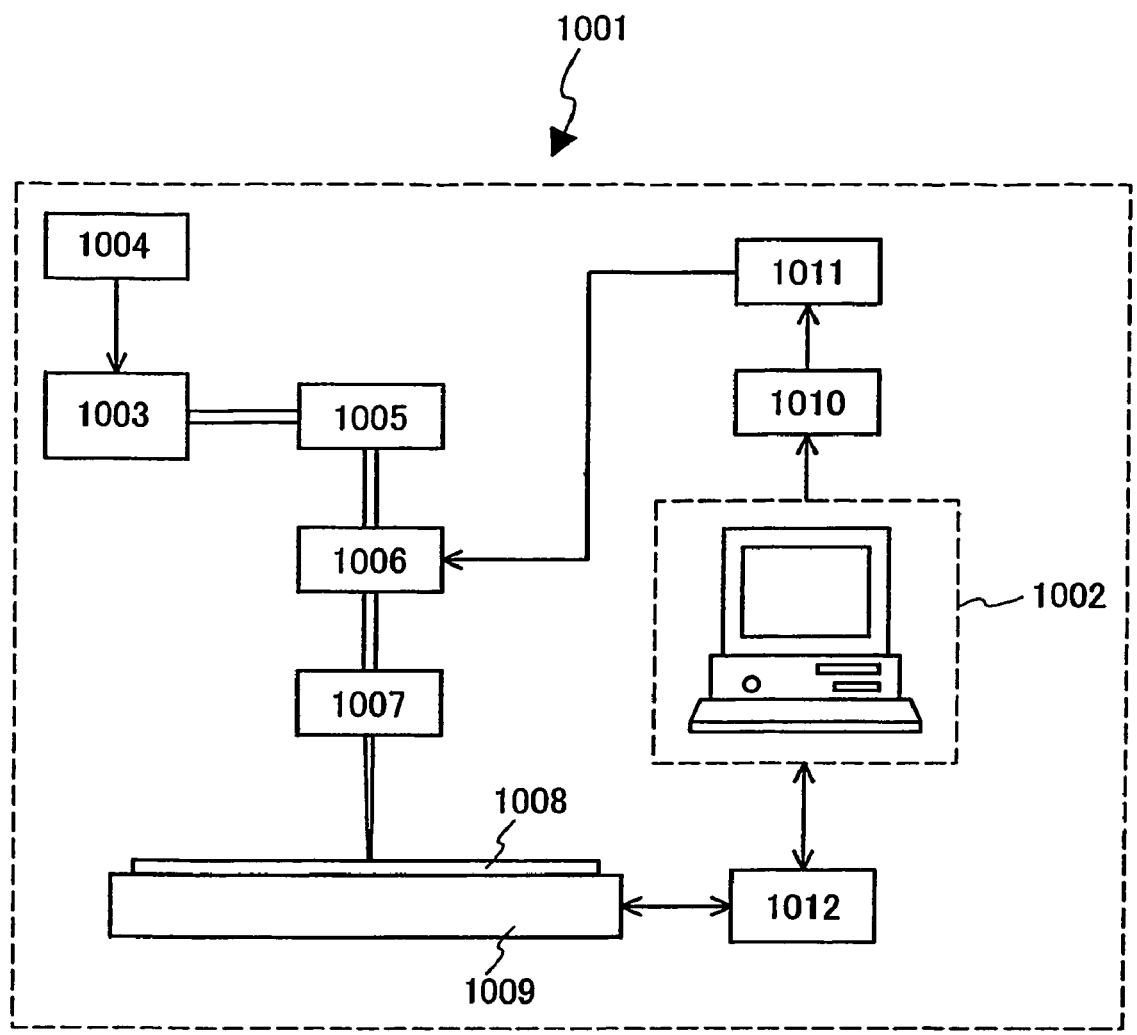
FIG. 8 is a schematic diagram showing a laser direct drawing apparatus according to the present invention.

Here, the laser beam direct drawing apparatus is described with reference to FIG. 8. As shown in FIG. 8, a laser beam direct drawing apparatus 1001 includes: a personal computer (hereinafter referred to as a PC) 1002 for conducting various types of control in irradiating with a laser beam; a laser oscillator 1003 for outputting a laser beam; a power source 1004 of the laser oscillator 1003; an optical system (ND filter) 1005 for attenuating the laser beam; an acousto-optic modulator (AOM) 1006 for modulating intensity of the laser beam; an optical system 1007 having a lens for enlarging or reducing a cross section of the laser beam, a mirror for changing a light path, and the like; a substrate movement mechanism 1009 having an X stage and a Y stage; a D/A converter 1010 for converting control data outputted from the PC into digital/analog; a driver 1011 for controlling the acousto-optic modulator (AOM) 1006 in accordance with an analog voltage outputted from the D/A converter, and a driver 1012 for outputting a driving signal for driving the substrate movement mechanism 1009.

A laser oscillator that can oscillate ultraviolet light, visible light, or infrared light can be used as the laser oscillator 1003. An excimer laser oscillator of KrF, ArF, XeCl, Xe, or the like, a gas laser oscillator of He, He—Cd, Ar, He—Ne, HF, or the like, a solid laser oscillator using crystal such as YAG, $YVO_4$, YLF, or $YAlO_3$ doped with Cr, Nd, Er, Ho, Ce, Co, Ti, or Tm, a semiconductor laser oscillator of GAN, GaAs, GaAlAs, InGaAsP, or the like can be used as the laser oscillator. Note that it is preferable to apply any of second to fifth harmonics of a fundamental wave to the solid laser oscillator.

Subsequently, a method for exposing a photosensitive material to light with the use of the laser beam direct drawing apparatus is described. When a substrate 1008 is mounted on the substrate movement mechanism 1009, the PC 1002 detects a position of a marker marked on the substrate with a camera which is not shown in the diagram. Next, the PC 1002 generates movement data for moving the substrate movement mechanism 1009 based on position data of the detected marker and preliminarily inputted drawing pattern data. Thereafter, the PC 1002 controls the amount of output light from the acousto-optic modulator (AOM) 1006 through the driver 1011. Accordingly, after a laser beam outputted from the laser oscillator 1003 is attenuated by the optical system (ND filter) 1005, the amount of light is controlled by the acousto-optic modulator (AOM) 1006 to be the predetermined amount. On the other hand, a light path and a beam shape of the laser beam outputted from the acousto-optic modulator (AOM) 1006 is changed by the optical system 1007 and the laser beam is collected by a lens. Thereafter, a photosensitive material applied to the substrate is irradiated with the beam and is exposed to light. At this time, the movement of the substrate movement mechanism 1009 is controlled in an X direction and a Y direction in accordance with the movement data generated by the PC 1002. Consequently, a predetermined portion is irradiated with the laser beam, and light exposure of the photosensitive material is performed.

Figure 1C:
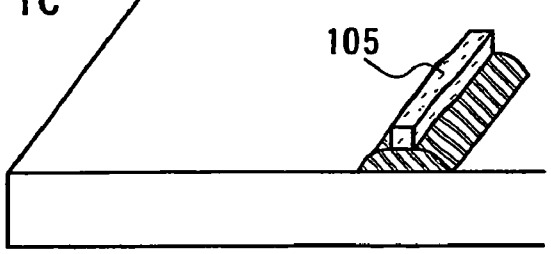

Accordingly, a mask pattern 105 is formed in a region irradiated with the laser beam as shown in FIG. 1C. Since a negative photosensitive resin is used here, the region irradiated with the laser beam becomes the mask pattern. A width of a mask pattern corresponds to a width of the laser beam when a laser beam scans once. Thus, a laser beam having a shorter wavelength is emitted to form a mask pattern with a minuter width.

Here, the substrate is moved and selectively irradiated with a laser beam; however, the invention is not limited thereto. The laser beam can be emitted by making the laser beam scan in an X-Y axis direction. In this case, a polygon mirror or a galvanometer mirror is preferably used in the optical system 1007.

Figure 1D:
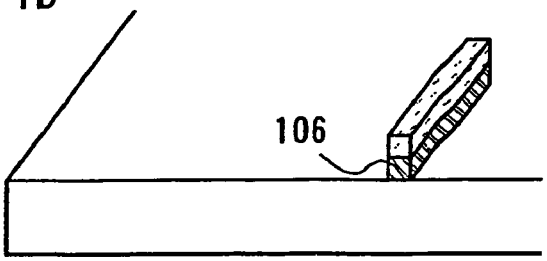

Subsequently, the first conductive layer 102 is etched by a known method such as dry etching or wet etching using the mask pattern 105 as a mask. As a result, a second conductive layer 106 having a narrow width can be formed as shown in FIG. 1D. Note that the second conductive layer 106 can be used as a gate electrode of a later semiconductor element.

Figure 1E:
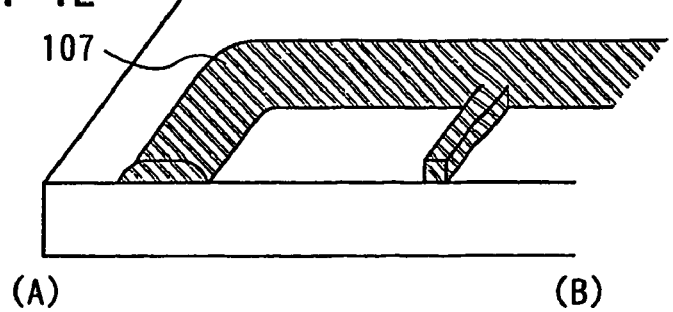

Then, a third conductive layer 107 is discharged by a droplet discharge method as shown in FIG. 1E. The third conductive layer 107 is formed to partially overlap the second conductive layer 106. Thereafter, either or both steps of drying and baking is/are performed on the third conductive layer.

According to the above-described steps, a film pattern with a minute width and a gate wiring having the same can be formed.

Embodiment Mode 2

A method for manufacturing a semiconductor element is described hereinafter. The following embodiment mode is described using a TFT as a semiconductor element; however, the invention is not limited thereto. An organic semiconductor transistor, a diode, a MIM element, a memory element, a diode, a photoelectric conversion element, a capacitor element, a resistor element, or the like can be used.

In this embodiment mode, a step of manufacturing a channel etch type TFT that is one of an inversely staggered type (bottom gate type) TFT as a semiconductor element is described with reference to FIGS. 3A to 3F.

Figure 3A:
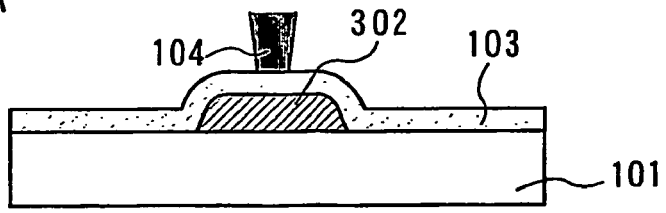
FIGS. 3A to 3F are cross-sectional views showing a manufacturing step of a semiconductor device according to the present invention.
Figure 3B:
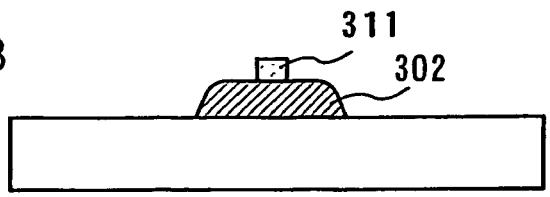

As shown in FIG. 3A, a first conductive layer 302 is formed over a substrate 101. A droplet discharge method is employed as a formation method of the first conductive layer 302. In addition, the same conductive material as the first conductive layer 102 described in Embodiment Mode 1 can be appropriately used as a material of the first conductive layer.

Before the first conductive layer 302 is formed, a base layer formed with a metal material such as Ti (titanium), W (tungsten), Cr (chromium), Ta (tantalum), Ni (nickel), or Mo (molybdenum) or oxide thereof by a sputtering method or an evaporation method is preferably formed over the surface of the substrate 301. The base layer may be formed to be from 0.01 nm to 10 nm in thickness, but it does not necessarily have a layer structure since it may be formed extremely thin. Note that the base layer is provided to form the first conductive layer with good adhesion, and it may be omitted when sufficient adhesion can be obtained. In the case of using a conductive film as the base layer, the base layer can be etched using a first mask pattern together with the first conductive layer.

Subsequently, a first photosensitive resin 103 is discharged or applied to the first conductive layer 302. In this embodiment mode, a negative photosensitive resin is discharged to the first conductive layer by a droplet discharge method. Then, the photosensitive resin is partly irradiated with a laser beam 104 to expose to light and to develop, thereby forming a first mask pattern 311 shown in FIG. 3B.

Figure 3C:
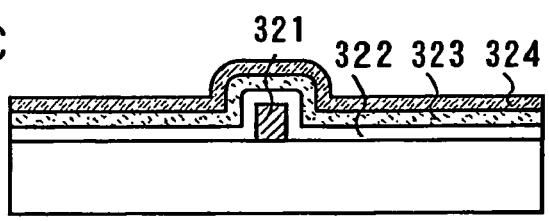

Next, the first conductive layer 302 is etched using the first mask pattern 311 as a mask to form a gate electrode 321 as shown in FIG. 3C. Here, the first conductive layer is etched by dry etching. Thereafter, the first mask pattern is removed by treatment with the use of a removing solution, ashing treatment with the use of oxygen, or the like.

Subsequently, a first insulating film 322, a first semiconductor film 323, and a second semiconductor film 324 are sequentially formed over the substrate and the gate electrode. The first insulating film 322, the first semiconductor film 323, and the second semiconductor film 324 each serve as a gate insulating film, a channel formation region, source/drain region of a TFT to be formed later, respectively.

The first insulating film 322 is formed by a thin film formation method such as a plasma CVD method or a sputtering method to be a single layer of silicon nitride, silicon oxide, or another insulating film containing silicon or to have a laminated structure thereof. In addition, the first insulating film preferably has a laminated structure of a silicon nitride film (silicon nitride oxide film), a silicon oxide film, and a silicon nitride film (silicon nitride oxide film) from a side in contact with the gate electrode. Since the gate electrode is in contact with the silicon nitride film in this structure, deterioration due to oxidation can be prevented.

The first semiconductor film 323 is formed by using a film having any state of semiconductor selected from an amorphous semiconductor, a semi-amorphous semiconductor in which an amorphous state and a crystalline state are mixed (also referred to as a SAS), a microcrystalline semiconductor in which a crystal grain of from 0.5 nm to 20 nm can be observed within an amorphous semiconductor, and a crystalline semiconductor. Specifically, a microcrystalline state in which a crystal grain of from 0.5 nm to 20 nm can be observed is referred to as microcrystal (μc). In any case, a semiconductor film mainly containing silicon, silicon germanium (SiGe), or the like with thicknesses of from 10 nm to 60 nm can be used.

The SAS means a semiconductor having an intermediate structure between an amorphous structure and a crystalline structure (including a single crystal and a polycrystal) and having a third state which is stable in terms of free energy. The SAS includes a crystalline region having short-range order and lattice distortion. A crystalline region of from 0.5 nm to 20 nm can be observed in at least a part of a region in the film. When silicon is contained as the main component, a Raman spectrum is shifted to a lower frequency side than 520 cm$^{-1}$. A diffraction peak of (111) or (220) to be caused by a crystal lattice of silicon is observed in X-ray diffraction. In addition, the SAS contains hydrogen or halogen of at least 1 atomic % or more to terminate a dangling bond.

The SAS can be obtained by performing glow discharge decomposition on a silicide gas. $SiH_4$ is given as a typical silicide gas. In addition, $Si_2H_6$, $SiH_2Cl_2$, $SiHCl_3$, $SiCl_4$, $SiF_4$, or the like can also be used as the silicide gas. The silicide gas may be diluted with hydrogen or fluorine, or hydrogen or fluorine and one or more rare gas elements of helium, argon, krypton, and neon, thereby making formation of the SAS easy. At this time, it is preferable to dilute the silicide gas so that a dilution ratio ranges from 10 times to 1000 times. Alternatively, the SAS can be formed by using $Si_2H_6$ and $GeF_4$ and using a method for diluting with a helium gas. Formation of a film by glow discharge decomposition is preferably performed under reduced pressure and may be performed with pressures in the range of approximately from 0.1 Pa to 133 Pa. High-frequency powers of from 1 MHz to 120 MHz, preferably, from 13 MHz to 60 MHz may be supplied to perform a glow discharge. A substrate heating temperature is preferably 300° C. or less, and a recommended substrate heating temperature is from 100° C. to 250° C.

The crystalline semiconductor film can be formed by crystallizing an amorphous semiconductor film by heating or laser irradiation. Alternatively, the crystalline semiconductor film may be directly formed. In this case, the crystalline semiconductor film can be directly formed by using a fluorine-based gas such as $GeF_4$ or $F_2$ and a silane-based gas such as $SiH_4$ or $Si_2H_6$ and utilizing heat or plasma.

The second semiconductor film 324 is conductive, and an element belonging to Group 15, typically, phosphorus or arsenic is added in the case of forming an n-channel TFT. An element belonging to Group 13, typically, boron is added in the case of forming a p-channel TFT. The second semiconductor film is formed by a plasma CVD method with the use of a silicide gas added with a gas including an element belonging to Group 13 or 15 such as boron, phosphorus, or arsenic. After a semiconductor film is formed, a solution including an element belonging to Group 13 or 15 is applied to the semiconductor film and is irradiated with a laser beam; thus, the second semiconductor film which is conductive can be formed. As the laser beam, a laser beam emitted from a known pulsed wave laser or continuous wave laser is appropriately used.

Figure 3D:
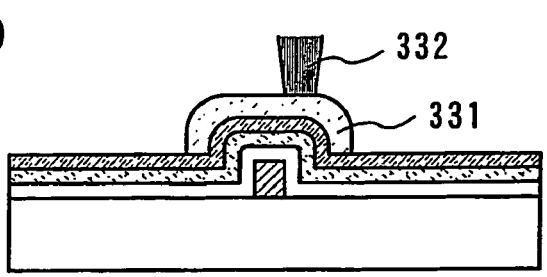

Subsequently, a second photosensitive resin 331 is discharged or applied to the second semiconductor film 324 as shown in FIG. 3D. Here, a negative photosensitive resin is discharged by a droplet discharge method to form the second photosensitive resin 331.

Figure 3E:
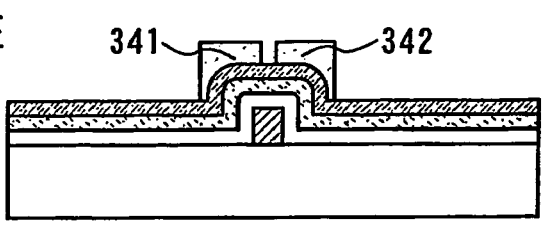
Figure 3F:
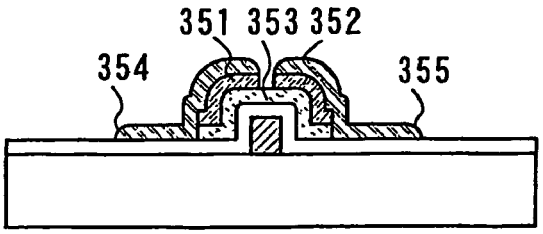

Next, the second photosensitive resin 331 is irradiated with a laser beam 332 and is developed to form second mask patterns 341 and 342 shown in FIG. 3E. In this embodiment mode, a negative resist is used as the second photosensitive resin; therefore, the second mask patterns 341 and 342 are formed in a region irradiated with the laser beam 332.

Then, the second semiconductor film 324 is etched by using the second mask patterns 341 and 342 to form first semiconductor regions (source/drain regions) 351 and 352. Thereafter, the second mask patterns are removed.

According to similar steps, a third photosensitive resin is discharged or applied, irradiated with a laser beam, and developed to form a third mask pattern. The first semiconductor layer 323 is etched by using the third mask pattern to form a second semiconductor region 353.

A chlorine-based gas typified by $Cl_2$, $BCl_3$, $SiCl_4$, $CCl_4$, or the like, a fluorine-based gas typified by $CF_4$, $SF_6$, $NF_3$, $CHF_3$, or the like, or $O_2$ can be used as an etching gas for the first semiconductor film and the second semiconductor film.

Then, source/drain electrodes 354 and 355 are formed over the first semiconductor regions 351 and 352 by discharging a conductive material with a droplet discharge method. A similar material to that used for the first conductive layer 302, which is dissolved or dispersed in a solvent, can be used as the conductive material. Here, Ag paste is selectively discharged and laser beam irradiation or drying and baking by heat treatment is/are appropriately performed as described above. Accordingly, each electrode having thicknesses of from 600 nm to 800 nm is formed.

Alternatively, a conductive film is preliminarily formed by a sputtering method or the like, and a photosensitive material is formed by a droplet discharge method. Thereafter, the electrodes may be formed by irradiating the photosensitive material with laser light to form a mask pattern and by etching. In this case, a positive photosensitive material is used.

Subsequently, a passivation film is preferably formed over the source/drain electrodes 354 and 355. The passivation film can be formed by a thin film formation method such as a plasma CVD method or a sputtering method with the use of silicon nitride, silicon oxide, silicon nitride oxide, silicon oxynitride, aluminum oxynitride, aluminum oxide, diamond like carbon (DLC), carbon nitride (CN), or another insulating material.

According to the above described steps, a channel etch type TFT can be manufactured.

Embodiment Mode 3

A step of manufacturing a channel protective type (channel stopper type) TFT is described in this embodiment mode with reference to FIGS. 4A to 4E.

Figure 4A:
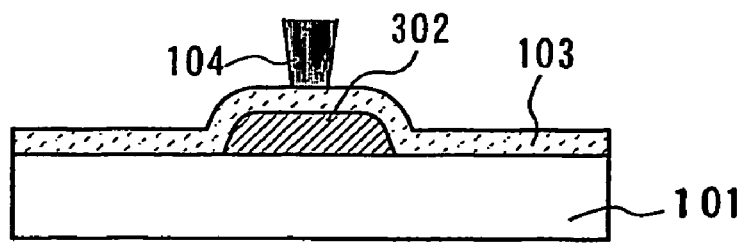
FIGS. 4A to 4E are cross-sectional views showing a manufacturing step of a semiconductor device according to the present invention.
Figure 4B:
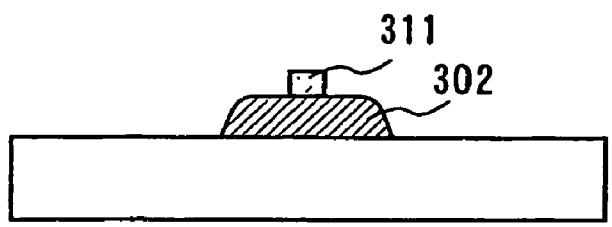
Figure 4C:
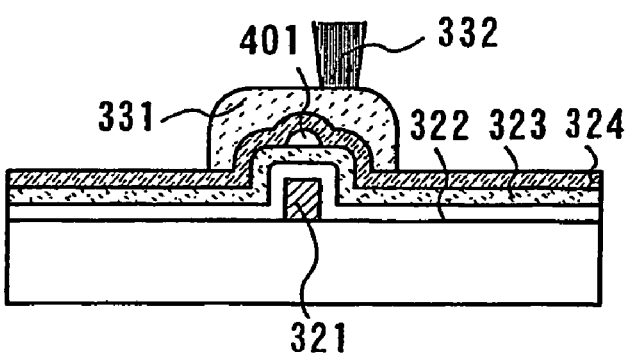
Figure 4D:
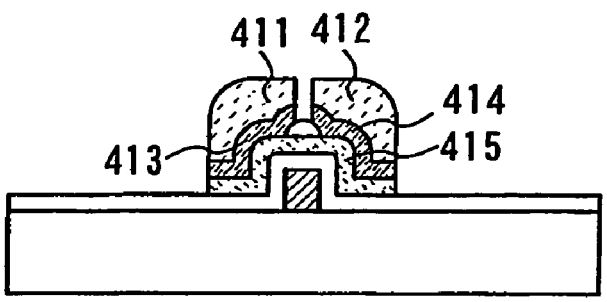

As in Embodiment Mode 2, after performing steps shown in FIGS. 4A and 4B, a gate electrode 321, a first insulating film 322, and a first semiconductor film 323 are formed over a substrate 101 as shown in FIG. 4C.

Subsequently, a protective film 401 is formed in a region over the first semiconductor film 323, which overlaps the gate electrode 321. The protective film is preferably formed by using a heat resistant high molecular weight material. It is preferable to use a high molecular weight material which has an aromatic ring or a heterocyclic ring as a main chain, has few aliphatic portions, and includes high polar heteroatom groups. As a typical example of such a high molecular weight material, polyimide, polybenzimidazole, or the like can be given. In the case of using polyimide, a composition containing polyimide is discharged from a nozzle to the first semiconductor film 323, and then, baked at 200° C. for 30 minutes to form the protective film.

Then, a second semiconductor film (conductive semiconductor film) 324 is formed as in Embodiment Mode 2. A second photosensitive resin 331 is formed as in Embodiment Mode 2. The second photosensitive resin is irradiated with a laser beam 332 and is developed to form second mask patterns 411 and 412 shown in FIG. 4D.

With the use of the second mask patterns 411 and 412, the second semiconductor film is etched to form first semiconductor regions (source/drain regions) 413 and 414; in addition, the first semiconductor film is etched to form a second semiconductor region (channel formation region) 415. At this time, a region of the first semiconductor film overlapping the gate electrode is not etched since the protective film 401 is formed over the first semiconductor film.

Figure 4E:
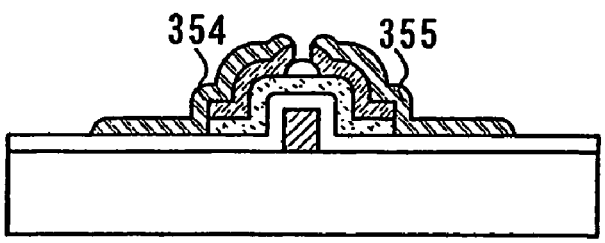

Subsequently, source/drain electrodes 354 and 355 are formed as shown in FIG. 4E.

According to the above-described steps, a channel protective type TFT can be formed. Since the protective film 401 functions as a channel protective film, the first semiconductor film to be a channel region can be prevented from being damaged due to overetching or the like in etching the semiconductor film added with impurities. This makes it possible to obtain a TFT having higher mobility with a stable characteristic.

Embodiment Mode 4

A step of manufacturing a staggered TFT is described in this embodiment mode with reference to FIGS. 5A to 5G.

Figure 5A:
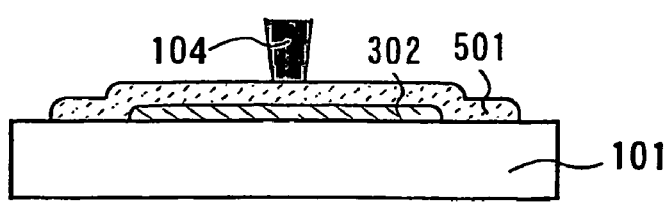
FIGS. 5A to 5G are cross-sectional views showing a manufacturing step of a semiconductor device according to the present invention.
Figure 5B:
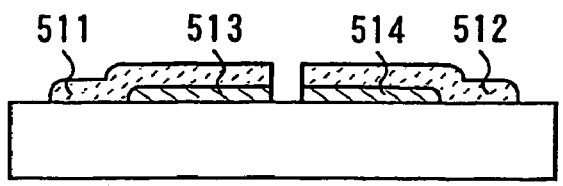

A first conductive layer 302 is formed over a substrate 101 as shown in FIG. 5A. Next, a first photosensitive resin 501 is applied or discharged to the first conductive layer. Here, a positive photosensitive resin is used as the first photosensitive resin. Then, the first photosensitive resin is irradiated with a laser beam 104. Here, a region to be a channel formation region later is irradiated with the laser beam 104. Thereafter, development is performed to form first mask patterns 511 and 512 as shown in FIG. 5B.

The first conductive layer 302 is etched by using the first mask patterns 511 and 512 as a mask to form source/drain electrodes 513 and 514. Thereafter, the first mask patterns are removed.

Figure 5C:
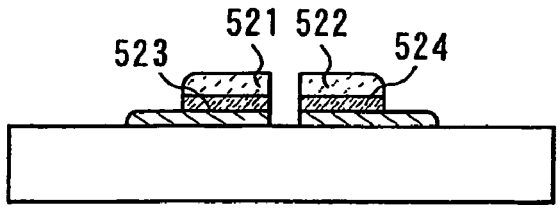

Subsequently, a first semiconductor film is formed and a second photosensitive resin is applied or discharged to the first semiconductor film and is then irradiated with a laser beam and developed to form second mask patterns 521 and 522. The first semiconductor film is etched by using the second mask patterns as a mask to form first semiconductor regions 523 and 524 (source/drain regions). Here, the first semiconductor film is a conductive semiconductor film and can be formed by using a similar material to that of the second semiconductor film 324 described in Embodiment Mode 2. In addition, a positive photosensitive resin is used as the second photosensitive resin (FIG. 5C). Thereafter, the second mask patterns are removed.

Figure 5D:
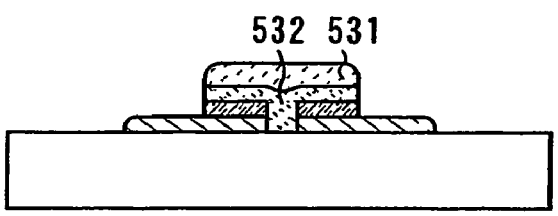

A second semiconductor film is formed and a third photosensitive resin is applied or discharged to the second semiconductor film and is then irradiated with a laser beam and developed to form a third mask pattern 531. The second semiconductor film is etched by using the third mask pattern as a mask to form a second semiconductor region 532. Here, the second semiconductor film can be formed by using a similar material to that of the first semiconductor film 323 described in Embodiment Mode 2. A negative photosensitive resin is used as the third photosensitive resin (FIG. 5D). Then, the third mask pattern is removed.

Figure 5E:
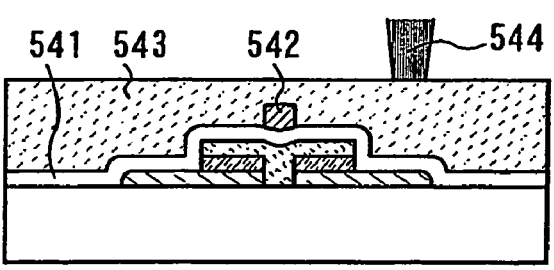

Subsequently, a first insulating film 541 is formed as shown in FIG. 5E. The first insulating film can be formed by using a similar material to that of the first insulating film 541 described in Embodiment Mode 2. A second conductive film is discharged between the first semiconductor regions (source/drain regions). A fourth photosensitive resin is applied or discharged thereto and is then irradiated with a laser beam and developed to form a fourth mask pattern. The second conductive layer is etched by using the fourth mask pattern as a mask to form a gate electrode 542. Here, the second conductive layer can be formed by using a similar material to that of the first conductive layer 302. A negative photosensitive resin is used as the fourth photosensitive resin. Then, the fourth mask pattern is removed.

Figure 5F:
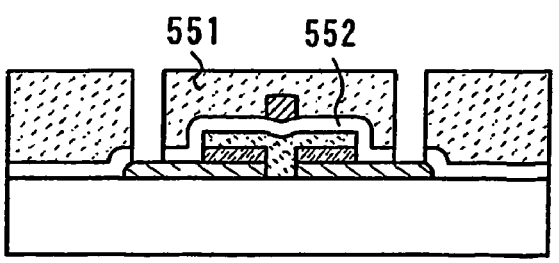

Subsequently, a fifth photosensitive resin 543 is entirely applied over the substrate, and a region where a contact hole is to be formed later is irradiated with a laser beam 544 and developed to form a fifth mask pattern 551 as shown in FIG. 5F. The first insulating film is etched by using the fifth mask pattern as a mask to expose the source/drain regions 513 and 514 and to form a gate insulating film 552. Here, a positive photosensitive resin is used as the fifth photosensitive resin. Then, the fifth mask pattern is removed.

Figure 5G:
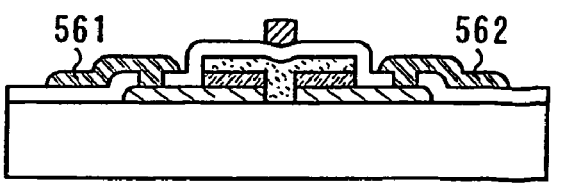

Subsequently, third conductive layers 561 and 562 are discharged as shown in FIG. 5G.

According to the above-described steps, a staggered TFT can be formed.

Embodiment Mode 5

A step of manufacturing a TFT having a top gate structure is described in this embodiment mode with reference to FIGS. 6A to 6E.

Figure 6A:
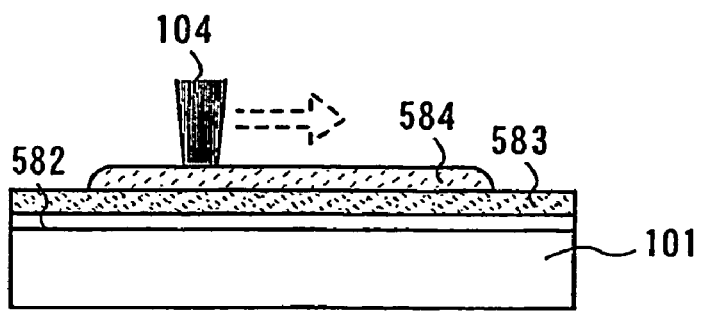
FIGS. 6A to 6E are cross-sectional views showing a manufacturing step of a semiconductor device according to the present invention.

A first insulating film 582 is formed over a substrate 101 as shown in FIG. 6A. The first insulating film is provided to prevent impurities from the substrate 101 from entering a TFT to be formed later. A film such as a silicon oxide film, a silicon nitride film, or a silicon oxynitride film is formed as the first insulating film by a known method such as a PVD method or a CVD method. When the substrate 101 is formed by using such a material that impurities from the substrate 101 do not enter a TFT, typically, quartz or the like, the first insulating film 582 need not be formed.

Figure 6B:
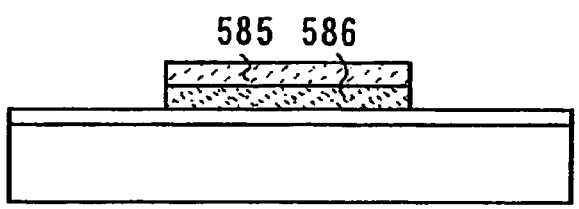

A semiconductor film 583 is formed over the first insulating film 582, and a first photosensitive resin 584 is applied or discharged to the semiconductor film. The first photosensitive resin is irradiated with a laser beam 104 and developed to form a first mask pattern 585 as shown in FIG. 6B. The semiconductor film can be formed by using a similar material to that of the first semiconductor film 323 described in Embodiment Mode 2.

Subsequently, the semiconductor film is etched by using the first mask pattern as a mask to form a semiconductor region 586. Thereafter, the first mask pattern is removed.

Figure 6C:
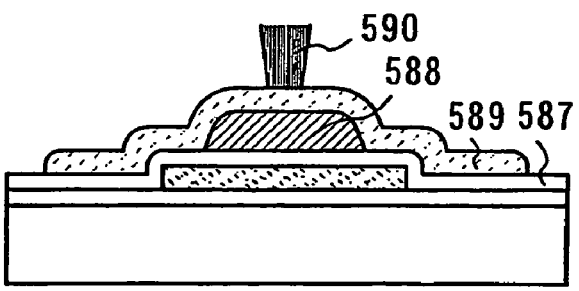
Figure 6D:
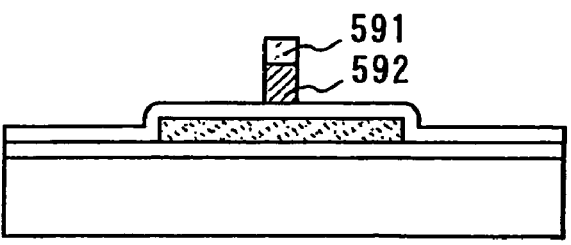

A gate insulating film 587 is formed over the semiconductor region and a first conductive layer 588 is formed over the gate insulating film 587 as shown in FIG. 6C. The first conductive layer is formed by appropriately using a similar material and a similar manufacturing step to those of the first conductive layer 302 described in Embodiment Mode 2. A second photosensitive resin 589 is discharged or applied to the first conductive layer. A region thereof to be a gate electrode later is irradiated with a laser beam 590 and developed to form a second mask pattern 591 as shown in FIG. 6D.

The first conductive layer 588 is etched by using the first mask pattern 591 as a mask to form a gate electrode 592. Then, the first mask pattern is removed.

Figure 6E:
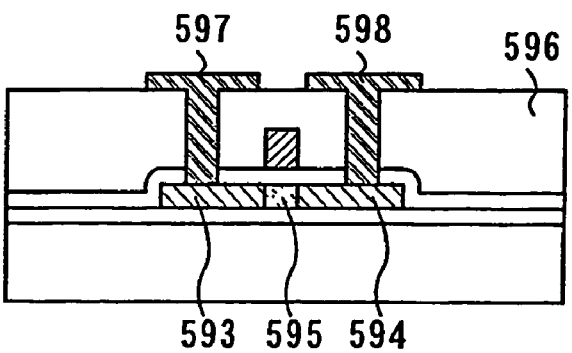

The semiconductor region is doped with impurity elements belonging to Group 13 or 15 by using the gate electrode as a mask to form source/drain regions 593 and 594 as shown in FIG. 6E. A reference numeral 595 denotes a channel forming region.

Note that the source/drain regions can be formed by partially discharging a solution including impurity elements belonging to Group 13 or 15 to the semiconductor region 586 shown in FIG. 6B by a droplet discharge method and then irradiating the solution with a laser beam. In this case, the solution including impurity elements belonging to Group 13 or 15 is discharged to a semiconductor region to be source/drain regions later.

Subsequently, a second insulating film (interlayer insulating film) 596 is formed According to such steps as described in Embodiment Mode 4, a mask pattern is formed and the second insulating film and the gate insulating film are etched to form a contact hole. Thereafter, conductive films 597 and 598 are formed.

According to the above-described steps, a TFT having a top gate structure can be formed.

Embodiment Mode 6

A method for forming a contact hole different from Embodiment Modes 4 and 5 is described in this embodiment mode with reference to FIGS. 7A to 7E.

Figure 7A:
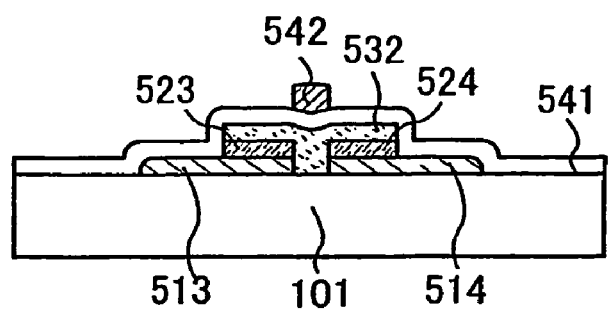
FIGS. 7A to 7E are cross-sectional views showing a manufacturing step of a semiconductor device according to the present invention.

According to Embodiment Mode 4, a staggered TFT is formed as shown in FIG. 7A. Here, a substrate 101 is provided with source/drain electrodes 513 and 514, first semiconductor regions 523 and 524, a second semiconductor region 532 formed over the first semiconductor regions between the source/drain electrodes, a first insulating film 541, and a gate electrode 542.

Figure 7B:
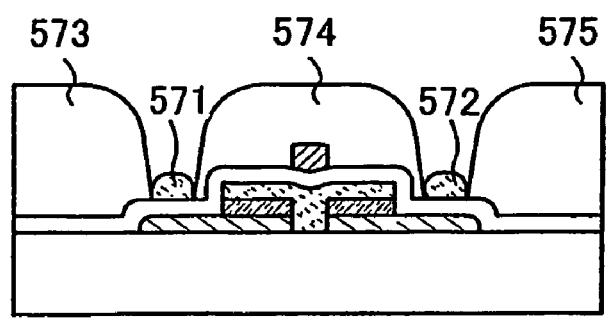

A solution which forms a liquid-repellent surface is discharged to a region where the source/drain electrodes are overlapped with the first insulating film 541 to form first mask patterns 571 and 572 by a droplet discharge method as shown in FIG. 7B.

The first mask patterns are formed by using a solution which forms a liquid-repellent surface. For example, a silane coupling agent expressed in a chemical formula $R_n$—Si—$X_{(4-n)}$ (n=1, 2, or 3) is used as an example of a composition of the solution which forms a liquid-repellent surface. Here, R denotes a substance which contains a comparatively inert group such as an alkyl group. X is formed with a hydrolytic group that is bondable by condensation with a hydroxyl group or absorbed water on the surface of the substrate, such as halogen, a methoxy group, an ethoxy group, or an acetoxy group.

In addition, liquid repellency can be further enhanced by using a fluorine-based silane coupling agent containing a fluoroalkyl group as R (fluoroalkyl silane (hereinafter, referred to as FAS)), which is given as a typical example of the silane coupling agent. R of FAS has a structure expressed by $(CF_3)(CF_2)_x(CH_2)_y$ (x: an integer in the range of from 0 to 10, and y: an integer in the range of from 0 to 4). When a plurality of Rs or Xs are combined with Si, the Rs or Xs may be all the same or different from each other. Heptadecafluoro tetrahydro decyl triethoxysilane, heptadecafluoro tetrahydro decyl trichlorosilane, tridecafluoro tetrahydro octyl trichlorosilan, trifluoropropyl trimethoxysilane, or the like is typically given as FAS.

A solvent which forms a liquid-repellent surface, for example, a hydrocarbon-based solvent or tetrahydrofuran such as n-pentane, n-hexane, n-heptane, n-octane, n-decane, dicyclopentane, benzene, toluene, xylene, durene, indene, tetrahydronaphthalene, decahydronaphthalene, or squalane is used as a solvent of the solution which forms a liquid-repellent surface.

In addition, a material having a fluorine carbon chain (fluorine-based resin) can be used as one example of the composition of the solution which forms a liquid-repellent surface. Polytetrafluoroethylene (PTFE), perfluoloalkoxy alkane (PFA), perfluoroethylene-propylene copolymer (PFEP), ethylene-tetrafluoroethylene copolymer (ETFE), polyvinylidene fluoride (PVDF), polychlorotrifluoroethylene (PCTFE), ethylene-chlorotrifluoroethylene copolymer (ECTFE), polytetra-fluoroethylene-perfluoro dioxole copolymer (TFE/PDD), polyvinyl fluoride (PVF), or the like can be used as the fluorine-based resin.

An organic material which does not form a liquid-repellent surface (that is, which forms a lyophilic surface) may be used for the mask pattern. In this case, the organic material may be treated with $CF_4$ plasma or the like to form a liquid-repellent surface. For example, a material in which a water soluble resin such as polyvinyl alcohol (PVA) is mixed into a solvent such as $H_2O$ may be used. Further, PVA and another water soluble resin may be used in combination. Even in the case where the mask pattern has a liquid-repellent surface, the liquid repellency can be further enhanced by performing the plasma treatment or the like.

Subsequently, a solution which forms a lyophilic surface is applied or discharged to form second mask patterns 573 to 575. An organic resin such as an acrylic resin, a polyimide resin, a melamine resin, a polyester resin, a polycarbonate resin, a phenol resin, an epoxy resin, polyacetal, polyether, polyurethane, polyamide (nylon), a furan resin, or a diallyl phthalate resin, siloxane, or polysilazane can be given as a typical example of the solution which forms a lyophilic surface. Further, a solution using a polar solvent such as water, alcohols, ethers, dimethylformamide, dimethylacetamide, dimethylsulfoxide, N-methylpyrrolidone, hexamethylphosphamide, chloroform, or methylene chloride can be used. A droplet discharge method, an ink-jet method, a spin coating method, a roll coating method, a slot coating method, or the like can be employed as a method for applying a solution of the second mask patterns.

Since the first mask patterns 571 and 572 have liquid-repellent surfaces, the second mask patterns 573 to 575 are formed in the outer periphery of the first mask patterns, that is, in a region where the first mask patterns are not formed.

Instead of the above steps, the second mask patterns may be formed by applying the solution which forms a lyophilic surface after drying a solvent of the first mask patterns. In this case, since the first mask patterns 571 and 572 have liquid-repellent surfaces, the second mask patterns 573 to 575 are formed in the outer periphery of the first mask patterns, that is, in a region where the first mask patterns are not formed. In addition, a composition of the first mask patterns remains on the surface of the first insulating film 541 or penetrates into the film.

Figure 7C:
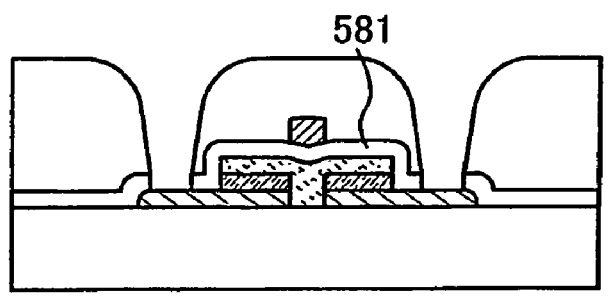

Subsequently, the first mask patterns 571 and 572 and the first insulating film 541 are etched by using the second mask patterns as a mask to partially expose the source/drain electrodes as shown in FIG. 7C. A reference numeral 581 denotes a gate insulating film.

Figure 7D:
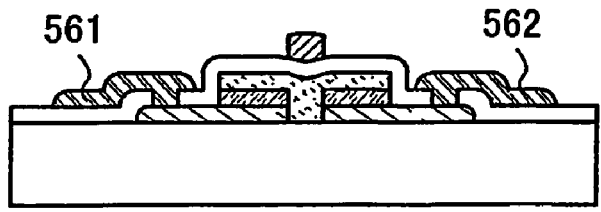

After the second mask patterns are removed, conductive layers 561 and 562 are formed as shown in FIG. 7D.

Figure 7E:
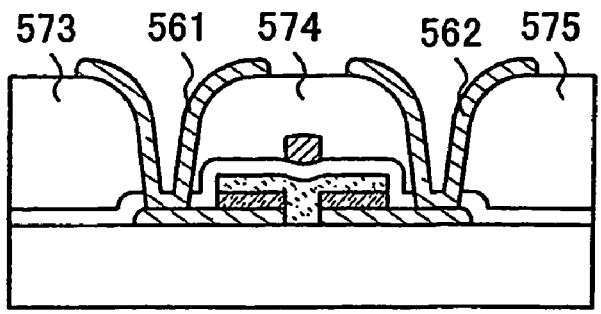

Note that the second mask patterns 573 to 575 may be used as interlayer insulating films without removing, and then, the conductive layers 561 and 562 may be formed as shown in FIG. 7E.

Embodiment Mode 7

Figure 24:
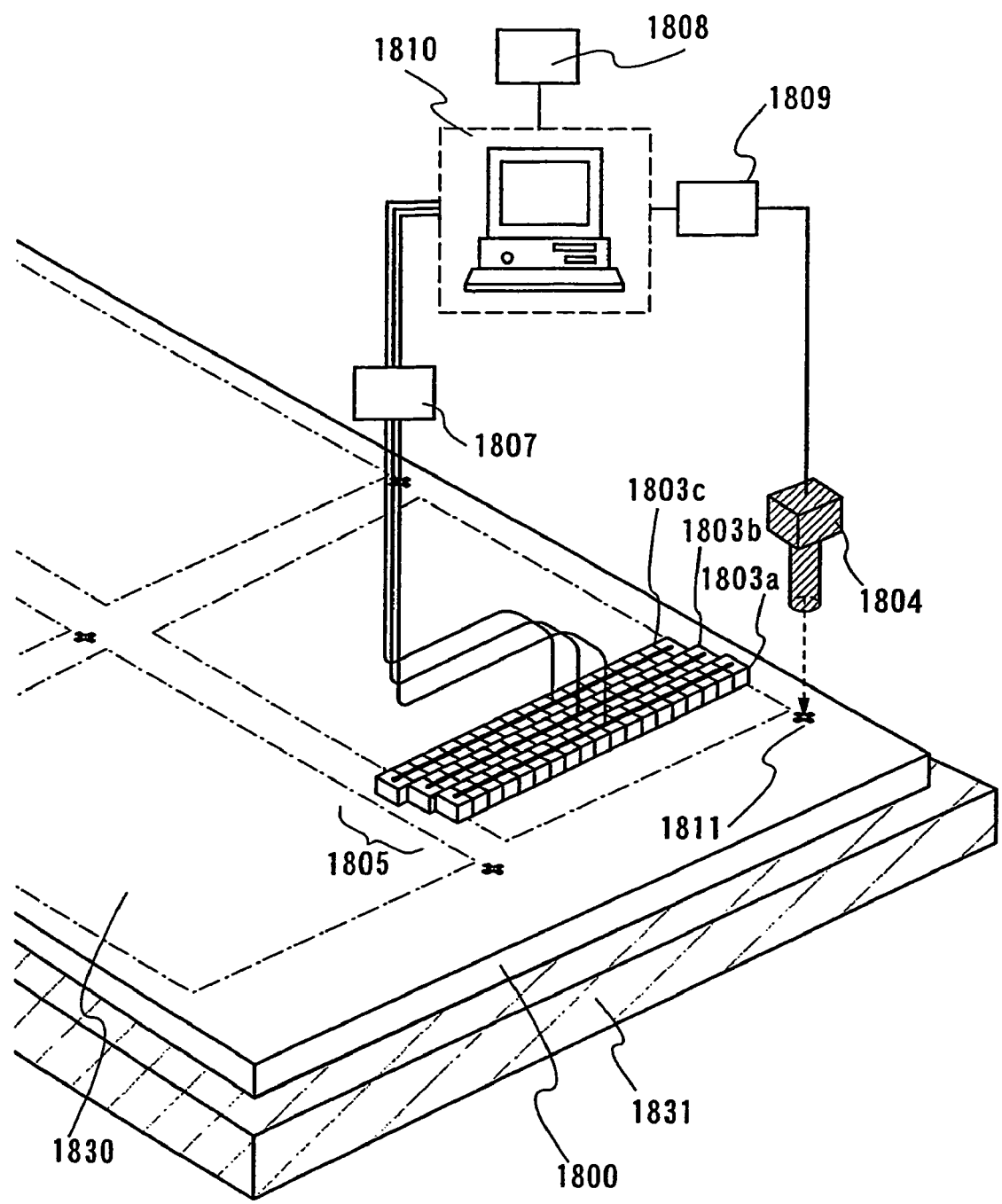
FIG. 24 shows a structure of a droplet discharge apparatus which can be applied to the present invention.

A droplet discharge apparatus which can be used for pattern formation in the above embodiment modes is described in this embodiment mode. In FIG. 24, a region 1830 where one panel is to be formed is shown in dashed line on a substrate 1800.

FIG. 24 shows one mode of a droplet discharge apparatus used to form a pattern such as a wiring. A droplet discharge means 1805 has a head, and the head has a plurality of nozzles. The case of having three heads (1803a, 1803b, and 1803c) each provided with ten nozzles is described in this embodiment mode. However, the number of nozzles and heads can be set in accordance with treatment area, steps, or the like.

The heads are connected to a control means 1807, and the control means controls the heads by a computer 1810, so that a preset pattern can be drawn. A position of drawing may be determined by, for example, using a marker 1811 that is formed over the substrate 1800 or the like fixed to a stage 1831 as a reference point. Alternatively, the position of drawing may be determined by using an edge of the substrate 1800 as a reference point. The reference point is detected by an imaging means 1804 such as a CCD, and changed into a digital signal by an image processing means 1809. Then, the digital signal is recognized by the computer 1810, and a control signal is generated and transmitted to the control means 1807. When the pattern is drawn in this manner, a distance between a pattern formation face and a tip of the nozzle may be set from 0.1 cm to 5 cm, preferably, from 0.1 cm to 2 cm, more preferably, approximately 0.1 cm. Landing accuracy of a droplet is improved by making the distance short as described above.

At this time, information on a pattern to be formed over the substrate 1800 is stored in a storage medium 1808, and a control signal is transmitted to the control means 1807 based on the information, so that the heads 1803a, 1803b, and 1803c can be individually controlled. In other words, droplets including different materials can be discharged from each nozzle of the heads 1803a, 1803b, and 1803c. For example, the nozzles of the heads 1803a and 1803b can discharge a droplet including an insulating film material and the nozzles of the head 1803c can discharge a droplet including a conductive film material.

Further, the nozzles of the head can also be individually controlled. Since the nozzles can be individually controlled, droplets including different materials can be discharged from a specific nozzle. For example, one head 1803a can be provided with a nozzle which discharges a droplet including a conductive film material and a nozzle which discharges a droplet including an insulating film material.

In the case of performing droplet discharge treatment on a large area, such as a formation step of an interlayer insulating film, a droplet including an interlayer insulating film material is preferably discharged from all nozzles. Further, a droplet including an interlayer insulating film material may be discharged from all nozzles of a plurality of heads. Accordingly, throughput can be improved. Naturally, in the interlayer insulating film formation step, droplet discharge treatment may be performed on a large area by discharging a droplet including an interlayer insulating film material from one nozzle and by making the nozzle scan the substrate a plurality of times.

Pattern formation on a large mother glass can be performed by moving a head in zigzag or shuttling a head. At this time, the head may be made to relatively scan the substrate a plurality of times. When the head scans the substrate, the head is preferably inclined toward a moving direction.

When a plurality of panels is formed out of a large mother glass, the head preferably has a width equal to that of one panel. This is because a pattern can be formed in the region 1830 where one panel is formed by moving the head once; thus, high throughput can be expected.

The head may have a width narrower than that of the panel. At this time, a plurality of heads having a narrow width may be arranged in series to have a width equal to that of one panel. Bending of the head, which is concerned as a width of the head becomes broader, can be prevented from occurring by arranging a plurality of heads having a narrow width in series. Naturally, a pattern can be formed by moving a head having a narrow width a plurality of times.

A step of discharging a droplet of a solution by a droplet discharge method as described above is preferably performed under reduced pressure. This is because a solvent of the solution is evaporated during a period from discharging the solution until the solution lands on an object to be treated, and thus, both steps of drying and baking the solution can be omitted. It is preferable to perform the step under reduced pressure, since an oxide film or the like is not formed on the surface of a conductor. In addition, the step of dropping a solution may be performed in a nitrogen atmosphere or an organic gas atmosphere.

A piezo method can be employed as a droplet discharge method. The piezo method is utilized also for an inkjet printer since it has superior ink-droplet controllability and a high degree of freedom for ink selection. Note that the piezo method includes a bender type (typically, an MLP (Multi Layer Piezo) type), a piston type (typically, an MLChip (Multi Layer Ceramic Hyper Integrated Piezo segments) type), a side wall type, and a roof wall type. Alternatively, a droplet discharge method using a so-called bubble jet method (thermal method) which makes a heating element generate heat to generate bubbles, thereby pushing out a solution may be employed depending on a solvent of a solution.

Embodiment 1

Figure 25A:
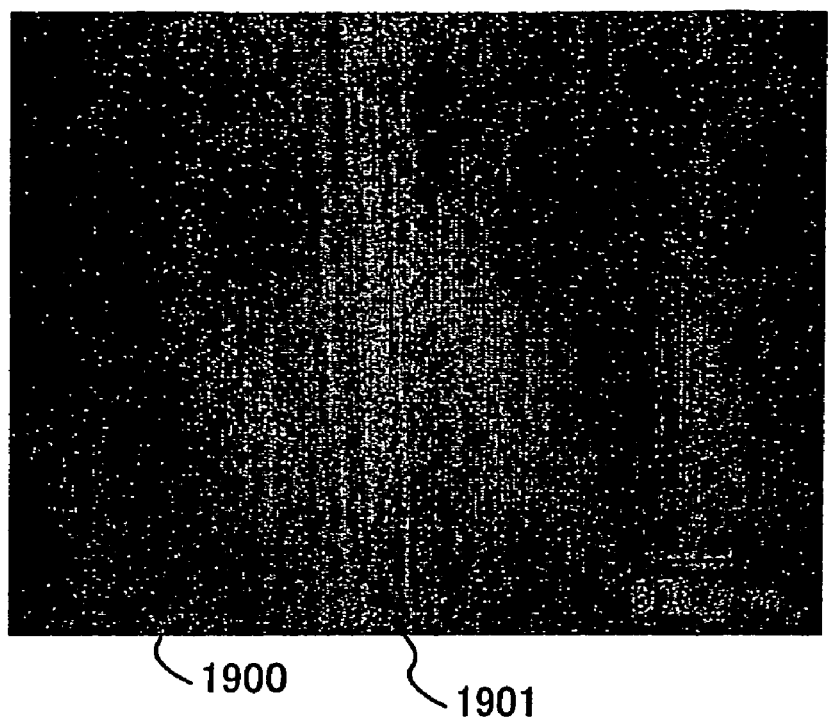
FIGS. 25A and 25B are surface views showing a mask pattern according to the present invention.
Figure 25B:
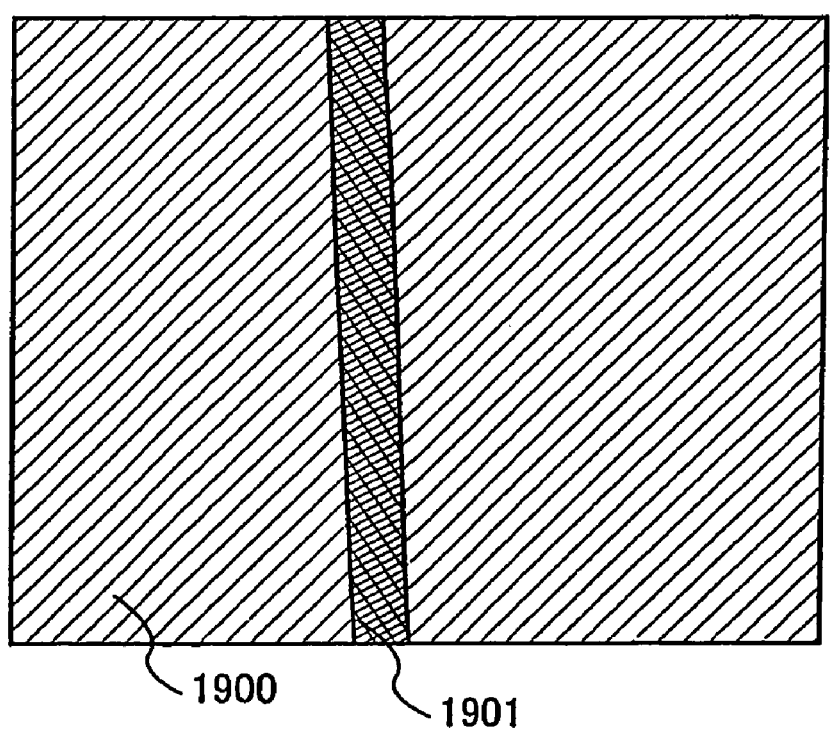

A mask pattern formed by using laser light is described in this embodiment with reference to FIGS. 25A and 25B.

A positive photosensitive resin of 1.5 μm in thickness was applied to a substrate and was temporarily baked by heating at 90° C. for 90 seconds. A novolac resin having a photosensitive agent was used as a positive photosensitive resin.

Subsequently, the positive photosensitive resin was irradiated with laser light and exposed to light. Continuous wave Nd:YVO$_4$ was employed for a laser oscillator at this time. Laser light emitted from the laser oscillator had a wavelength of 532 nm and a spot of 300 μm×20 μm in size.

Thereafter, the positive photosensitive resin was developed by using tetraethylammonium hydroxide (TMAH) of 2.38%.

TABLE 1 shows the results whether development can be performed or not with respect to laser power and movement speed of a stage.

TABLE 1

Relation among a Laser power, a rate of movement of a stage, and development of a positive photosensitive resin

| Laser power (W) | Stage movement speed (cm/sec) | Development |
|---|---|---|
| 6 | 50 | yes |
|  | 40 | yes |
|  | 30 | yes |
|  | 25 | yes |

TABLE 1-continued

Relation among a Laser power, a rate of movement of a stage, and development of a positive photosensitive resin

| Laser power (W) | Stage movement speed (cm/sec) | Development |
|---|---|---|
| 8 | 100 | yes |
|  | 75 | yes |
|  | 50 | yes |
|  | 40 | yes |

As shown in TABLE 1, development could be performed at stage movement speeds of from 25 cm/sec to 50 cm/sec when laser power was 6 W, and development could be performed at stage movement speeds of from 40 cm/sec to 100 cm/sec when laser power was 8 W.

FIG. 25A shows a surface of a positive photosensitive resin irradiated with laser light and developed with laser power of 6 W and stage movement speed of 25 cm/sec, which is observed with an optical microscope (a reflection bright field mode). FIG. 25B is a schematic diagram of FIG. 25A. A groove of approximately 400 μm in width is formed in a region 1901 irradiated with laser light, compared with a region 1900 not irradiated with laser light. Height of the groove was 1.5 μm when measured with a stylus surface profiler DEKTAK$^3$ST (manufactured by ULVAC, Inc.)

Embodiment 2

Figure 18A:
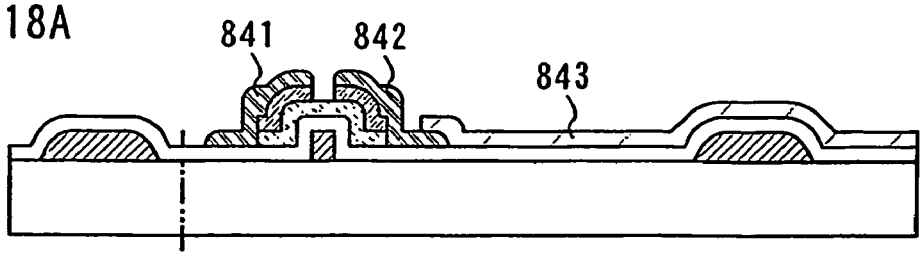
FIGS. 18A to 18D are cross-sectional views showing a manufacturing step of a semiconductor device according to the present invention.
Figure 18B:
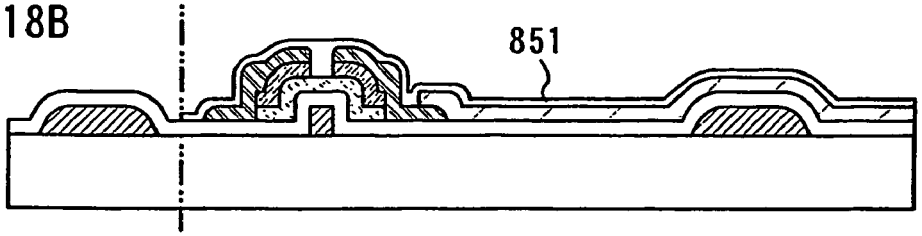
Figure 19:
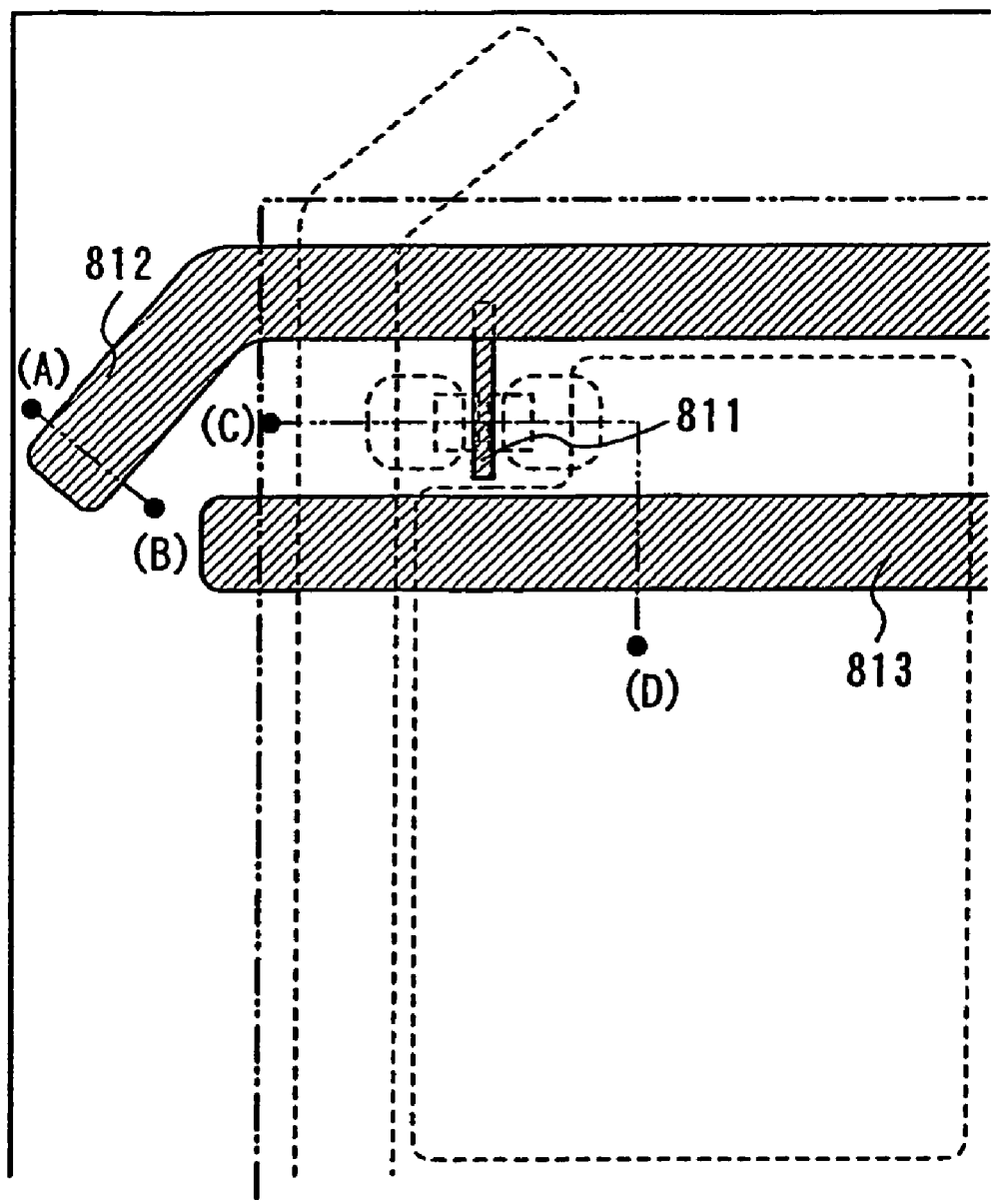
FIG. 19 is a top view showing a manufacturing step of a semiconductor device according to the present invention.
Figure 20:
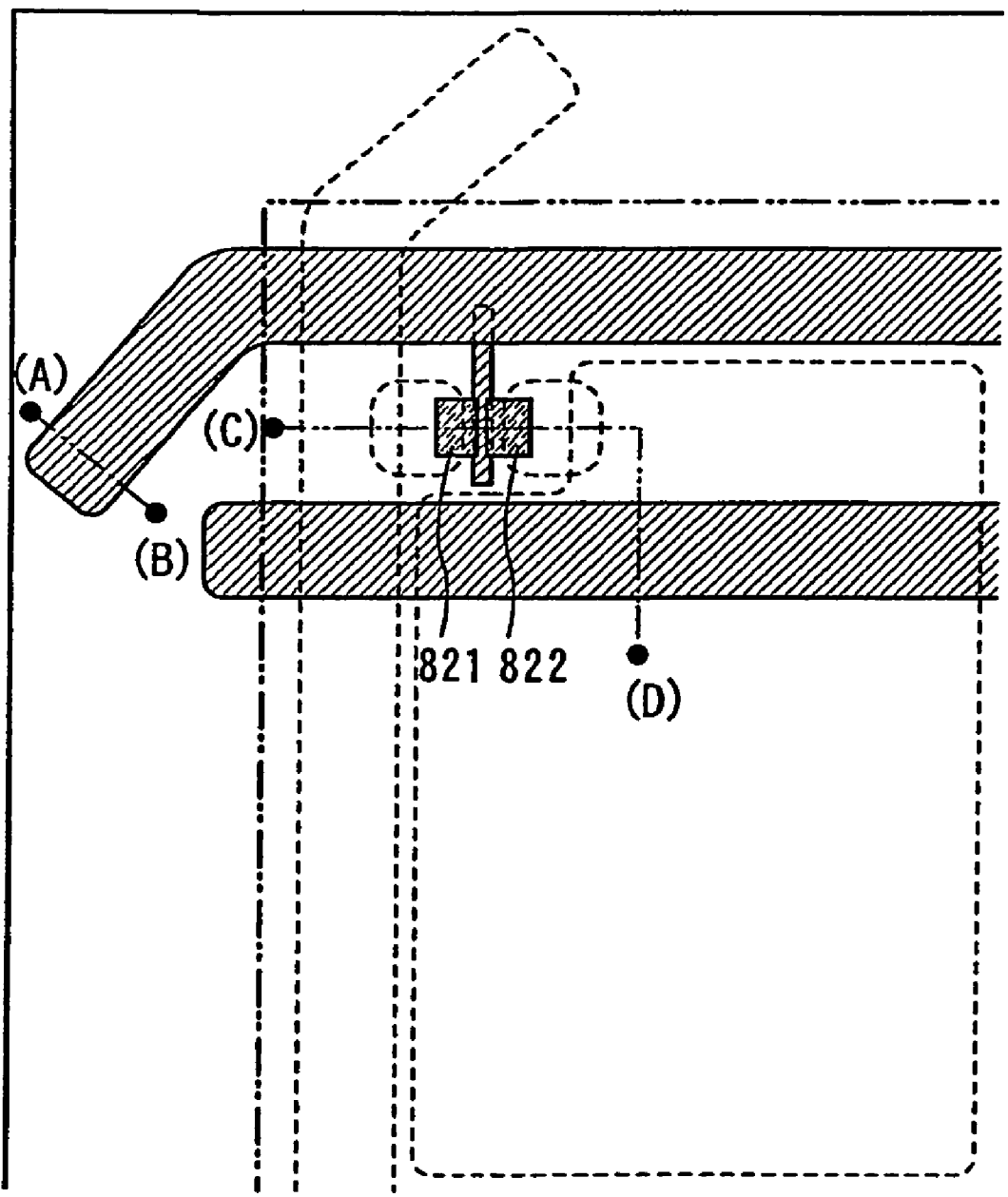
FIG. 20 is a top view showing a manufacturing step of a semiconductor device according to the present invention.
Figure 21:
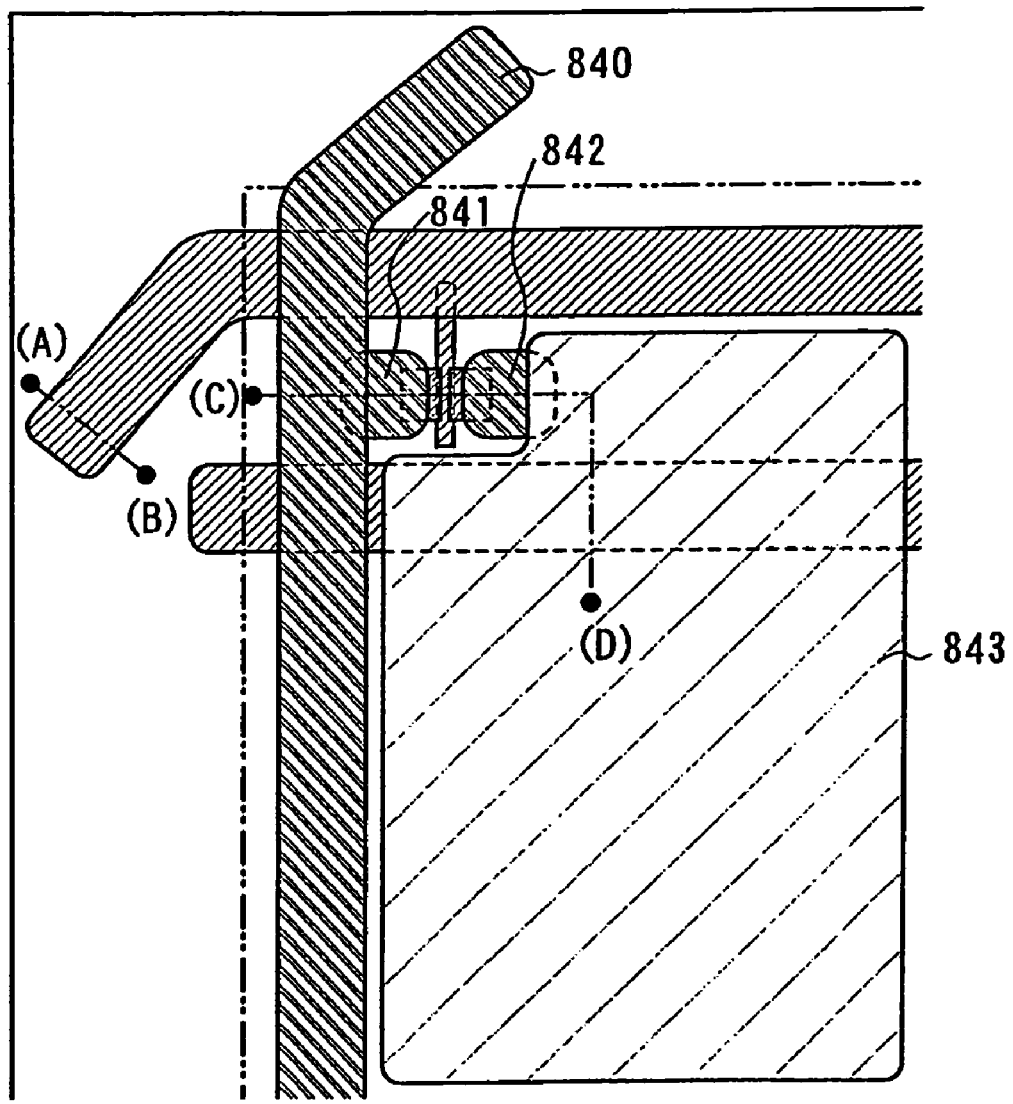
FIG. 21 is a top view showing a manufacturing step of a semiconductor device according to the present invention.

Next, a method for manufacturing an active matrix substrate and a display panel therewith is described with reference to FIGS. 17A to 21. This embodiment is described using a liquid crystal display panel as a display panel. FIGS. 17A to 17G and FIGS. 18A to 18D schematically show a longitudinal section structure of a pixel portion and a connection terminal portion. FIGS. 19 to 21 show a plane structure corresponding to a line A-B and a line C-D.

Figure 17A:
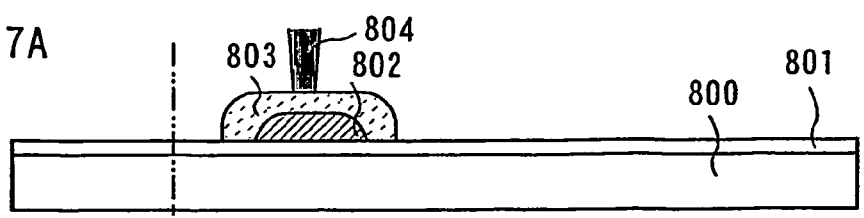
FIGS. 17A to 17G are cross-sectional views showing a manufacturing step of a semiconductor device according to the present invention.
Figure 17B:
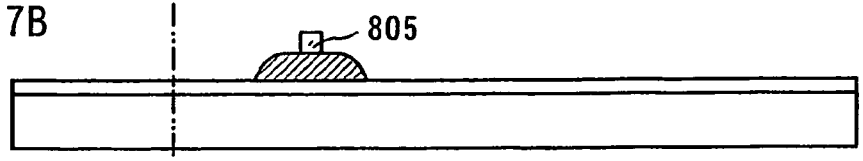

As shown in FIG. 17A, a surface of a substrate 800 is oxidized at a temperature of 400° C. to form an insulating film 801 having a thickness of 100 nm. The insulating film serves as an etching stopper film of a conductive film to be formed later. Subsequently, a first conductive layer 802 is formed over the insulating film 801 by a droplet discharge method, and a first photosensitive resin 803 is discharged by a droplet discharge method to the first conductive layer. Then, the first photosensitive resin is irradiated with laser light 804 and developed to form a first mask pattern 805.

An AN100 glass substrate manufactured by Asahi Glass Co., Ltd. is used as the substrate 800. As the first conductive layer 802, a solution in which Ag (silver) particles are dispersed is discharged and dried by heating at 100° C. for 30 minutes, and is then baked by heating at 230° C. for one hour in an atmosphere with an oxygen concentration of 10%. As the first photosensitive resin 803, a negative photosensitive resin is discharged by a droplet discharge method and dried, and is then temporarily baked. Laser light emitted from Nd:YVO$_4$ laser is used as the laser light 804.

Figure 17C:

Subsequently, the first conductive layer is partially etched by using the first mask pattern to form a gate wiring layer 811 as shown in FIG. 17C. The first mask pattern is removed by using a removing solution A gate wiring layer 812 and a capacitor wiring layer 813 are formed by a droplet discharge method. Note that FIG. 17C schematically shows a longitudinal section structure and a plane structure corresponding to a line A-B and a line C-D is shown in FIG. 19, so it may be referred to as well.

Figure 17D:
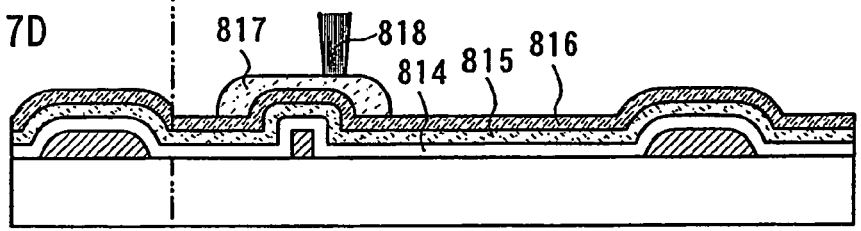

A gate insulating film 814 is formed by a plasma CVD method as shown in FIG. 17D. A silicon oxynitride film (H, 1.8%, N, 2.6%, O, 63.9%, Si, 31.7%) having a thickness of 110 nm is formed as the gate insulating film 814 by a plasma CVD method with the use of $SiH_4$ and $N_2O$ (a flow ratio of $SiH_4:N_2=1:200$) in a chamber heated at 400° C.

A first semiconductor film 815 and a second semiconductor film 816 which shows n-type conductivity are formed. An amorphous silicon film is formed to have a thickness of 150 nm by a plasma CVD method as the first semiconductor film 815. After a first oxide film on the surface of the amorphous silicon film is removed, a semi-amorphous silicon film is formed to have a thickness of 50 nm by using a silane gas and a phosphine gas.

Figure 17E:
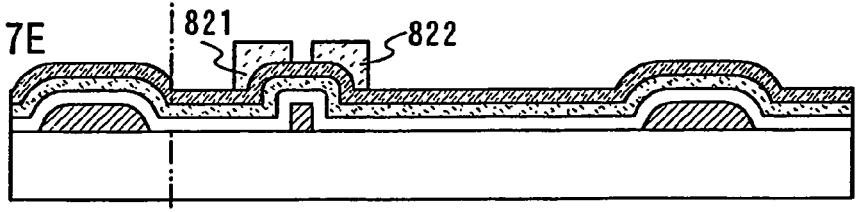
Figure 17F:
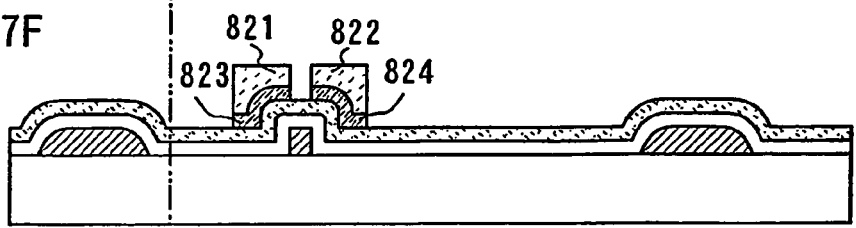

The surface of the second semiconductor film is treated with ozone water, and a thin silicon oxide film is formed on the surface of a second oxide film. Subsequently, a silicon oxide film is formed on the surface of the second semiconductor film by UV light irradiation in an oxygen atmosphere, a thermal oxidation method, treatment with ozone water or hydrogen peroxide including a hydroxyl radical, or the like in order to improve wettability on the surface of the second semiconductor film and to spread an aqueous solution over an entire surface of the second semiconductor film. The silicon oxide film can prevent impurities from a photosensitive material to be applied later from entering the semiconductor film. A second photosensitive resin 817 is discharged thereto. As the second photosensitive resin, a negative photosensitive resin is discharged to the second semiconductor film by a droplet discharge method and dried, and is then temporarily baked. The second photosensitive resin 817 is irradiated with laser light 818 and developed to form second mask patterns 821 and 822 as shown in FIG. 17E.

The second semiconductor film 816 is etched by using the second mask patterns to form first semiconductor regions 823 and 824 (source/drain regions). The second semiconductor film 816 is etched by using a mixed gas having a flow ratio of $CF_4:O_2=10:9$. Thereafter, the second mask patterns 821 and 822 are removed by using a removing solution.

Subsequently, a silicon oxide film is formed over the first semiconductor film and the second semiconductor film by UV light irradiation in an oxygen atmosphere, a thermal oxidation method, treatment with ozone water or hydrogen peroxide including a hydroxyl radical, or the like. Then, a third mask pattern 831 is formed. The third mask pattern is formed by discharging polyimide over the first semiconductor regions 823 and 824 and a part of the first semiconductor film 815 with a droplet discharge method and by heating at 200° C. for 30 minutes.

Figure 17G:
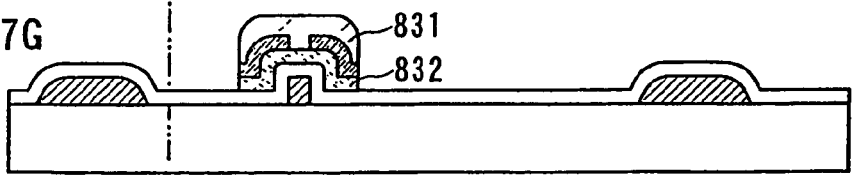

The first semiconductor film 815 is etched by using the third mask pattern 831 to form a second semiconductor region 832 as shown in FIG. 17G Thereafter, the third mask pattern 831 is removed by using a removing solution. Note that FIG. 17G schematically shows a longitudinal section structure and a plane structure corresponding to a line A-B and a line C-D is shown in FIG. 20, so it may be referred to as well.

Subsequently, a source electrode layer 841 and a drain electrode layer 842 shown in FIG. 18A and a source wiring layer 840 shown in FIG. 21 are formed by a droplet discharge method. As the source electrode layer 841 and the drain electrode layer 842, a solution in which Ag (silver) particles are dispersed is discharged and dried by heating at 100° C. for 30 minutes and is then baked by heating at 230° C. for one hour in an atmosphere with an oxygen concentration of 10%. A first pixel electrode 843 is formed to connect to the drain electrode layer 842. Here, indium tin oxide containing silicon oxide (ITSO) is formed by a sputtering method, and a mask pattern is formed by a droplet discharge method. Then, etching is performed, thereby forming the first pixel electrode 843 to connect to the drain electrode layer 842. Alternatively, the first pixel electrode may be formed by discharging the above material by a droplet discharge method. Note that a plan view corresponding to a line A-B and a line C-D in FIG. 18A is shown in FIG. 21.

According to the above steps, an active matrix substrate can be formed.

Since a transmissive liquid crystal display panel is manufactured in this embodiment, the first pixel electrode is made of ITO containing silicon oxide. Alternatively, a pixel electrode may be formed by forming a predetermined pattern of a composition containing indium tin oxide (ITO), zinc oxide (ZnO), tin oxide ($SnO_2$), or the like and by baking. In the case of manufacturing a reflective liquid crystal display panel, a composition which mainly contains particles of a metal such as Ag (silver), Au (gold), Cu (copper), W (tungsten), or Al (aluminum) can be used.

An insulating film is formed by a printing method or a spin coating method to cover the first pixel electrode 843. Then, rubbing is performed to form an orientation film 851 as shown in FIG. 18B. Note that the orientation film 851 can be formed by an oblique evaporation method.

A sealant 860 in the shape of a closed loop is formed by a droplet discharge method in the periphery of a region where a pixel is formed. A liquid crystal material is dropped by a dispenser method (dropping method) inside the closed loop formed with the sealant 860.

Figure 22A:
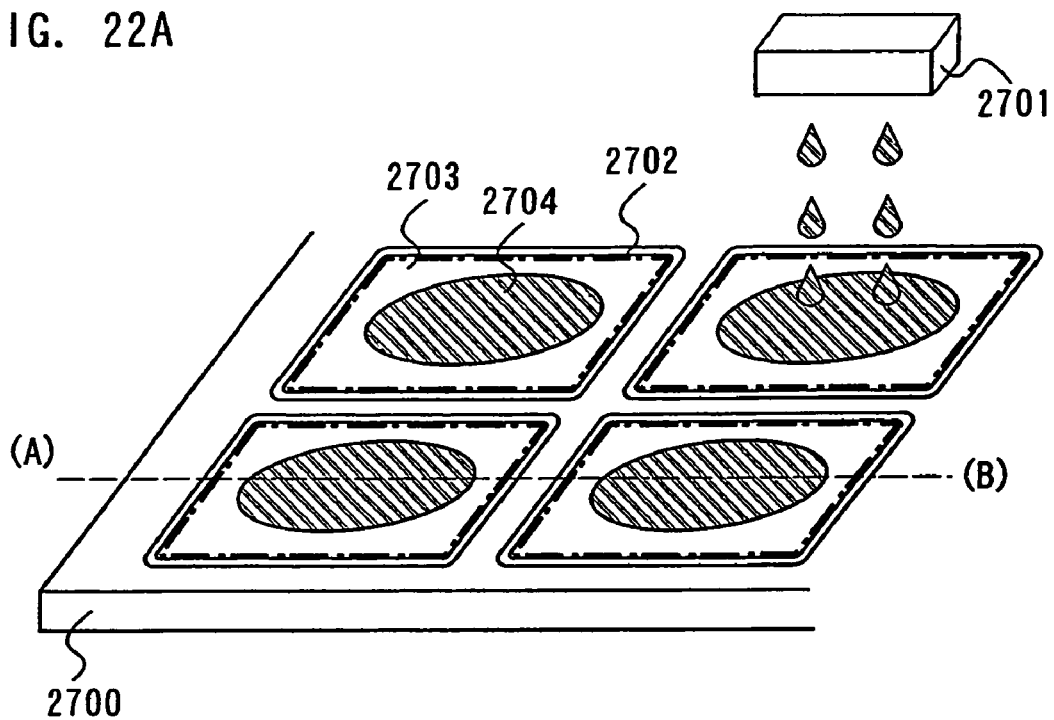
FIGS. 22A and 22B show a liquid crystal drop method which can be applied to the present invention.

Here, a step of dropping a liquid crystal material is described with reference to FIGS. 22A and 22B. FIG. 22A is a perspective view of a step of dropping a liquid crystal material with a dispenser 2701, and FIG. 22B is a cross-sectional view taken along a line A-B in FIG. 22A.

A liquid crystal material 2704 is dropped or discharged from the dispenser 2701 to cover a pixel portion 2703 surrounded by a sealant 2702. A liquid crystal layer can be formed by moving the dispenser 2701 or by moving a substrate 2700 with the dispenser 2701 fixed. In addition, a plurality of dispensers 2701 may be provided to drop a liquid crystal material at a time.

Figure 22B:
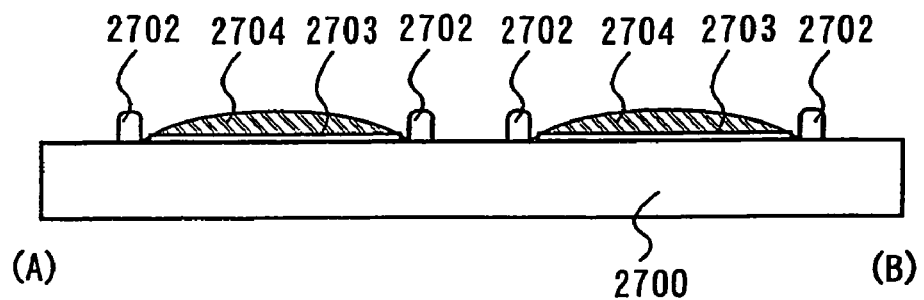

As shown in FIG. 22B, the liquid crystal material 2704 can be selectively dropped or discharged only in a region surrounded by the sealant 2702.

Here, the liquid crystal material is dropped in the pixel portion. However, the liquid crystal material may be dropped on an opposing substrate side; then, a substrate having the pixel portion may be attached thereto.

Figure 18C:
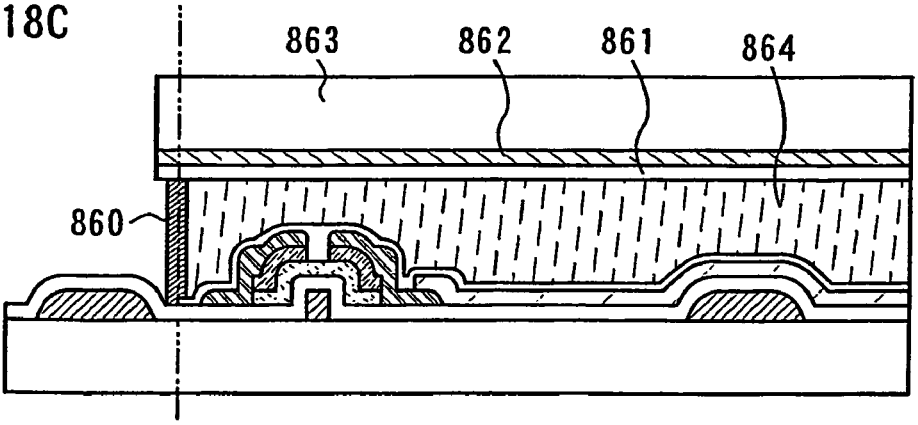

Subsequently, as shown in FIG. 18C, a liquid crystal layer 864 is formed by attaching an opposing substrate 863 provided with an orientation film 861 and a second pixel electrode (opposite electrode) 862 to the substrate 800, performing ultraviolet curing, and filling a liquid crystal material in vacuum.

The sealant 860 may be mixed with a filler, and further, the opposing substrate 863 may be provided with a color filter, a shielding film (black matrix), or the like. Instead of a dispenser method (a dropping method), a dip method (a pumping method) that injects the liquid crystal material by using a capillary phenomenon after attaching the opposing substrate can be used as a method for forming the liquid crystal layer 864.

Figure 18D:
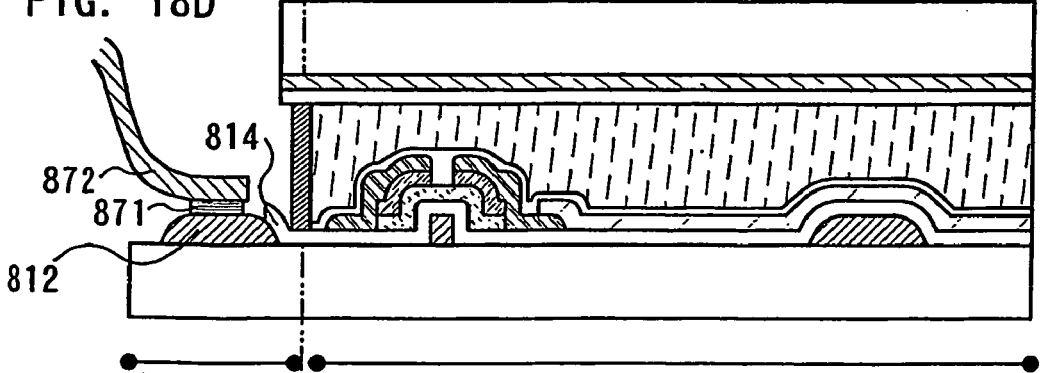

After removing the gate insulating film 814 formed in each edge portion of the gate wiring layer 812 and a source wiring layer (not shown), connection terminals (a connection terminal 872 to be connected to the gate wiring layer and a connection terminal to be connected to the source wiring layer which is not shown) are attached with an anisotropic conductive layer 871 therebetween as shown in FIG. 18D. Further, a connection portion of each wiring layer and connection terminal is preferably sealed with a sealing resin. This structure can prevent moisture from a section from entering and deteriorating the pixel portion. According to the above steps, a liquid crystal display panel can be formed.

According to the above steps, a liquid crystal display panel can be manufactured. Note that a protective circuit, typically, a diode or the like for preventing electrostatic damage may be provided between the connection terminal and the source wiring (gate wiring) or in the pixel portion. In this case, the protection circuit can be operated as a diode by manufacturing with a similar step to that of a TFT described above and by connecting the gate wiring layer of the pixel portion and the drain or source wiring layer of the diode.

Note that any of Embodiment Modes 1 to 7 can be applied to this embodiment. A method for manufacturing a liquid crystal display panel as a display panel is described in this embodiment; however, the invention is not limited thereto. The invention can be appropriately applied to an active display panel including a light-emitting material of an organic material or an inorganic material as a light emitting layer, such as a DMD (Digital Micromirror Device), a PDP (Plasma Display Panel), a FED (Field Emission Display), an electrophoretic display device (electronic paper), or the like.

Embodiment 3

Figure 32:
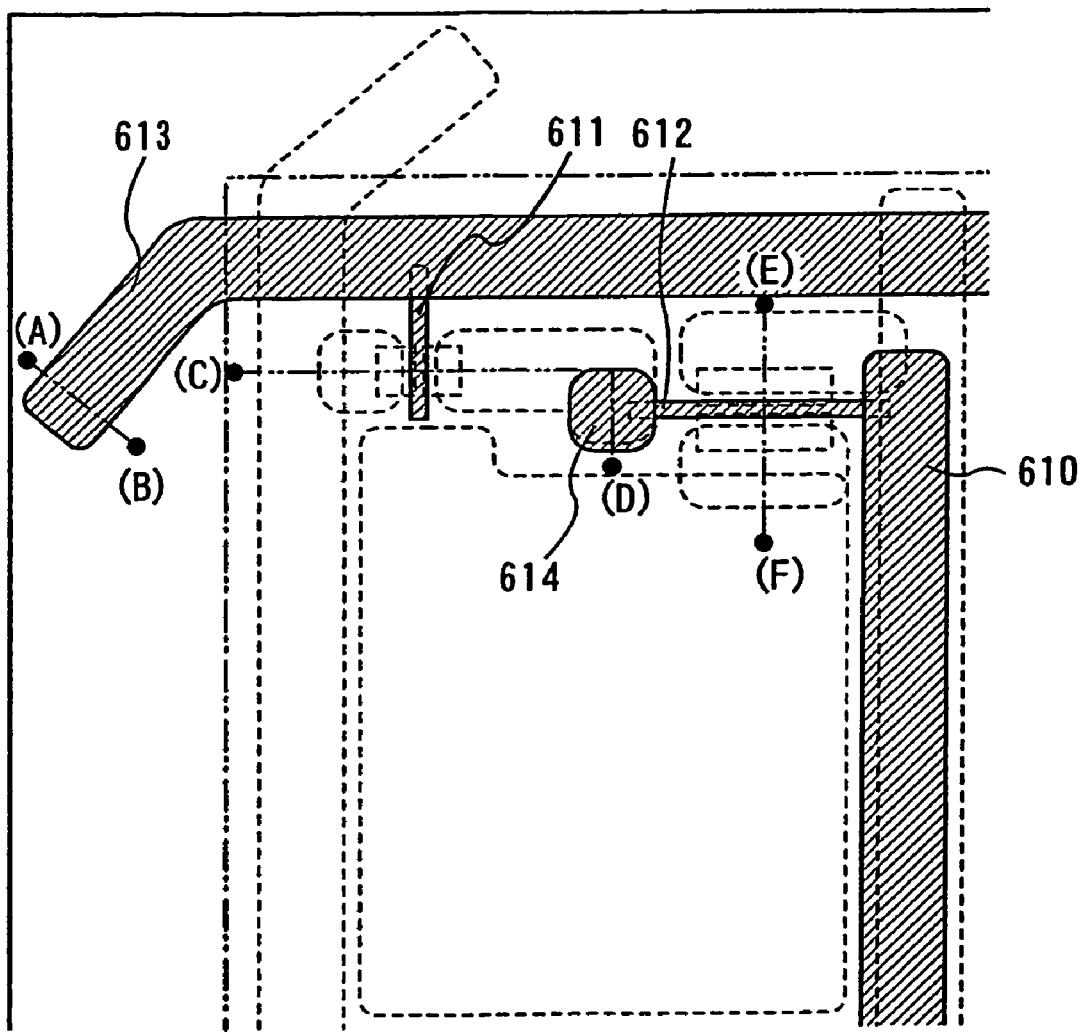
FIG. 32 is a top view showing a manufacturing step of a semiconductor device according to the present invention.
Figure 33:
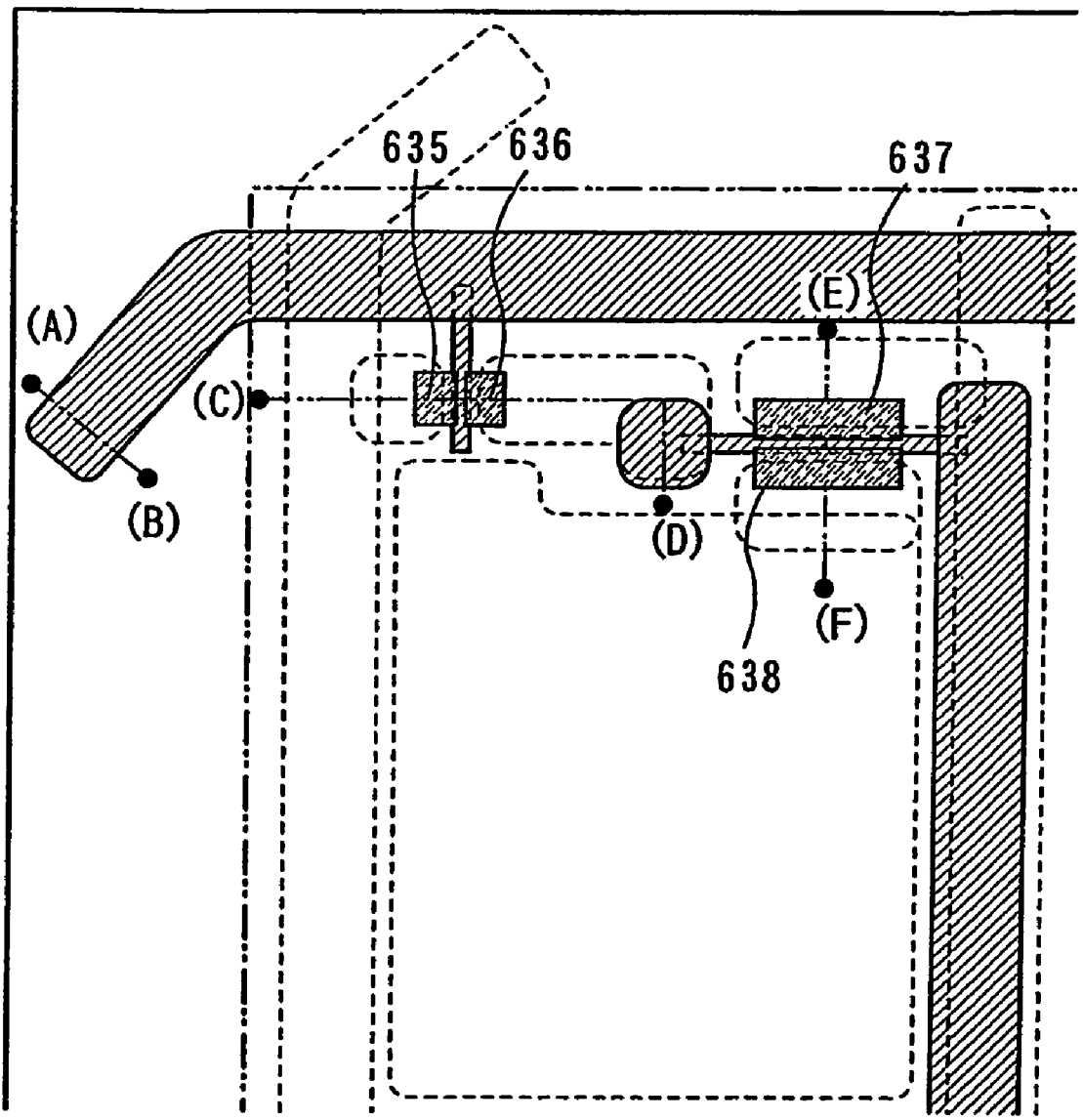
FIG. 33 is a top view showing a manufacturing step of a semiconductor device according to the present invention.
Figure 34:
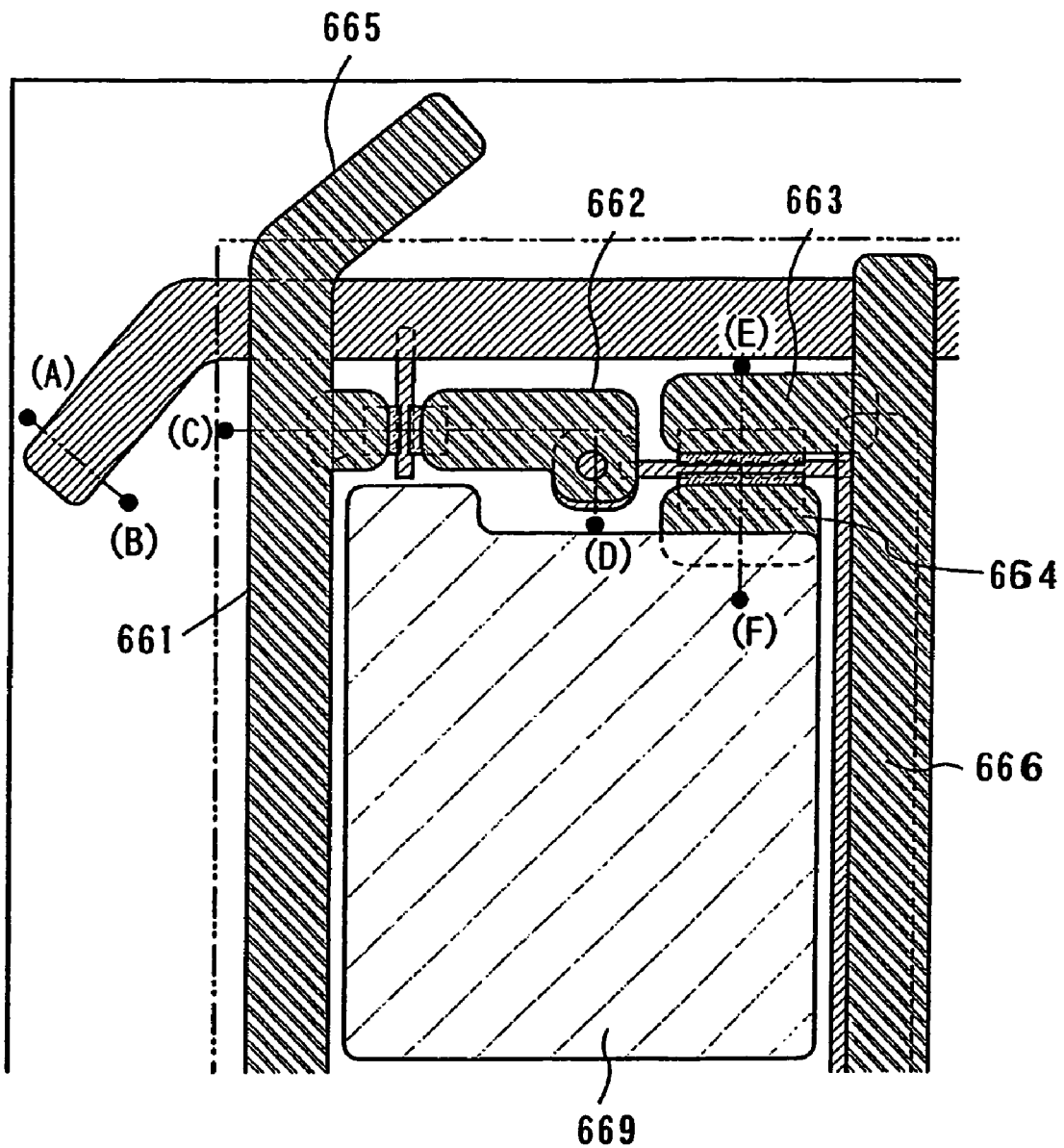
FIG. 34 is a top view showing a manufacturing step of a semiconductor device according to the present invention.

Subsequently, a method for manufacturing an active matrix substrate and a display panel therewith is described with reference to FIGS. 29A to 34. This embodiment is described using a light emitting display panel as a display panel. FIGS. 29A to 31B schematically show a longitudinal section structure of a pixel portion and a connection terminal portion. FIGS. 32 to 34 show a plane structure corresponding to a line A-B, a line C-D, and a line E-F.

As shown in FIG. 29A, a surface of a substrate 600 is oxidized at a temperature of 400° C. to form an insulating film 601 having a thickness of 100 nm. The insulating film serves as an etching stopper film of a conductive film to be formed later. Subsequently, first conductive layers 602 and 603 are formed over the insulating film 601 by a droplet discharge method, and first photosensitive resins 604 and 605 are applied by a droplet discharge method to the first conductive layers. Then, the first photosensitive resins are irradiated with laser light 606 and 607 and developed to form first mask patterns 608 and 609 as shown in FIG. 29B.

An AN100 glass substrate manufactured by Asahi Glass Co., Ltd. is used as the substrate 600. As the first conductive layers 602 and 603, a solution in which Ag (silver) particles are dispersed is discharged and dried by heating at 100° C. for 30 minutes and is then baked by heating at 230° C. for one hour in an atmosphere with an oxygen concentration of 10%. As the first photosensitive resins 604 and 605, negative photosensitive resins are discharged by a droplet discharge method and dried, and are then temporarily baked. Laser light emitted from Nd:YVO$_4$ laser is used as the laser light 606 and 607.

Subsequently, the first conductive layers are partially etched by using the first mask patterns 608 and 609 to form gate electrode layers 611 and 612 as shown in FIG. 29C. The first mask patterns are removed by using a removing solution. A gate wiring layer 613, a connection conductive layer 614, and a capacitor electrode layer 610 which is shown in FIG. 32 are formed by a droplet discharge method. Note that FIG. 29C schematically shows a longitudinal section structure and a plane structure corresponding to a line A-B, a line C-D, and a line E-F is shown in FIG. 32, so it may be referred to as well.

A gate insulating film 615 is formed by a plasma CVD method as shown in FIG. 29D. A silicon oxynitride film (H, 1.8%, N, 2.6%, O, 63.9%, Si, 31.7%) having a thickness of 110 nm is formed as the gate insulating film 615 by a plasma CVD method with the use of SiH$_4$ and N$_2$O (flow ratio of SiH$_4$:N$_2$=1:200) in a chamber heated at 400° C.

A first semiconductor film 616 and a second semiconductor film 617 which shows n-type conductivity are formed. An amorphous silicon film is formed to have a thickness of from 150 nm by a plasma CVD method as the first semiconductor film 616. After an oxide film on the surface of the amorphous silicon film is removed, a semi-amorphous silicon film is formed to have a thickness of 50 nm by using a silane gas and a phosphine gas.

Subsequently, a silicon oxide film is formed over the second semiconductor film by UV light irradiation in an oxygen atmosphere, a thermal oxidation method, treatment with ozone water or hydrogen peroxide including a hydroxyl radical, or the like. Second photosensitive resins 618 and 619 are applied to the second semiconductor film. As a second mask pattern, a negative photosensitive resin is discharged to the second semiconductor film by a droplet discharge method and dried, and are then temporarily baked. The second photosensitive resins 618 and 619 are irradiated with laser light 620 and 621 respectively and developed to form second mask patterns 631 to 634 as shown in FIG. 29E.

The second semiconductor film 617 is etched by using the second mask patterns 631 to 634 to form first semiconductor regions 635 to 638 (source/drain regions) as shown in FIG. 30A. The second semiconductor film 617 is etched by using a mixed gas having a flow ratio of CF$_4$:O$_2$=10:9. Thereafter, the second mask patterns 631 to 634 are removed by using a removing solution.

Subsequently, a silicon oxide film is formed over the first semiconductor film and the first semiconductor regions by UV light irradiation in an oxygen atmosphere, a thermal oxidation method, treatment with ozone water or hydrogen peroxide including a hydroxyl radical, or the like. Then, third mask patterns 641 and 642 are discharged. The third mask patterns are formed by discharging polyimide to the first semiconductor regions 635 to 638 and a part of the first semiconductor film 616 with a droplet discharge method and by heating at 200° C. for 30 minutes.

The first semiconductor film 616 is etched by using the third mask patterns 641 and 642 to form second semiconductor regions 643 and 644 as shown in FIG. 30B. Thereafter, the third mask patterns 641 and 642 are removed by using a removing solution. Note that FIG. 30B schematically shows a longitudinal section structure and a plane structure corresponding to a line A-B, a line C-D, and a line E-F is shown in FIG. 33, so it may be referred to as well.

Subsequently, a third photosensitive resin 651 is discharged or applied, irradiated with laser light 652, and developed as shown in FIG. 30C. A novolac resin which is a positive photosensitive resin is used as the third photosensitive resin 651. Accordingly, a fourth mask pattern 653 is formed as shown in FIG. 30D.

The gate insulating film 615 is etched by using the fourth mask pattern 653 as a mask to expose a part of the connection conductive layer 614. Then, the fourth mask pattern is removed by using a removing solution.

Subsequently, source electrode layers 661 and 663 and drain electrode layers 662 and 664 shown in FIG. 31A and a source wiring layer 665 and a power supply line layer 666 shown in FIG. 34 are formed by a droplet discharge method.

As these conductive layers, a solution in which Ag (silver) particles are dispersed is discharged and dried by heating at 100° C. for 30 minutes and is then baked by beating at 230° C. for one hour in an atmosphere with an oxygen concentration of 10%. Note that the drain electrode layer 662 is connected to the connection conductive layer 614. Therefore, the drain electrode layer 662 is electrically connected to the gate electrode layer 612.

According to the above steps, an active matrix substrate can be formed.

Subsequently, a first pixel electrode 667 is formed to connect to the drain electrode layer 664. Here, indium tin oxide (ITO), indium tin oxide containing silicon oxide (ITSO), zinc oxide (ZnO), or the like may be formed by a sputtering method, and a mask pattern may be formed by a droplet discharge method. Then, etching is performed, thereby forming the first pixel electrode 667 to connect to the drain electrode layer 664. More preferably, indium tin oxide containing silicon oxide is formed by a sputtering method using a target in which ITO contains silicon oxide of from 2% to 10% by weight. In addition, an oxide conductive material may be used, which contains silicon oxide and in which indium oxide is mixed with zinc oxide (ZnO) of from 2% to 20% by weight. The first pixel electrode can be formed by discharging the above material with a droplet discharge method.

In addition, a composition which mainly contains particles of a metal such as Ag (silver), Au (gold), Cu (copper), W (tungsten), or Al (aluminum) can be used in the case of manufacturing a light emitting display panel having such a structure that generated light is emitted to an opposite side of the substrate 600, that is, a reflective light emitting display panel. As another method, the first pixel electrode may be formed by forming a transparent conductive film or a light-reflective conductive film by a sputtering method, forming a mask pattern with a droplet discharge method, and additionally performing an etching process.

Note that a plan view corresponding to a line A-B, a line C-D, and a line E-F in FIG. 31A is shown in FIG. 34.

According to the above steps, a switching TFT 668 and a driving TFT 669 are formed.

Subsequently, a protective layer 671 of silicon nitride or silicon nitride oxide and an insulating layer 672 are entirely formed. An opening is formed through an etching process as shown in FIG. 31B after the insulating layer 672 is entirely formed by a spin coating method or a dipping method. The etching is performed simultaneously on the protective layer 671 and the gate insulating film 615 by using the insulating layer 672 as a mask to expose the first pixel electrode 667 and the gate wiring layer 613. The etching process is not necessarily required to form the insulating layer when the insulating layer 672 is formed by a droplet discharge method.

In the insulating layer 672, a through-hole is formed to correspond to a position where a pixel is to be formed in accordance with the first pixel electrode 667. The insulating layer 672 can be formed by using an inorganic insulating material such as silicon oxide, silicon nitride, silicon oxynitride, aluminum oxide, aluminum nitride, or aluminum oxynitride; acrylic acid; methacrylic acid; a derivative of acrylic acid or methacrylic acid; a heat-resistant high molecular weight material such as polyimide, aromatic polyamide, or polybenzimidazole; or inorganic siloxane including a Si—O—Si bond among compounds that contain silicon, oxygen, and hydrogen and that are formed by using a siloxane material as a starting material or an organosiloxane-based insulating material in which hydrogen bonded with silicon is substituted by an organic group such as methyl or phenyl. It is preferable to form the insulating layer by using a photosensitive or non-photosensitive material such as acrylic or polyimide, since a side face thereof becomes a shape in which the radius of curvature continuously changes and an upper-layer thin film is formed without break.

After a light emitting layer 673 is formed by an evaporation method or an application method such as a spin coating method or ink-jetting, a second pixel electrode 674 is formed, thereby forming a light emitting element 677. The light emitting element 677 is connected to the driving TFT 669. Note that moisture adsorbed inside or on the surface of the insulating layer 672 is removed by performing heat treatment at 200° C. under atmospheric pressure before forming the light emitting layer 673. In addition, heat treatment is performed at from 200° C. to 400° C., preferably, from 250° C. to 350° C. under reduced pressure, and the light emitting layer 673 is preferably formed by a vacuum evaporation method or a droplet discharge method under reduced pressure without being exposed to atmospheric air.

In addition, surface treatment may be performed on the surface of the first pixel electrode 667 by exposing the surface to oxygen plasma or irradiating the surface with ultraviolet light.

The light emitting layer may be made of a charge injection transport material and a light emitting material containing an organic compound or an inorganic compound. The light emitting layer includes one or plural kinds of layers of a low molecular weight organic compound, an intermediate molecular weight organic compound, and a high molecular weight organic compound. The light emitting layer may be combined with an electron injection transport or hole injection transport inorganic compound.

As a high electron transporting material among charge injection transport materials, a metal complex that has a quinoline skeleton or a benzoquinoline skeleton such as tris (6-quinolinolato)aluminum [Alq$_3$], tris(5-methyl-6-quinolinolato)aluminum [Almq$_3$], bis(10-hydroxybenzo[h]-quinolinato)beryllium [BeBq$_2$], or bis(2-methyl-8-quinolinolato)-4-phenylphenolato-aluminum [BAlq], and the like can be given. As a high hole transporting material, an aromatic amine compound (that is, a compound having a benzene ring-nitrogen bond) such as 4,4'-bis[N-(1-naphthyl)-N-phenyl-amino]-biphenyl [α-NPD], 4,4'-bis[N-(3-methylphenyl)-N-phenyl-amino]-biphenyl [TPD], 4,4',4"-tris(N,N-diphenyl-amino)-triphenylamine [TDATA], or 4,4',4"-tris[N-(3-methylphenyl)-N-phenyl-amino]-triphenylamine [MTDATA] can be specifically given.

In addition, as a high electron injecting material among charge injection transport materials, a compound of an alkali metal or an alkaline earth metal such as lithium fluoride (LiF), cesium fluoride (CsF), or calcium fluoride (CaF$_2$) can be specifically given. In addition, the high electron injecting material may be a mixture of a high electron transporting material such as Alq$_3$ and an alkaline earth metal such as magnesium (Mg).

As a high hole injecting material among charge injection transport materials, metal oxide such as molybdenum oxide (MoOx), vanadium oxide (VOx), ruthenium oxide (RuOx), tungsten oxide (WOx), or manganese oxide (MnOx) can be given. In addition, a phthalocyanine compound such as phthalocyanine [H$_2$Pc] or copper phthalocyanine (CuPC) can be given.

The light emitting layer may perform color display by providing each pixel with light emitting layers having different emission wavelength bands. Typically, a light emitting layer corresponding to each color of R (red), G (green), and B (blue) is formed. In this case, color purity can be increased and a pixel portion can be prevented from having a mirror surface (glare) by providing a light emitting side of a pixel with a filter (colored layer) which transmits light of an emission wavelength band. Providing a filter (colored layer) can omit a circular polarizing plate or the like which is conventionally required and can eliminate the loss of light emitted from a light emitting layer. Further, change in hue, which occurs when a pixel portion (display screen) is obliquely seen, can be reduced.

A light-emitting material includes various materials. As to a low molecular weight organic light emitting material, 4-dicyanomethylene-2-methyl-6-[2-(1,1,7,7-tetramethyl-9-julolidyl)ethenyl]-4H-pyran [DCJT], 4-dicyanomethylene-2-t-butyl-6-[2-(1,1,7,7-tetramethyl juloldine-9-yl-ethenyl)-4H-pyran [DCJTB], periflanthene, 2,5-dicyano-1,4-bis[2-(10-methoxy-1,1,7,7-tetramethyl juloldine-9-yl)ethenyl] benzene, N,N-dimethyl quinacridon [DMQd], coumarin 6, coumarin 545T, tris(8-quinolinolate)aluminum [$Alq_3$], 9,9'-bianthryl, 9,10-diphenylanthracene [DPA], 9,10-bis(2-naphthyl)anthracene [DNA], or the like can be used. In addition, another material can also be used.

On the contrary, a high molecular weight organic light emitting material is physically stronger than a low molecular weight material and is superior in durability of the element. In addition, a high molecular weight material can be formed by application, and therefore, the element is relatively easily manufactured. A structure of a light emitting element using a high molecular weight organic light emitting material is basically the same as that of a light emitting element using a low molecular weight organic light emitting material, that is, a cathode/an organic light emitting layer/an anode. However, a two-layer structure is employed in many cases when a light emitting layer using a high molecular weight organic light emitting material is formed. This is because it is difficult to form such a laminated structure as in the case of using a low molecular weight organic light emitting material. Specifically, the light emitting element using a high molecular weight organic light emitting material has a structure of a cathode/a light emitting layer/a hole transport layer/an anode.

The emission color is determined by the material of the light emitting layer. Therefore, a light emitting element that emits desired light can be formed by selecting an appropriate material of the light emitting layer. As a high molecular weight electroluminescent material that can be used to form the light emitting layer, a polyparaphenylene-vinylene-based material, a polyparaphenylene-based material, a polythiophen-based material, or a polyfluorene-based material can be given.

As the polyparaphenylene-vinylene-based material, a derivative of poly(paraphenylene vinylene) [PPV], for example, poly(2,5-dialkoxy-1,4-phenylene vinylene) [RO-PPV], poly(2-(2'-ethyl-hexoxy)-5-metoxy-1,4-phenylene vinylene) [MEH-PPV], poly(2-(dialkoxyphenyl)-1,4-phenylene vinylene) [ROPh-PPV], or the like can be given. As the polyparaphenylene-based material, a derivative of polyparaphenylene [PPP], for example, poly(2,5-dialkoxy-1,4-phenylene) [RO-PPP], poly(2,5-dihexoxy-1,4-phenylene), or the like can be given. As the polythiophene-based material, a derivative of polythiophene [PT], for example, poly(3-alkylthiophene) [PAT], poly(3-hexylthiophene) [PHT], poly(3-cyclohexylthiophene) [PCHT], poly(3-cyclohexyl-4-methilthiophene) [PCHMT], poly(3,4-dicyclohexylthiophene) [PDCHT], poly[3-(4-octylphenyl)-thiophene] [POPT], poly[3-(4-octylphenyl)-2,2bithiophene] [PTOPT], or the like can be given. As the polyfluorene-based material, a derivative of polyfluorene [PF], for example, poly(9,9-dialkylfluorene) [PDAF], poly(9,9-dioctylfluorene) [PDOF], or the like can be given.

Note that a property of a hole injection from an anode can be enhanced by interposing a high molecular weight organic light emitting material having hole transporting properties between an anode and a high molecular weight organic light emitting material having light emitting properties. This hole transporting material is generally dissolved into water together with an acceptor material, and the solution is applied by a spin coating method or the like. Since the hole transporting material is insoluble in an organic solvent, a laminate with the above-described organic light emitting material having light emitting properties can be formed. A mixture of PEDOT and camphor sulfonic acid (CSA) that serves as an acceptor material, a mixture of polyaniline [PANI] and polystyrene sulfonic acid [PSS] that serves as an acceptor material, and the like can be given as the hole transporting high molecular weight organic light emitting material.

In addition, the light emitting layer can be formed to emit monochrome or white light. In the case of using a white light emitting material, a filter (colored layer) which transmits light having a specific wavelength is provided on a light emitting side of a pixel, thereby performing color display.

In order to form a light emitting layer which emits white light, for example, $Alq_3$, $Alq_3$ partially doped with Nile red that is a red light emitting pigment, p-EtTAZ, and TPD (aromatic diamine) are sequentially laminated by an evaporation method to obtain white light. When the light emitting layer is formed by an application method using spin coating, the layer after application is preferably baked by vacuum heating. For example, an aqueous solution of poly(ethylene dioxythiophene)/poly(styrene sulfonic acid) (PEDOT/PSS) may be entirely applied and baked to form a film that functions as a hole injection layer. Then, a polyvinyl carbazole (PVK) solution doped with a light emitting center pigment (such as 1,1,4,4-tetraphenyl-1,3-butadiene (TPB), 4-dicyanomethylene-2-methyl-6-(p-dimethylamino-styryl)-4H-pyran (DCM1), Nile red, or coumarin 6) may be entirely applied and baked to form a film that functions as a light emitting layer.

The light emitting layer may be formed to be a single layer. For example, a 1,3,4-oxadiazole derivative (PBD) capable of transporting electrons may be dispersed in polyvinyl carbazole (PVK) capable of transporting holes. Another method to obtain white light emission is to disperse PBD of 30 wt % as an electron transporting agent and to disperse four kinds of pigments (TPB, coumarin 6, DCM1, and Nile red) in appropriate amounts. In addition to the light emitting elements described here that provide white light emission, a light emitting element that provides red light emission, green light emission, or blue light emission can be manufactured by appropriately selecting materials of the light emitting layer.

Further, a triplet excitation material containing a metal complex or the like as well as a singlet excitation light emitting material may be used for the light emitting layer. For example, among pixels emitting red, green, and blue light, a pixel emitting red light whose luminance is reduced by half in a relatively short time is made of a triplet excitation light emitting material and the rest are made of a singlet excitation light emitting material. A triplet excitation light emitting material has a characteristic that the material has a good luminous efficiency and consumes less power to obtain the same luminance. When a third excitation light emitting material is used for a red pixel, only small amount of current needs to be applied to a light emitting element. Thus, reliability can be improved. A pixel emitting red light and a pixel emitting green light may be made of a triplet excitation light emitting material and a pixel emitting blue light may be made of a singlet excitation light emitting material to achieve low power consumption. Low power consumption can be further achieved by forming a light emitting element which emits green light that has high visibility with a triplet excitation light emitting material.

A metal complex used as a dopant is an example of a triplet excitation light emitting material, and a metal complex having platinum that is a third transition series element as a metal center, a metal complex having iridium as a metal center, and the like are known. A triplet excitation light emitting material is not limited to the compounds. A compound having the above described structure and an element belonging to any of Groups 8 to 10 of the periodic table as a metal center can also be used.

The above described materials for forming the light emitting layer are just examples. A light emitting element can be formed by appropriately laminating functional layers such as a hole injection transport layer, a hole transport layer, an electron injection transport layer, an electron transport layer, a light emitting layer, an electron blocking layer, and a hole blocking layer. Further, a mixed layer or a mixed junction may be formed by combining these layers. The layer structure of the light emitting layer can be varied. Instead of providing a specific electron injection region or light emitting region, modification such as providing an electrode for the purpose or providing a dispersed light emitting material is acceptable as long as it does not deviate from the scope of the invention.

A light emitting element formed with the above described materials emits light by being biased in a forward direction. A pixel of a display device formed with a light emitting element can be driven by a simple matrix mode or an active matrix mode. In any event, each pixel emits light by applying a forward bias thereto in specific timing; however, the pixel is in a non-light-emitting state for a certain period. Reliability of a light emitting element can be improved by applying a backward bias at this non-light-emitting time. In a light emitting element, there is a deterioration mode in which emission intensity is decreased under specific driving conditions or a deterioration mode in which a non-light-emitting region is enlarged in the pixel and luminance is apparently decreased. However, progression of deterioration can be slowed down by alternating driving. Thus, reliability of a light emitting device can be improved.

Subsequently, a sealant 676 is formed and sealing is performed by using a sealing substrate 675. Subsequently, a connection terminal (a connection terminal 682 to be connected to the gate wiring layer and a connection terminal to be connected to the source wiring layer which is not shown) is attached to each edge portion of the gate wiring layer 613 and a source wiring layer (not shown) with an anisotropic conductive layer 681 therebetween. Further, a connection portion of each wiring layer and connection terminal is preferably sealed with a sealing resin 683. This structure can prevent moisture from a section from entering and deteriorating the pixel portion. According to the above steps, a light emitting display panel can be formed.

According to the above described steps, a light emitting display panel can be manufactured. Note that a protective circuit, typically, a diode or the like for preventing electrostatic damage may be provided between the connection terminal and the source wiring (gate wiring) or in the pixel portion. In this case, the protection circuit can be operated as a diode by manufacturing with a similar step to that of the TFT described above and by connecting the gate wiring layer of the pixel portion to the drain or source wiring layer of the diode.

Embodiment 4

A mode of a light emitting element applicable to the above embodiments is described with reference to FIGS. 26A to 26D.

Figure 26A:
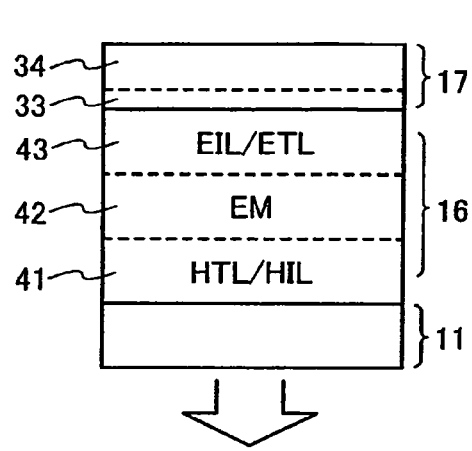
FIGS. 26A to 26D show modes of a light emitting element which can be applied to the present invention.

FIG. 26A shows an example of a light emitting element whose first pixel electrode 11 is made of a light-transmitting oxide conductive material. The first electrode 11 is made of an oxide conductive material containing silicon oxide with a concentration of from 1 atomic % to 15 atomic %. An EL layer 16 is formed thereover, which is a laminate of a hole injection layer and/or a hole transport layer 41, a light emitting layer 42, and an electron transport layer and/or an electron injection layer 43. A second pixel electrode 17 is formed with a first electrode layer 33 containing an alkali metal or alkaline earth metal such as LiF or MgAg and a second electrode layer 34 made of a metal material such as aluminum. A pixel of this structure can emit light from the side of the first pixel electrode 11 as indicated by an arrow in the figure.

Figure 26B:
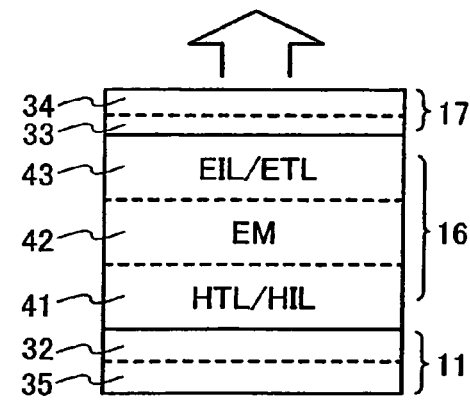

FIG. 26B shows an example of a light emitting element which emits light through a second pixel electrode 17. A first pixel electrode 11 is formed with a first electrode layer 35 made of a metal such as aluminum or titanium or a metal material containing the metal and nitrogen with concentrations of a stoichiometric composition ratio or less and a second electrode layer 32 made of an oxide conductive material containing silicon oxide with a concentration of from 1 atomic % to 15 atomic %. An EL layer 16 is formed thereover, which is a laminate of a hole injection layer and/or a hole transport layer 41, a light emitting layer 42, and an electron transport layer and/or an electron injection layer 43. A second pixel electrode 17 is formed with a third electrode layer 33 containing alkali metal or alkaline earth metal such as LiF or CaF and a fourth electrode layer 34 made of a metal material such as aluminum. Each layer is formed to have thicknesses of 100 nm or less so that the layer can transmit light. Accordingly, light can be emitted through the second pixel electrode 17.

Figure 26C:
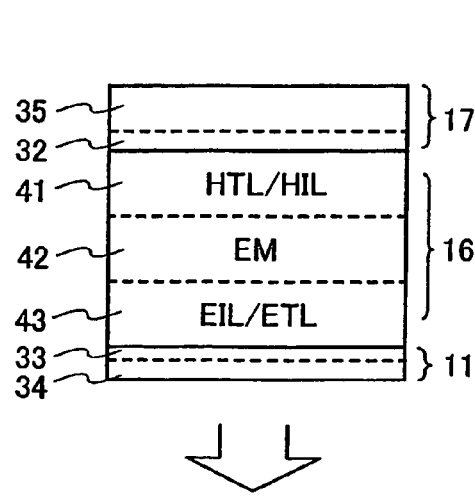

FIG. 26C shows an example of a light emitting element which emits light through a first pixel electrode 11 and a structure in which an EL layer is formed by sequentially laminating an electron transport layer and/or an electron injection layer 43, a light emitting layer 42, and a hole injection layer and/or a hole transport layer 41. A second pixel electrode 17 is formed, from the EL layer 16 side, with a second electrode layer 32 made of an oxide conductive material containing silicon oxide with concentrations of from 1 atomic % to 15 atomic % and a first electrode layer 35 made of a metal such as aluminum or titanium or a metal material containing the metal and nitrogen with a concentration of a stoichiometric composition ratio or less. The first pixel electrode 11 is formed with a third electrode layer 33 containing alkali metal or alkaline earth metal such as LiF or CaF and a fourth electrode layer 34 made of a metal material such as aluminum. Each layer is formed to have thicknesses of 100 nm or less so that the layer can transmit light. Accordingly, light can be emitted through the first pixel electrode 11.

Figure 26D:
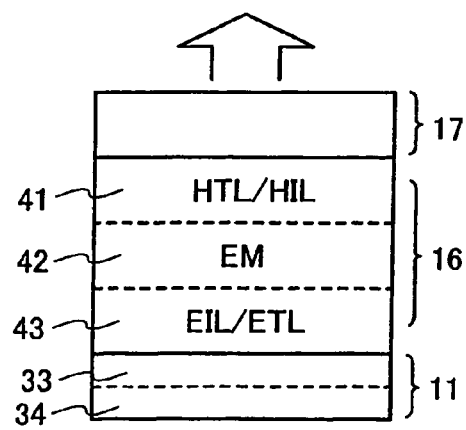

FIG. 26D shows an example of a light emitting element which emits light through a second pixel electrode 17 and a structure in which an EL layer is formed by sequentially laminating an electron transport layer and/or an electron injection layer 43, a light emitting layer 42, and a hole injection layer and/or a hole transport layer 41. The first pixel electrode 11 is formed to have a similar structure to that shown in FIG. 25A and to be thick to the extent that the first pixel electrode can reflect light emitted from the EL layer. The second pixel electrode 17 is made of an oxide conductive material containing silicon oxide with a concentration of from 1 atomic % to 15 atomic %. In this structure, the hole injection layer or hole transport layer 41 is made of inorganic metal oxide (typically, molybdenum oxide or vanadium oxide). Accordingly, oxygen to be introduced in forming the second pixel electrode 17 is supplied and a hole injection property is improved. Thus, drive voltage can be lowered.

Embodiment 5

A pixel circuit of a light-emitting display panel as described in the above embodiments and an operating method thereof are described with reference to FIGS. 27A to 27F.

Figure 27A:
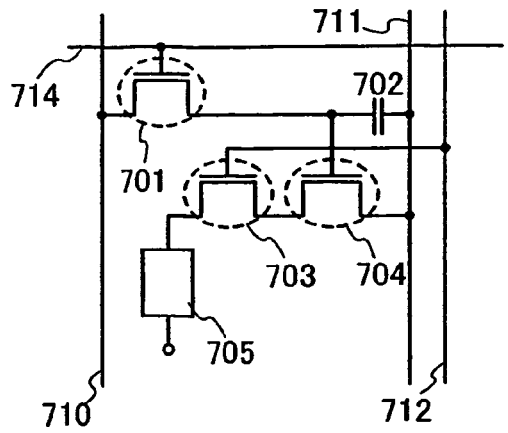
FIGS. 27A to 27F are equivalent circuit diagrams showing a structure of a pixel which can be applied to a light-emitting display panel of the present invention.

In a pixel shown in FIG. 27A, a signal line 710 and power supply lines 711 and 712 are arranged in a column direction and a scanning line 714 is arranged in a row direction. In addition, the pixel includes a switching TFT 701, a driving TFT 703, a current control TFT 704, a capacitor element 702, and a light emitting element 705.

Figure 27B:
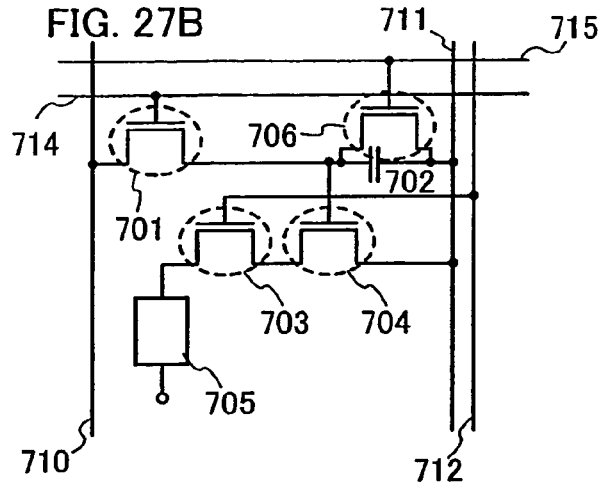
Figure 27C:
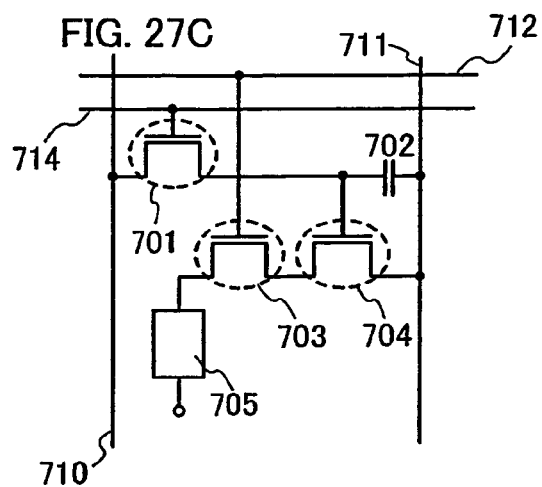
Figure 27D:
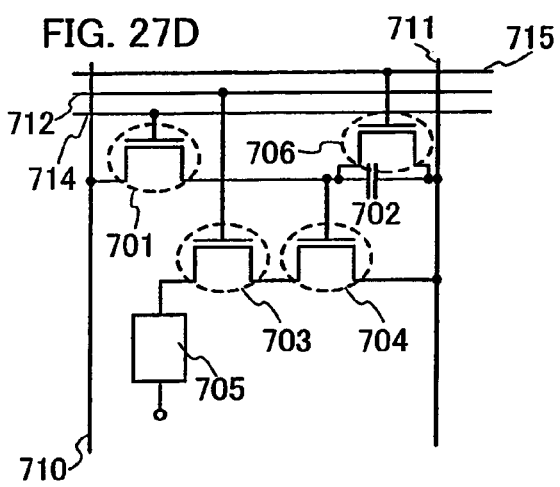

A pixel shown in FIG. 27C is different in the way that a gate electrode of a TFT 703 is connected to a power supply line 712 arranged in a row direction, but other than that, the pixel has a similar structure to the pixel shown in FIG. 27A. In other words, equivalent circuit diagrams of both of the pixels shown in FIGS. 27A and 27C are the same. However, each power supply line is formed using a conductive layer in a different layer when the power supply line 712 is arranged in a column direction (FIG. 27A) and when the power supply line 712 is arranged in a row direction (FIG. 27C). Here, a wiring connected to the gate electrode of the driving TFT 703 is focused and the figures are separately shown in FIGS. 27A and 27C to show that the wirings are formed in different layers.

In the pixels shown in FIG. 27A and FIG. 27C, the TFTs 703 and 704 are connected in series in the pixel. A channel length L(703) and a channel width W(703) of the TFT 703 and a channel length L(704) and a channel width W(704) of the TFT 704 are preferably set to satisfy L(703)/W(703): L(704)/W(704)=5 to 6000:1.

Note that the TFT 703 operates in a saturation region and has a role of controlling the amount of electric current flowing through the light emitting element 705, and the TFT 704 operates in a linear region and has a role of controlling supply of electric current to the light emitting element 705. It is also preferable from the viewpoint of the manufacturing steps that both of the TFT's have the same conductivity. In this embodiment mode, the TFTs are formed to be n-channel TFTs. Further, the TFT 703 may be a depletion mode TFT as well as an enhancement mode TFT. In the present invention having the above structure, the TFT 704 operates in a linear region, so that slight variation in Vgs (gate-source voltage) of the TFT 704 does not affect the amount of electric current of the light emitting element 705. In other words, the amount of electric current of the light emitting element 705 is determined by the TFT 703 which operates in a saturation region. According to the above-described structure, luminance variation of the light emitting element, which is caused by variation in characteristics of the TFT, can be improved, and a display device with improved image quality can be provided.

In the pixels shown in FIGS. 27A to 27D, the TFT 701 is a TFT for controlling input of a video signal to the pixel. When the TFT 701 is turned ON, the video signal is inputted to the pixel. Then, voltage of the video signal is stored in the capacitor element 702. FIGS. 27A and 27C each show a structure in which the capacitor element 702 is provided; however, the invention is not limited thereto. When a gate capacitor or the like can be used as the capacitor that can hold a video signal, the capacitor element 702 may not be provided.

The pixel shown in FIG. 27B has the same structure as the pixel shown in FIG. 27A except that a TFT 706 and a scanning line 715 are added. In the same manner, a pixel shown in FIG. 27D has the same structure as the pixel shown in FIG. 27C except that a TFT 706 and a scanning line 715 are added.

In the TFT 706, ON or OFF is controlled by the scanning line 715 that is newly arranged. When the TFT 706 is turned ON, an electric charge held in the capacitor element 702 is discharged, and the TFT 704 is turned OFF. In other words, it is possible to make a state in which current is forced not to flow through the light emitting element 705 by disposing the TFT 706. Therefore, the TFT 706 can be referred to as an erasing TFT. Accordingly, in the structures in FIGS. 27B and 27D, a lighting period can be started simultaneously with or immediately after a start of a writing period without waiting for writing of signals in all pixels. Consequently, a duty ratio can be improved.

Figure 27E:
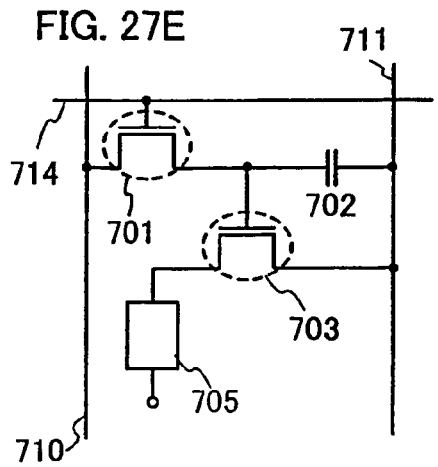
Figure 27F:
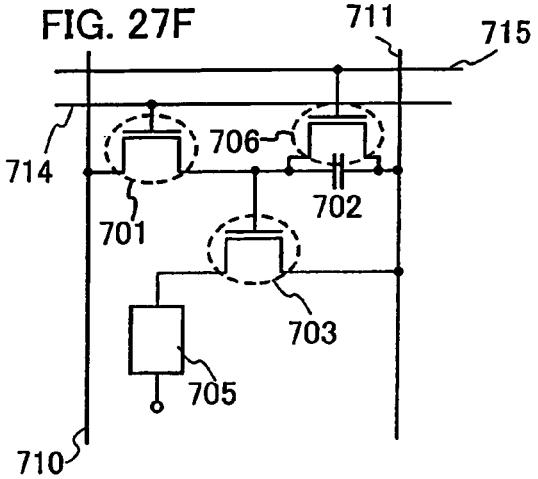

In a pixel shown in FIG. 27E, a signal line 710 and a power supply line 711 are arranged in a column direction, and a scanning line 714 is arranged in a row direction. In addition, the pixel includes a switching TFT 701, a driving TFT 703, a capacitor element 702, and a light emitting element 705. A pixel shown in FIG. 27F has the same structure as the pixel shown in FIG. 27E except that a TFT 706 and a scanning line 715 are added. A duty ratio can be increased by disposing the TFT 706 also in the structure of FIG. 27F.

It is preferable to make a semiconductor film of a driving TFT large specifically in the case of forming a thin film transistor having an amorphous semiconductor film or the like as in the above embodiment modes. Therefore, considering an aperture ratio, the pixel shown in FIG. 27E or 27F, which has a small number of TFTs, is preferably used.

Such an active matrix light emitting device is considered to be advantageous to low voltage driving when a pixel density is increased since each pixel is provided with TFTs. On the other hand, a passive matrix light emitting device in which TFTs are provided for every column can be formed. In the passive matrix light emitting device, TFTs are not provided for each pixel; therefore, a high aperture ratio can be obtained.

As described above, various pixel circuits can be adopted.

Embodiment 6

Figure 9A:
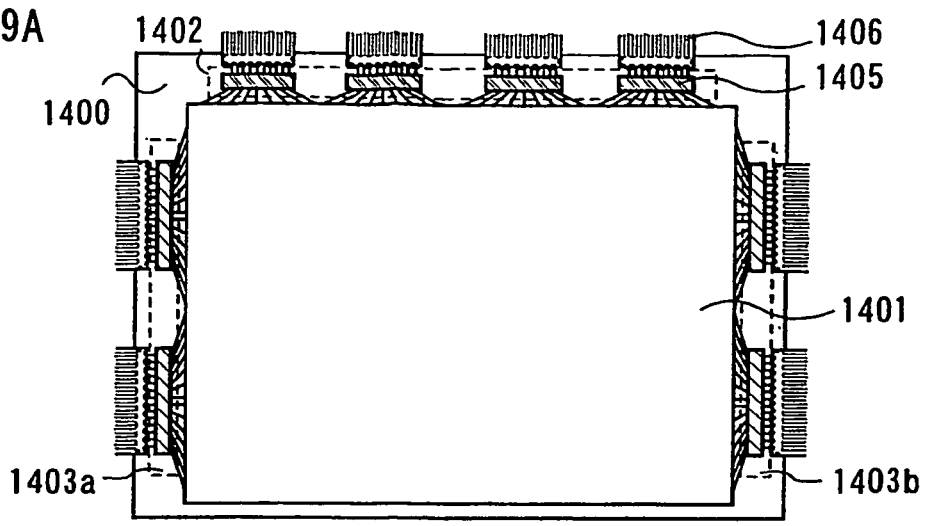
FIGS. 9A to 9C are top views showing a mounting method of a driver circuit of a display device according to the present invention.
Figure 9B:
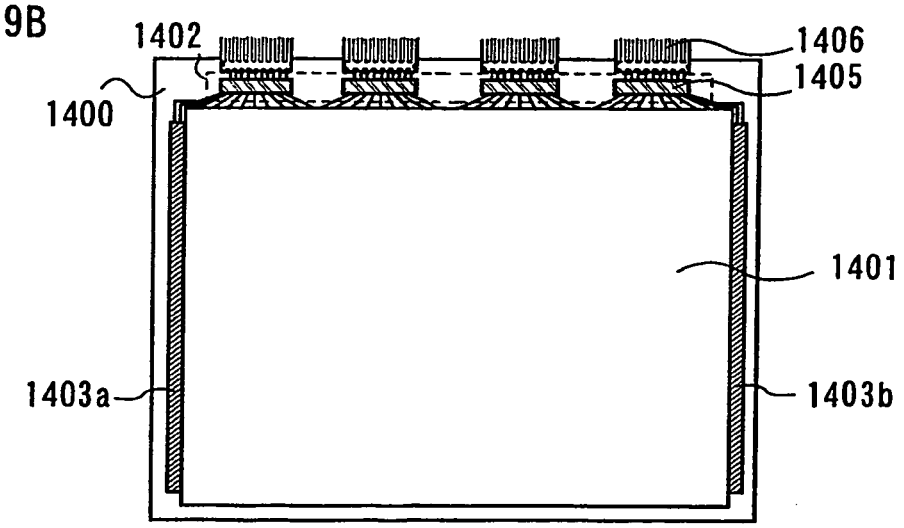
Figure 9C:
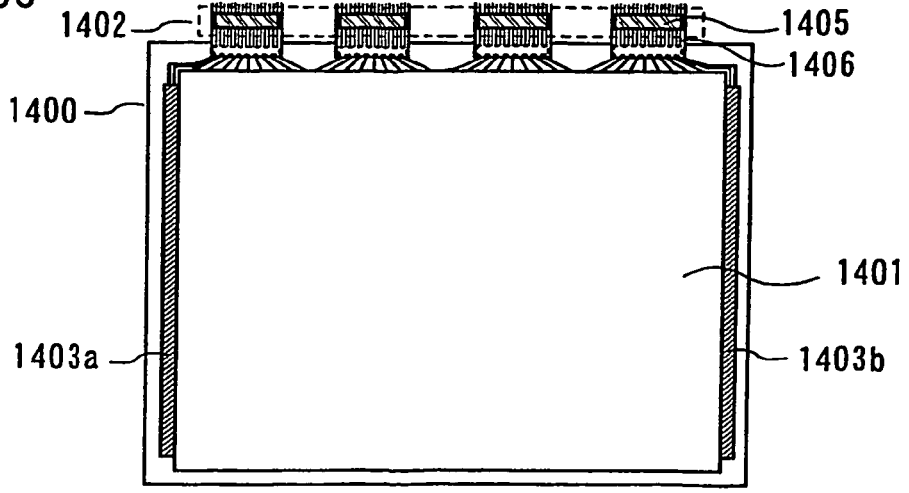

Mounting of driver circuits (a signal line driver circuit 1402 and scanning line driver circuits 1403a and 1403b) on the display panel described in the above embodiment is described in this embodiment with reference to FIGS. 9A to 9C.

As shown in FIG. 9A, the signal line driver circuit 1402 and the scanning line driver circuits 1403a and 1403b are mounted on the periphery of a pixel portion 1401. In FIG. 9A, an IC chip 1405 is mounted on a substrate 1400 by a COG method as the signal line driver circuit 1402, the scanning line driver circuits 1403a and 1403b, and the like. Then, the IC chip is connected to an external circuit through an FPC (flexible printed circuit) 1406.

As shown in FIG. 9B, in the case of forming a TFT with a SAS or a crystalline semiconductor, a pixel portion 1401, scanning line driver circuits 1403a and 1403b, and the like may be integrally formed over a substrate, and a signal line driver circuit 1402 and the like may be separately mounted as an IC chip. In FIG. 9B, an IC chip 1405 is mounted on a substrate 1400 by a COG method as the signal line driver circuit 1402. Then, the IC chip is connected to an external circuit through an FPC 1406.

Further, as shown in FIG. 9C, a signal line driver circuit 1402 and the like may be mounted by a TAB method instead of the COG method. Then, an IC chip is connected to an external circuit through an FPC 1406. In FIG. 9C, the signal line driver circuit is mounted by a TAB method; however, a scanning line driver circuit may be mounted by a TAB method.

When the IC chip is mounted by a TAB method, a pixel portion can be largely provided with respect to a substrate, and a frame can be narrowed.

The IC chip is formed by using a silicon wafer, but an IC formed over a glass substrate (hereinafter referred to as a driver IC) may be provided in place of the IC chip. Since the IC chip is taken out of a circular silicon wafer, there is limitation on the shape of a mother substrate. On the contrary, the driver IC has a glass mother substrate and there is no limitation on the shape. Thus, productivity can be improved. Therefore, the geometry of the driver IC can be freely set. For example, when the driver IC is formed to have a long side of from 15 mm to 80 mm in length, the necessary number of the driver ICs can be reduced compared with the case of mounting the IC chip. Accordingly, the number of connection terminals can be reduced and a yield in manufacturing can be improved.

The driver IC can be formed by using a crystalline semiconductor formed over a substrate, and the crystalline semiconductor may be formed by continuous wave laser light irradiation. A semiconductor film formed by continuous wave laser light irradiation has few crystal defects and has crystal grains with large grain diameters. Accordingly, a transistor having such a semiconductor film has favorable mobility and response speed and high-speed drive can be performed, which is suitable for the driver IC.

Embodiment 7

A method for mounting driver circuits (a signal line driver circuit 1402 and scanning line driver circuits 1403a and 1403b) on the display panel described in the above embodiments is described in this embodiment with reference to FIGS. 10A to 10D. A connection method with the use of an anisotropic conductive material, a wire bonding method, or the like may be employed as the mounting method, and an example thereof is described with reference to FIGS. 10A to 10D. Note that an example of using a driver IC as the signal line driver circuit 1402 and the scanning line driver circuits 1403a and 1403b is described in this embodiment. An IC chip can be appropriately used in place of the driver IC.

Figure 10A:
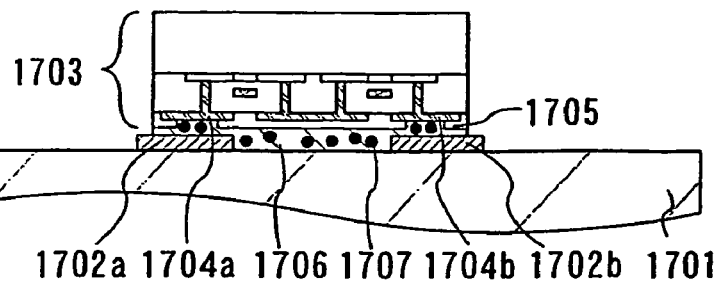
FIGS. 10A to 10D are cross-sectional views showing a mounting method of a driver circuit of a display device according to the present invention.

FIG. 10A shows an example in which a driver IC 1703 is mounted on an active matrix substrate 1701 by using an anisotropic conductive material. Each wiring such as a source wiring or a gate wiring (not shown) and electrode pads 1702a and 1702b of the wiring are formed over the active matrix substrate 1701.

Connection terminals 1704a and 1704b are provided on the surface of the driver IC 1703, and a protective insulating film 1705 is formed in the periphery thereof.

The driver IC 1703 is fixed to the active matrix substrate 1701 with an anisotropic conductive adhesive 1706. The connection terminals 1704a and 1704b and the electrode pads 1702a and 1702b are electrically connected to one another with conductive particles 1707 contained in the anisotropic conductive adhesive. The anisotropic conductive adhesive is an adhesive resin in which the conductive particles (with grain diameters of from 3 μm to 7 μm) are dispersed and contained. An epoxy resin, a phenol resin, and the like can be given as examples of the anisotropic conductive adhesive. The conductive particles (with grain diameters of several μm to several hundred μm) are made from an element of gold, silver, copper, palladium, and platinum, or alloy particles including the plural elements. Alternatively, particles having a multilayer structure of the above-mentioned elements may be used. Further, resin particles coated with one element of gold, silver, copper, palladium, and platinum, or an alloy of the plural elements may also be used.

As a substitute for the anisotropic conductive adhesive, an anisotropic conductive film that is transferred to a base film can be used. The conductive particles that are similar to those in the anisotropic conductive adhesive are dispersed in the anisotropic conductive film. The size and concentration of the conductive particles 1707 mixed in the anisotropic conductive adhesive 1706 are adjusted adequately, so that the driver IC can be mounted on the active matrix substrate in this mode. This mounting method is suitable for methods for mounting the driver ICs in FIGS. 9A and 9B.

Figure 10B:
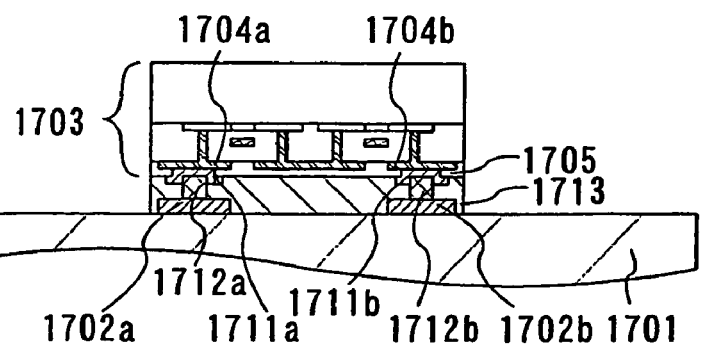

FIG. 10B shows an example of a mounting method that utilizes shrinkage of an organic resin. Buffer layers 1711a and 1711b are formed on the surface of connection terminals 1704a and 1704b of a driver IC by using Ta, Ti, or the like, and Au is formed to be 20 μm in thickness thereover by an electroless plating method or the like so as to be bumps 1712a and 1712b. The driver IC can be mounted by interposing a light curable insulating resin 1713 between the driver IC and the active matrix substrate and by welding electrodes with pressure with the use of the shrinkage of the light curable resin. This mounting method is suitable for methods for mounting the driver ICs in FIGS. 9A and 9B.

Figure 10C:
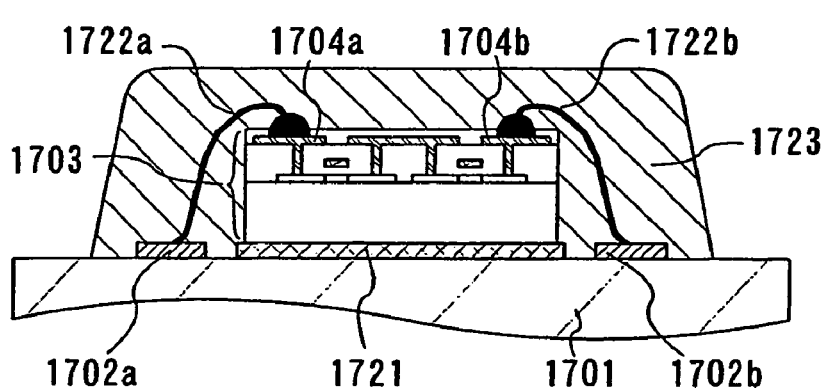

As shown in FIG. 10C, a driver IC 1703 may be fixed to an active matrix substrate 1701 by using an adhesive 1721, and connection terminals 1704a and 1704b of a CPU and electrode pads 1702a and 1702b over the wiring substrate are connected to each other by wirings 1722a and 1722b. Then, sealing is performed with an organic resin 1723. This mounting method is suitable for a method for mounting the driver IC in FIGS. 9A and 9B.

Figure 10D:
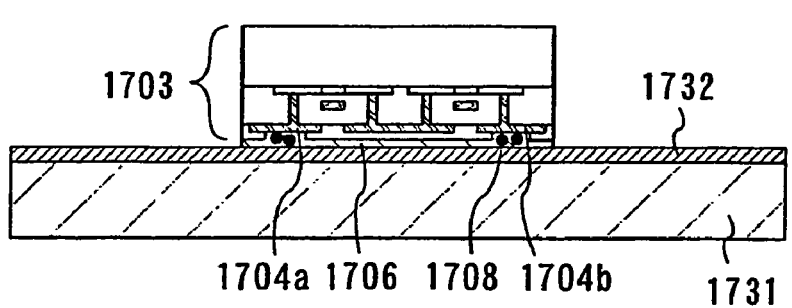

As shown in FIG. 10D, a driver IC 1703 may be provided over an FPC (flexible printed circuit) 1731 with a wiring 1732 and an anisotropic conductive adhesive 1706 containing conductive particles 1708 therebetween. This structure is extremely effective when used for an electronic device that is limited in the size of a chassis such as a portable terminal. This mounting method is suitable for a method for mounting the driver IC in FIG. 9C.

Note that a method for mounting the driver IC is not particularly limited thereto, and a known COG method, wire bonding method, TAB method, or reflow processing with the use of solder bumps can be employed. When reflow processing is performed, it is preferable that a substrate used for a driver IC or an active matrix substrate is made of highly heat-resistant plastic, typically, a polyimide substrate, an HT substrate (manufactured by Nippon Steel Chemical Co., Ltd.), ARTON made of a norbornene resin with a polar group (manufactured by JSR Corporation), or the like.

Embodiment 8

This embodiment describes a driver circuit in the case of forming a scanning line side driving circuit over a substrate 1400 as shown in FIGS. 9B and 9C by forming a semiconductor layer of a SAS in the display panel described in Embodiment 6.

Figure 14:
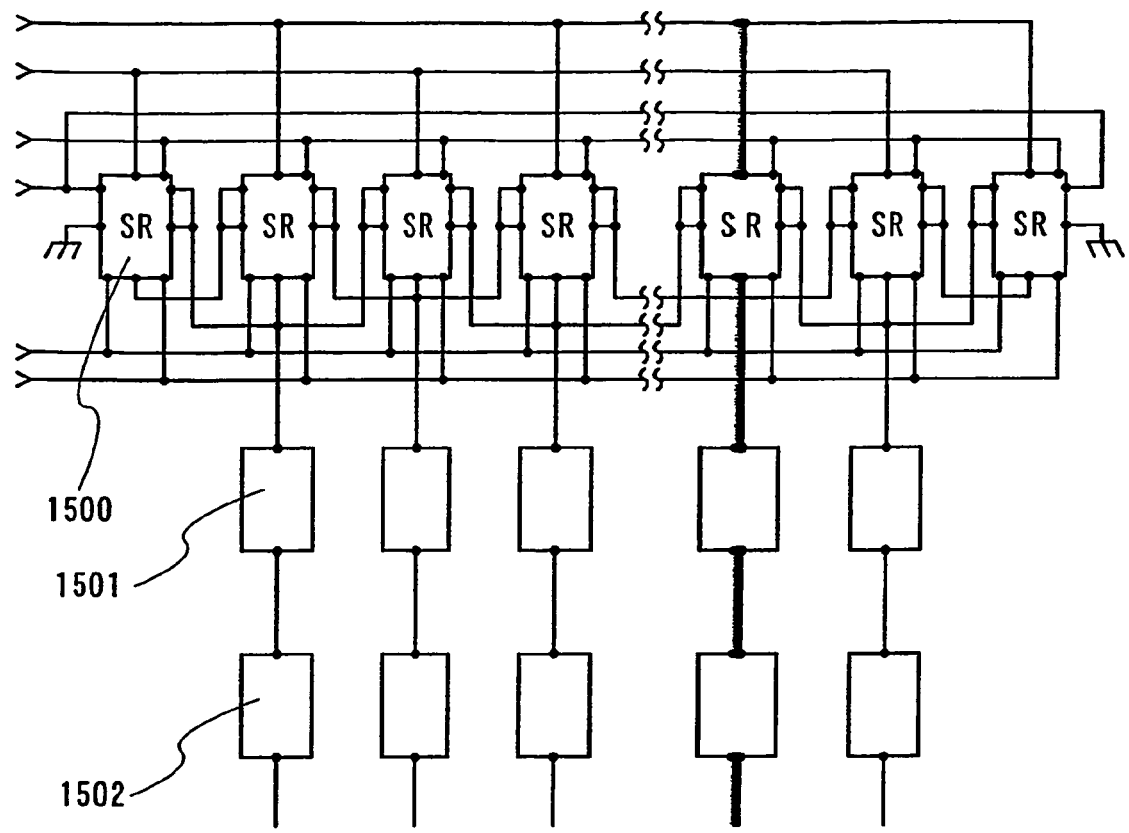
FIG. 14 shows a circuit structure in the case of forming a scanning line side driver circuit with TFTs in a liquid crystal display panel according to the present invention.

FIG. 14 is a block diagram of a scanning line side driver circuit including an n-channel type TFT using a SAS in which field effect mobility of from 1 $cm^2$/V·sec to 15 $cm^2$/V·sec is obtained.

A block denoted by reference numeral 1500 in FIG. 14 corresponds to a pulse output circuit for outputting a sampling pulse for one stage, and a shift register includes n pulse output circuits. A pixel is connected at the end of buffer circuits 1501 and 1502.

Figure 15:
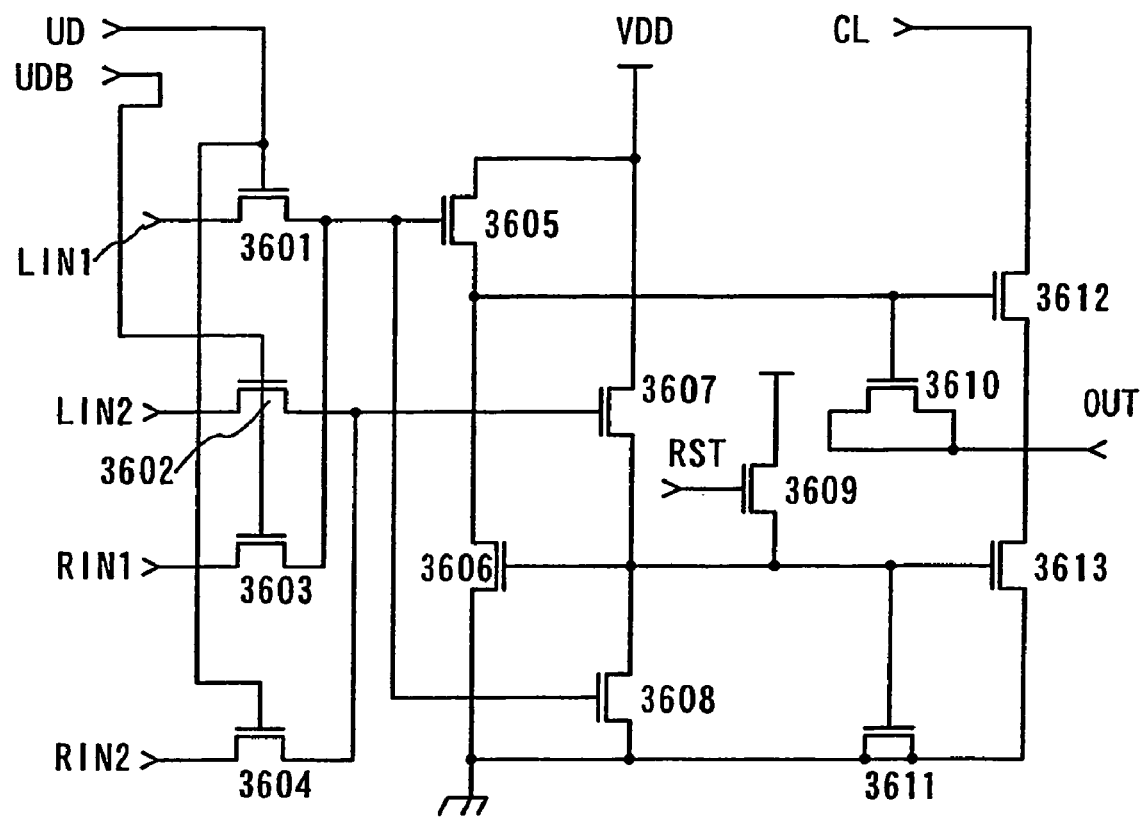
FIG. 15 shows a circuit structure in the case of forming a scanning line side driver circuit with TFTs in a liquid crystal display panel according to the present invention (shift register circuit).

FIG. 15 shows a specific structure of the pulse output circuit 1500, and the circuit includes n-channel type TFTs 3601 to 3613. The size of the TFT may be determined in consideration of operating characteristics of the n-channel type TFTs using a SAS. When a channel length is set to be 8 µm, for example, a channel width can be set in the range of from 10 µm to 80 µm.

Figure 16:
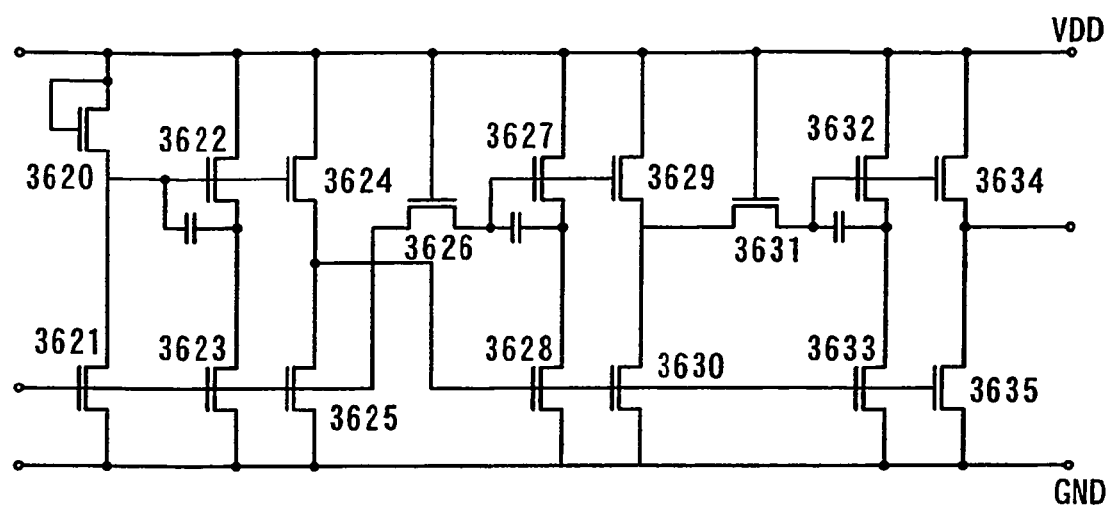
FIG. 16 shows a circuit structure in the case of forming a scanning line side driver circuit with TFTs in a liquid crystal display panel according to the present invention (buffer circuit).

FIG. 16 shows a specific structure of the buffer circuit 1501. The buffer circuit includes n-channel type TFTs 3620 to 3635 in the same manner. The size of the TFT may be determined in consideration of operating characteristics of the n-channel type TFTs using a SAS. When a channel length is set to be 10 µm, for example, a channel width can be set in the range of from 10 µm to 1800 µm.

Embodiment 9

Figure 23:
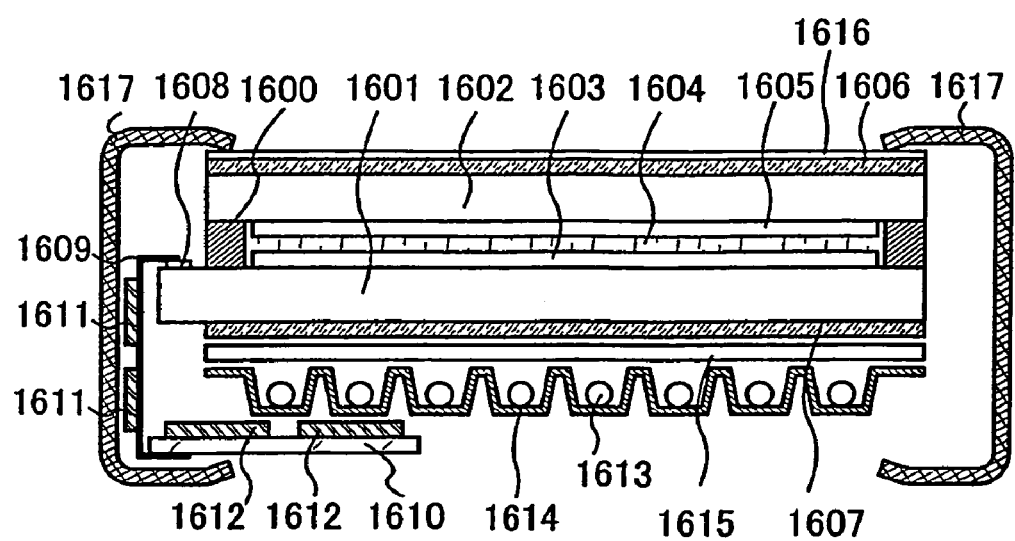
FIG. 23 shows a structure of a liquid crystal display module according to the present invention.

A display module is described in this embodiment. Here, a liquid crystal module is described with reference to FIG. 23 as an example of a display module.

An active matrix substrate 1601 and an opposing substrate 1602 are fixed to each other with a sealant 1600, and a pixel portion 1603 and a liquid crystal layer 1604 are provided therebetween to form a display region.

A colored layer 1605 is required to perform color display. In the case of RGB system, a colored layer corresponding to each color of red, green, and blue is provided corresponding to each pixel. Polarizing plates 1606 and 1607 are provided outside the active matrix substrate 1601 and the opposing substrate 1602. In addition, a protective film 1616 is formed on the surface of the polarizing plate 1606, which relieves impact from outside.

A connection terminal 1608 provided for the active matrix substrate 1601 is connected with a wiring substrate 1610 through an FPC 1609. The FPC or a connection wiring is provided with a pixel driver circuit (an IC chip, a driver IC, or the like) 1611, and an external circuit 1612 such as a control circuit or a power supply circuit is incorporated in the wiring substrate 1610.

A cold cathode fluorescent tube 1613, a reflecting plate 1614, and an optical film 1615 are a backlight unit and serve as a light source to project light on a liquid crystal display panel. The liquid crystal panel, the light source, the wiring substrate, the FPC, and the like are held and protected by a bezel 1617.

Note that any of Embodiment Modes 1 to 7 can be applied to this embodiment. A liquid crystal display module is described as a display module in this embodiment; however, the invention is not limited thereto. The invention can be appropriately applied to a display module such as a DMD (Digital Micromirror Device), a PDP (Plasma Display Panel), a FED (Field Emission Display), an electrophoretic display device (electronic paper), and the like.

Embodiment 10

A display module is described in this embodiment. Here, a cross sectional view of a light emitting display module as an example of a display module is shown in FIGS. 35A to 35C.

Figure 35A:
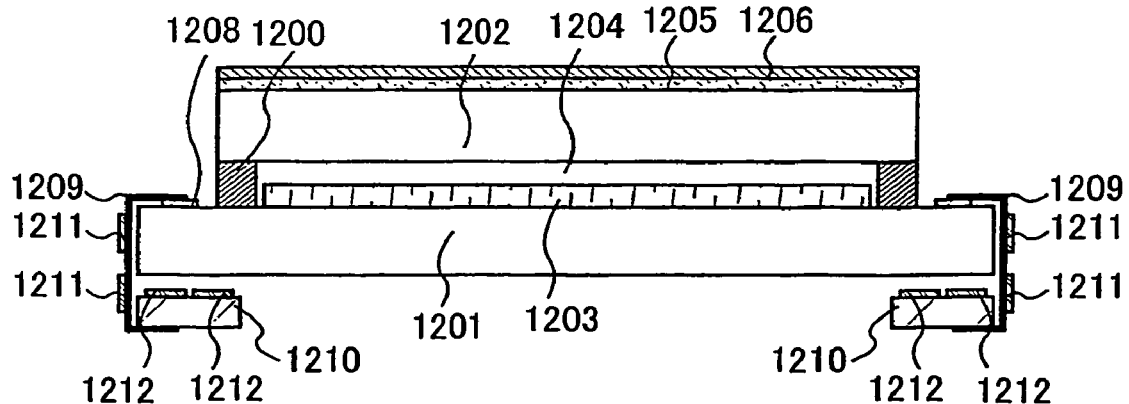
FIGS. 35A to 35C show a structure of a light emitting display module according to the present invention.
Figure 35B:
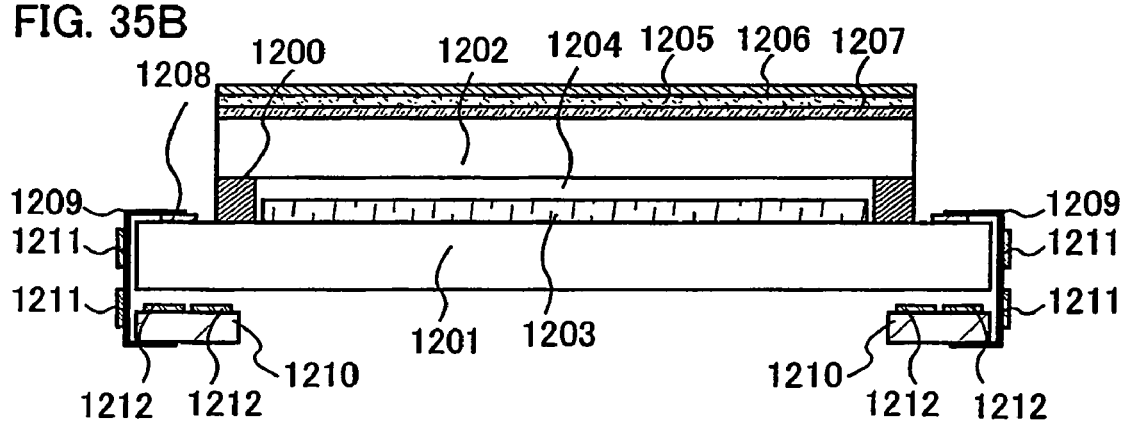
Figure 35C:
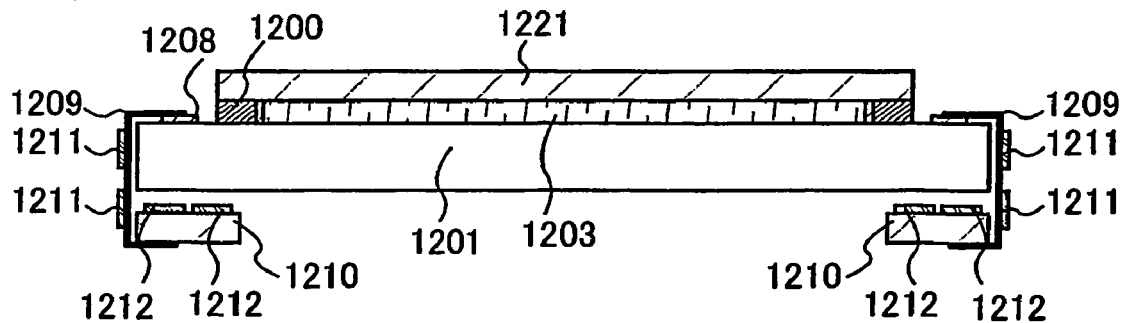

FIG. 35A shows a cross section of a light emitting display module in which an active matrix substrate 1201 and a sealing substrate 1202 are fixed to each other with a sealant 1200. A pixel portion 1203 is provided therebetween to form a display region.

A space 1204 is formed between the sealing substrate 1202 and the pixel portion 1203. The entry of moisture or oxygen can be further prevented by filling the space with an inert gas, for example, a nitrogen gas or forming a light-transmitting resin having a highly water absorbing material in the space. In addition, a light-transmitting and highly water absorbing resin may be formed. Even when light from a light emitting element is emitted to a second substrate side, a light emitting display module can be formed without decreasing transmittance owing to a light-transmitting resin.

In addition, at least a pixel portion of a module is preferably provided with a polarizing plate or a circularly polarizing plate (a polarizing plate, a quarter-wave plate, and a half-wave plate) to enhance contrast. When display is recognized from a sealing substrate 1202 side, a quarter-wave plate and a half-wave plate 1205, and a polarizing plate 1206 may be sequentially provided over the sealing substrate 1202. Further, an anti-reflective film may be provided over the polarizing plate.

When display is recognized from both sides of the sealing substrate 1202 and the active matrix substrate 1201, the surface of the active matrix substrate is preferably provided with a quarter-wave plate and a half-wave plate, and a polarizing plate in the same manner.

A connection terminal 1208 provided for the active matrix substrate 1201 is connected with a wiring substrate 1210 through an FPC 1209. The FPC or a connection wiring is provided with a driver circuit 1211 (an IC chip, a driver IC, or the like), and an external circuit 1212 such as a control circuit or a power supply circuit is incorporated in the wiring substrate 1210.

As shown in FIG. 35B, a colored layer 1207 can be provided between a pixel portion 1203 and a polarizing plate or a pixel portion and a circularly polarizing plate. In this case, full color display can be performed by providing the pixel portion with a light emitting element which can emit white light and by separately providing with colored layers showing RGB. In addition, full color display can be performed by providing the pixel portion with a light emitting element which can emit blue light and by separately providing a color conversion layer or the like. In addition, each pixel portion can be provided with light emitting elements which emit red, green, and blue light, and the colored layer 1207 can be used. Such a display module has high color purity of each RBG and can perform high-definition display.

FIG. 35C shows the case of sealing an active matrix substrate and a light emitting element with the use of a protective film 1221 of a film, a resin, or the like without using an opposing substrate, different from FIG. 35A. The protective film 1221 is provided to cover a pixel electrode in a pixel portion 1203. As the protective film, an organic material such as an epoxy resin, a urethane resin, or a silicone resin can be used. In addition, the protective film may be formed by dropping a polymer material with a droplet discharge method. In this embodiment, an epoxy resin is discharged using a dispenser and is dried. Further, an opposing substrate may be provided over the protective film. The rest of the structure is similar to that of FIG. 35A.

A display device can be reduced in weight, size, and thickness by sealing without using an opposing substrate as described above.

In the module of this embodiment, the wiring substrate 1210 is mounted with the use of the FPC 1209; however, the present invention is not necessarily limited to the structure. The pixel driver circuit 1211 and the external circuit 1212 may be directly mounted on the substrate by using a COG (Chip on Glass) method.

Note that any of Embodiment Modes 1 to 7 can be applied to this embodiment. A light emitting display module is described as a display module in this embodiment; however, the invention is not limited thereto. The invention can be appropriately applied to a display module such as a DMD (Digital Micromirror Device), a PDP (Plasma Display Panel), a FED (Field Emission Display), an electrophoretic display device (electronic paper), and the like.

Embodiment 11

Figure 28A:
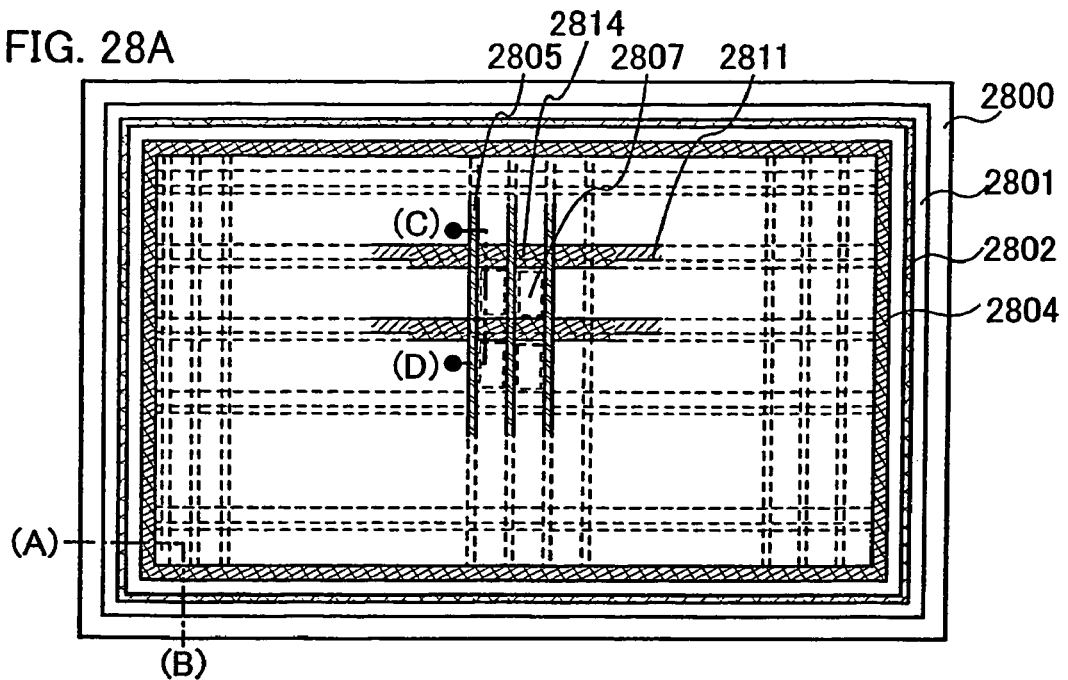
FIGS. 28A to 28C are a top view and cross-sectional views showing a structure of a light emitting display panel of the present invention.
Figure 28B:
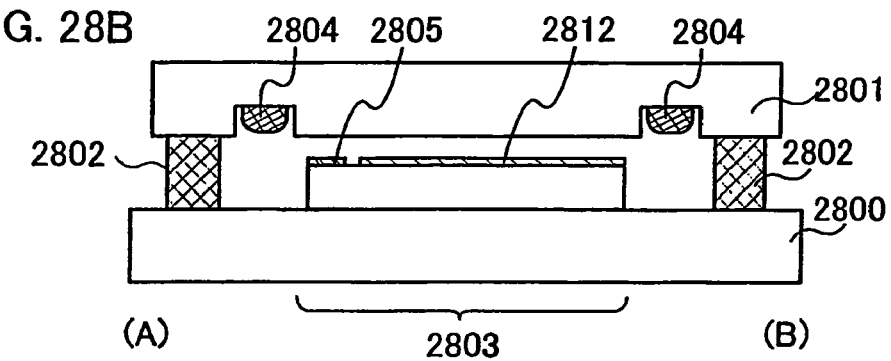
Figure 28C:
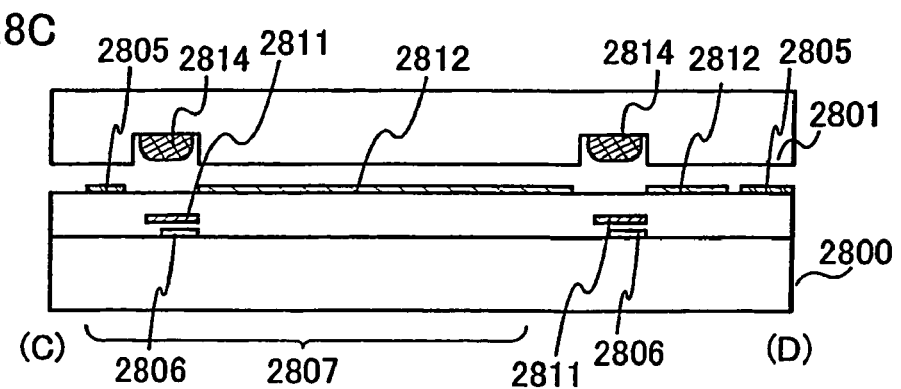

A drying agent of the display panel described in the above embodiment is described in this embodiment with reference to FIGS. 28A to 28C.

FIG. 28A is a surface view of a display panel, and FIG. 28B is a cross-sectional view taken along a line A-B in FIG. 28A and FIG. 28C is a cross-sectional view taken along a line C-D in FIG. 28A.

As shown in FIG. 28A, an active matrix substrate 2800 and an opposing substrate 2801 are sealed with a sealant 2802. A pixel region is provided between the active matrix substrate and the opposing substrate. The pixel region is provided with a pixel 2807 in a region at the intersection of a source wiring 2805 and a gate wiring 2806. A drying agent 2804 is provided between the pixel region and the sealant 2802. In the pixel region, a drying agent 2814 is provided over the gate wiring or the source wiring. Here, the drying agent 2814 is provided over the gate wiring, but it can be provided over the gate wiring and the source wiring.

It is preferable to use a substance that adsorbs water ($H_2O$) by chemical adsorption like oxide of alkaline earth metal such as calcium oxide (CaO) or barium oxide (BaO) as the drying agents 2804 and 2814. However, not limiting thereto, a substance that adsorbs water by physical adsorption such as zeolite or silica gel can also be used.

The drying agent can be fixed to the substrate with a granular drying agent contained in a highly moisture permeable resin. As the highly moisture permeable resin, the following can be given: an acrylic resin such as ester acrylate, ether acrylate, ester urethane acrylate, ether urethane acrylate, butadiene urethane acrylate, special urethane acrylate, epoxy acrylate, amino resin acrylate, or acrylic resin acrylate. In addition, an epoxy resin such as a bisphenol A type liquid resin, a bisphenol A type solid resin, a resin containing bromo-epoxy, a bisphenol F type resin, a bisphenol AD type resin, a phenol type resin, a cresol type resin, a novolac type resin, a cyclic aliphatic epoxy resin, an epibis type epoxy resin, a glycidyl ester resin, a glycidyl amine resin, a heterocyclic epoxy resin, or a modified epoxy resin can be used. In addition, other substances may be used. For example, an inorganic substance such as siloxane, or the like may be used.

Further, a solidified composition in which a molecule that can absorb water by chemical absorption is mixed in an organic solvent, or the like can be used as a water absorbing substance.

Note that a more highly moisture permeable substance than a substance used as the sealant is preferably selected as the highly moisture permeable resin or the inorganic substance.

In the light emitting device according to the invention as described above, external water mixed in the light emitting device can be absorbed before the water reaches a region provided with a light emitting element. Accordingly, the deterioration of an element provided for the pixel, for example, a light emitting element due to water can be suppressed.

As shown in FIG. 28B, the drying agent 2804 is provided between the sealant 2802 and the pixel region 2803 in the periphery of the display panel. In addition, the display panel can be thinned by providing the opposing substrate or the active matrix substrate with a depression and providing the depression with the drying agent 2804.

As shown in FIG. 28C, a semiconductor region 2811 that is a part of a semiconductor element for driving a display element, a gate wiring 2806, a source wiring 2805, and a pixel electrode 2812 are formed in the pixel 2807. In the pixel portion of a display panel, the drying agent 2814 is provided for a region of the opposing substrate overlapped with the gate wiring 2806. The gate wiring is two to four times as wide as the source wiring. Therefore, an aperture ratio is not decreased by providing the drying agent 2814 over the gate wiring 2806 that is a non display region, and entry of moisture into the display element and the deterioration caused thereby can be suppressed. In addition, a display panel can be thinned by providing the opposing substrate with a depression and providing the depression with the drying agent.

Embodiment 12

According to the invention, it is possible to form a semiconductor device having a circuit in which semiconductor elements with a minute structure are highly integrated, typically, a signal line driver circuit, a controller, a CPU, a converter of an audio processing circuit, a power supply circuit, a transmit and receive circuit, a memory, or an amplifier of an audio processing circuit. Further, a system-on-chip can be manufactured, in which circuits such as an MPU (microcomputer), a memory, and an I/O interface constituting a system (function circuit) are mounted on one chip in monolithic, and which can realize high speed, high reliability, and low power consumption.

Embodiment 13

Various electronic devices can be manufactured by incorporating the semiconductor device described in Embodiment 9 or 10 in a chassis. Examples of electronic devices can be given as follows: a television set, a camera such as a video camera or a digital camera, a goggle type display (head mounted display), a navigation system, an audio reproducing device (a car audio, an audio component, or the like), a notebook personal computer, a game machine, a personal digital assistant (a mobile computer, a cellular phone, a portable game machine, an electronic book, or the like), an image reproducing device including a recording medium (specifically, a device capable of processing data in a recording medium such as a Digital Versatile Disc (DVD) and having a display that can display the image of the data), and the like. Here, a television set and a block diagram thereof are shown in FIG. 12 and FIG. 11, respectively and a digital camera is shown in FIG. 13 as typical examples of the electronic devices.

Figure 11:
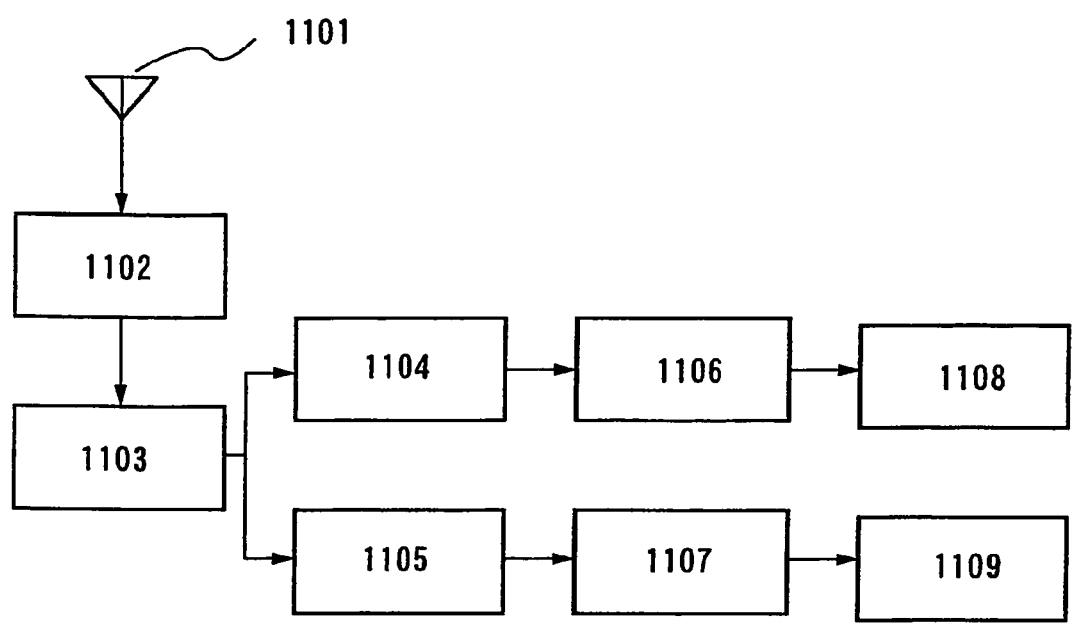
FIG. 11 is a block diagram showing a structure of an electronic device.
Figure 12:
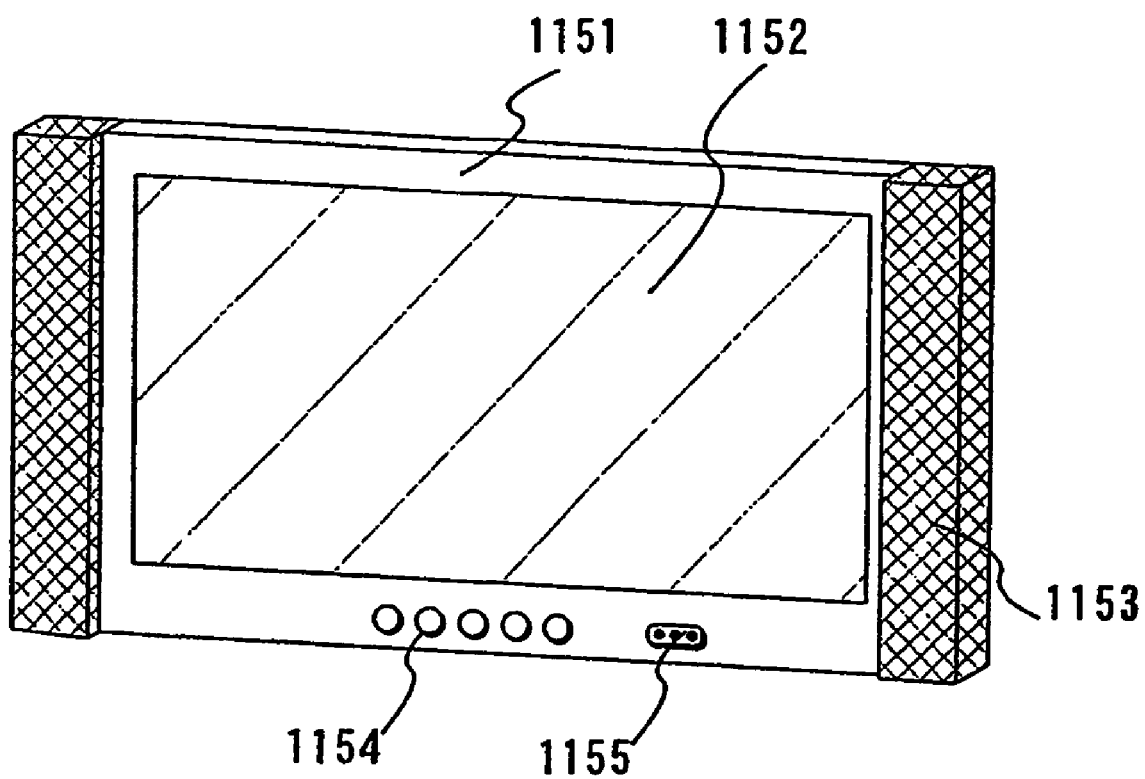
FIG. 12 shows an example of an electronic device.

FIG. 11 is a block diagram showing a general structure of a television set that receives analog television broadcasting. In FIG. 11, the airwaves for television broadcasting received by an antenna 1101 are inputted to a tuner 1102. The tuner 1102 generates and outputs intermediate frequency (IF) signals by mixing the high frequency television signals inputted from the antenna 1101 with locally-oscillating frequency signals that are controlled in accordance with the desired reception frequency.

The IF signals taken out by the tuner 1102 are amplified to the required voltage by an intermediate frequency amplifier (IF amplifier) 1103. Thereafter, the amplified IF signals are detected by a image detection circuit 1104 and an audio detection circuit 1105. The image signals outputted from the image detection circuit 1104 are separated into luminance signals and chrominance signals by an image processing circuit 1106. Further, the luminance signals and the chrominance signals are subjected to the predetermined image signal processing to be image signals, so that the image signals are outputted to an image output portion 1108 of a display device that is a semiconductor device of the invention, typically, a liquid crystal display device, a light emitting device, a DMD (digital micromirror device), a PDP (plasma display panel), an FED (field emission display), an electrophoretic display device (an electronic paper), or the like.

The signals outputted from the audio detection circuit 1105 are subjected to processing such as FM demodulation in an audio processing circuit 1107 to be audio signals. The audio signals are then amplified appropriately to be outputted to an audio output portion 1109 of a speaker or the like.

The television set according to the invention may be applicable to digital broadcastings such as terrestrial digital broadcasting, cable digital broadcasting, and BS digital broadcasting as well as analog broadcastings such as terrestrial broadcasting in a VHF band, a UHF band, or the like, cable broadcasting, and BS broadcasting.

FIG. 12 is a front perspective view of the television set, which includes a chassis 1151, a display portion 1152, a speaker portion 1153, an operational portion 1154, a video input terminal 1155, and the like. The television set shown in FIG. 12 has the structure as shown in FIG. 11.

The display portion 1152 is an example of the image output portion 1108 in FIG. 11, which displays images.

The speaker portion 1153 is an example of the audio output portion in FIG. 11, which outputs sound.

The operational portion 1154 is provided with a power source switch, a volume switch, a channel select switch, a tuning switch, a selection switch, and the like to turn on and off the television set, select images, control sound, select a tuner, and the like, respectively by holding the switches down. Note that the above-described selections can be carried out also by a remote-control operation unit, though not shown in the drawing.

The video input terminal 1155 inputs image signals into the television set from an external portion such as a VTR, a DVD, or a game machine.

In the case of a wall-mounted television set, a portion for hanging on walls is provided on the rear of the body thereof.

A television set can be manufactured at low cost with high throughput and yield by applying the display device that is an example of a semiconductor device according to the invention to the display portion of the television set. In addition, a television set can be manufactured at low cost with high throughput and yield by applying a semiconductor device according to the invention to a CPU for controlling an image detection circuit, an image processing circuit, an audio detection circuit, and an audio processing circuit of a television set. Consequently, such a television is widely applicable particularly to large area display mediums such as wall-mounted television set, information display boards used in railway stations, airports, and the like, and advertisement display boards on the streets.

Figure 13A:
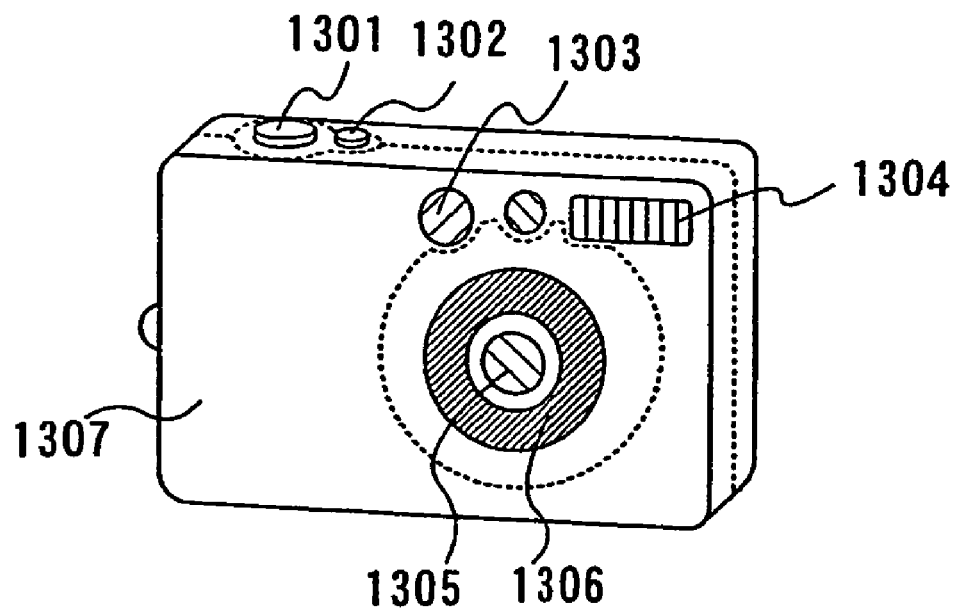
FIGS. 13A and 13B show an example of an electronic device.
Figure 13B:
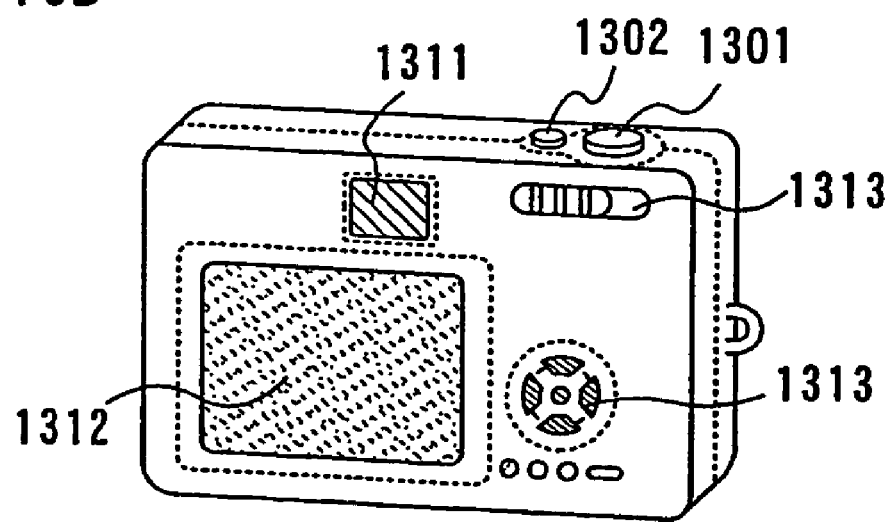

FIGS. 13A and 13B show an example of a digital camera FIG. 13A is a front perspective view of the digital camera, and FIG. 13B is a rear perspective view thereof. In FIG. 13A, a digital camera is provided with a release button 1301, a main switch 1302, a viewfinder window 1303, flash 1304, a lens 1305, a lens barrel 1306, and a chassis 1307.

In FIG. 13B, the digital camera is provided with a viewfinder eyepiece 1311, a monitor 1312, and an operational button 1313.

When the release button 1301 is held halfway down, a focus adjustment mechanism and an exposure adjustment mechanism are operated. Subsequently, holding the release button all the way down releases a shutter.

The digital camera is turned on or off by pressing or rotating the main switch 1302.

The viewfinder window 1303 is disposed above the lens 1305 on the front face of the digital camera, and is used to check a shooting range and a focusing point through the viewfinder eyepiece shown in FIG. 13B.

The flash 1304 is disposed at the upper portion of the front face of the digital camera body. In the case of photographing a subject of the low luminance level, auxiliary light is emitted simultaneously when the release button is held down and the shutter is released.

The lens 1305 is disposed on the front of the digital camera. The lens is made of a focusing lens, a zoom lens, and the like. An optical shooting system includes the lens along with a shutter and an aperture, which are not shown in the drawing. An image sensing device such as a CCD (charge coupled device) is provided at the rear of the lens.

The lens barrel 1306 is used for shifting the lens position to focus the focusing lens, the zoom lens, and the like on a subject. When taking a picture, the lens barrel is protruded from the body so that the lens 1305 is shifted toward a subject. When carrying the digital camera, the lens 1305 is stored inside the main body to be reduced in size. Note that, although the lens can be zoomed in to enlarge a subject by shifting the lens barrel in this embodiment, the invention is not limited to the structure. The invention is applicable to a digital camera that can take close-up pictures without zooming a lens due to a structure of an optical shooting system inside the chassis 1307.

The viewfinder eyepiece 1311 is provided at the upper portion of the rear of the digital camera, through which the shooting range and the focusing point are checked by sight.

The operational button 1313 is a button for various kinds of functions and is provided on the rear of the digital camera. The operational button includes a setup button, a menu button, a display button, a functional button, a selection button, and the like.

A digital camera can be manufactured at low cost with high throughput and yield by applying the display device that is one embodiment of a semiconductor device according to the invention to a monitor of the digital camera A digital camera can be manufactured at low cost with high throughput and yield by applying a CPU that is an example of the semiconductor device according to the invention to a CPU for processing in response to input operation of various functional buttons, a main switch, a release button, and the like, a CPU for controlling various circuits such as a circuit for autofocusing and autofocusing adjustment, a timing control circuit for controlling electric flash drive and CCD drive, an imaging circuit for generating an image signal from a signal that is photoelectrically converted by an imaging device such as a CCD, an A/D converter circuit for converting an image signal generated in an imaging circuit into a digital signal, and a memory interface for writing and reading image data in a memory, and the like.

EXPLANATION OF REFERENCE

11: Pixel electrode, 16: EL layer, 17: Pixel electrode, 31: Electrode layer, 32: Electrode layer, 33: Electrode layer, 34: Electrode layer, 35: Electrode layer, 41: Hole transport layer, 42: Light emitting layer, 43: Electron injection layer, 100: Substrate, 101: Substrate, 102: Conductive layer, 103: Photosensitive resin, 104: Laser beam, 105: Mask pattern, 106: Conductive layer, 107: Conductive layer, 110: Pixel, 301: Substrate, 302: Conductive layer, 304: Semiconductor film, 311: Mask pattern, 321: Gate electrode, 322: Insulating film, 323: Semiconductor film, 324: Semiconductor film, 331: Photosensitive resin, 332: Laser beam, 341: Mask pattern, 351: Semiconductor region, 353: Semiconductor region, 354: Drain electrode, 401: Protective film, 411: Mask pattern, 413: Drain region, 415: Semiconductor region (Channel formation region), 501: Photosensitive resin, 511: Mask pattern, 513: Drain electrode, 521: Mask pattern, 523: Semiconductor region, 531: Mask pattern, 532: Semiconductor region, 541: Insulating film, 542: Gate electrode, 543: Photosensitive resin, 544: Laser beam, 551: Mask pattern, 552: Gate insulating film, 561: Conductive layer, 570: Insulating film, 571: Mask pattern, 573: Mask pattern, 581: Gate insulating film, 583: Semiconductor film, 584: Photosensitive resin, 585: Mask pattern, 586: Semiconductor region, 587: Gate insulating film, 588: Conductive layer, 589: Photosensitive resin, 590: laser beam, 591: Mask pattern, 592: Gate electrode, 593: Drain region, 595: Channel formation region, 596: Insulating film (Interlayer insulating film), 597: Conductive film, 600: Substrate, 601: Insulating film, 602: Conductive layer, 604: Photosensitive resin, 606: Laser light, 610: Capacitor electrode layer, 611: Gate electrode layer, 612: Gate electrode layer, 613: Gate wiring layer, 614: Connection conductive layer, 615: Gate insulating film, 616: Semiconductor film, 617: Semiconductor film, 618: Photosensitive resin, 620: Laser light, 631: Mask pattern, 632: Channel etch type TFT, 635: Semiconductor region, 641: Mask pattern, 643: Semiconductor region, 651: Photosensitive resin, 652: Laser light, 661: Source electrode layer, 662: Drain electrode layer, 664: Drain electrode layer, 665: Source wiring layer, 666: Power supply line layer, 667: Pixel electrode, 668: TFT, 669: TFT, 671: Protective layer, 672: Insulating layer, 673: Light emitting layer, 674: Pixel electrode, 675: Sealing substrate, 676: Sealant, 677: Light emitting element, 681: Anisotropic conductive layer, 682: Connection terminal, 701: TFT, 702: Capacitor element, 703: TFT, 704: TFT, 705: Light emitting element, 706: TFT, 710: Signal line, 711: Power supply line, 712: Power supply line, 714: Scanning line, 715: Scanning line, 716: Scanning line, 801: Insulating film, 802: Conductive layer, 803: Photosensitive resin, 804: Laser light, 811: Gate wiring layer, 812: Gate wiring layer, 813: Capacitor wiring layer, 814: Gate insulating film, 815: Semiconductor film, 816: Semiconductor film, 817: Photosensitive resin, 818: Laser light, 821: Mask pattern, 823: Semiconductor region, 831: Mask pattern, 832: Semiconductor region, 840: Source wiring layer, 841: Source electrode layer, 842: Drain electrode layer, 843: Pixel electrode, 851: Orientation film, 860: Sealant, 861: Orientation film, 862: Pixel electrode (Opposite electrode), 863: Opposing substrate, 864: Liquid crystal layer, 871: Anisotropic conductive layer, 872: connection terminal 1001: Laser beam drawing apparatus, 1002: PC, 1003: Laser oscillator, 1004: Power source, 1005: Optical system (ND filter), 1006: Acousto-optic modulator (AOM), 1007: Optical system, 1008: Substrate, 1009: Substrate movement mechanism, 1010: D/A converter, 1011: Driver, 1012: Driver, 1101: Antenna, 1102: Tuner, 1103: Intermediate frequency amplifier (IF amplifier), 1104: Image detection circuit, 1105: Audio detection circuit, 1106: Image processing circuit, 1107: Audio processing circuit, 1108: Image output portion, 1109: Audio output portion, 1151: Chassis, 1152: Display portion, 1153: Speaker portion, 1154: Operational portion, 1155: Video input terminal, 1200: Sealant, 1201: Active matrix substrate, 1202: Sealing substrate, 1203: Pixel portion, 1204: Space, 1205: λ plate, 1206: Polarizing plate, 1207: Colored layer, 1208: Connection terminal, 1209: FPC, 1210: Wiring substrate, 1211: Driver circuit, 1212: External circuit, 1221: Protective film, 1301: Release button, 1302: Main switch, 1303: Viewfinder window, 1304: Flash, 1305: Lens, 1306: Lens barrel, 1307: Chassis, 1311: Viewfinder eyepiece, 1312: Monitor, 1313; Operational button, 1400: Substrate, 1401: Pixel portion, 1402: Signal line driver circuit, 1403: Scanning line driver circuit, 1405: IC chip, 1406: FPC, 1500: Pulse output circuit, 1501: Buffer circuit, 1502: Buffer circuit, 1600: Sealant, 1601: Active matrix substrate, 1602: Opposing substrate, 1603: Pixel portion, 1604: Liquid crystal layer, 1605: Colored layer, 1606: Polarizing plate, 1608: Connection terminal, 1609: FPC, 1610: Wiring substrate, 1611: Driver IC, 1612: External circuit, 1613: Cold cathode fluorescent tube, 1614: Reflecting plate, 1615: Optical film, 1616: Protective film, 1617: bezel, 1701: Active matrix substrate, 1702: Electrode pad, 1703: Driver IC, 1704: Connection terminal, 1705: Protective insulating film, 1706: Anisotropic conductive adhesive, 1707: Conductive particle, 1708: Conductive particle, 1711: Buffer layer, 1712: Bump, 1713: light curable insulating resin, 1721: Adhesive, 1722: Wiring, 1723: Organic resin, 1731: FPC, 1732: Wiring, 1800: Substrate, 1803: Head, 1804: Imaging means, 1805: Droplet discharge means, 1807: Control means, 1808: Storage medium, 1809: Image processing means, 1810: Computer, 1811: Marker, 1830: Region, 1831: Stage, 1900: Region, 1901: Region, 2700: Substrate, 2701: Dispenser, 2702: Sealant, 2703: Pixel portion, 2704: Liquid crystal material, 2800: Active matrix substrate, 2801: Opposing substrate, 2802: Sealant, 2803: Pixel region, 2804: Drying agent, 2805: Source wiring, 2806: Gate wiring, 2807: Pixel, 2811: Semiconductor region, 2812 Pixel electrode, 2814: Drying agent, 3601: TFT, 3602: TFT, 3603: TFT, 3604: TFT, 3605: TFT, 3606: TFT, 3607: TFT, 3608: TFT, 3609: TFT, 3610: TFT, 3611: TFT, 3612: TFT, 3613: TFT, 3620: TFT, 3621: TFT, 3622: TFT, 3623: TFT, 3624: TFT, 3625: TFT, 3626: TFT, 3627: TFT; 3628: TFT, 3629: TFT, 3630: TFT, 3631: TFT, 3632: TFT, 3633: TFT, 3634: TFT and 3635: TFT.

The invention claimed is:

1. A method for manufacturing a semiconductor device, comprising the steps of:
    forming a first film pattern by discharging a conductive material with a droplet discharge method;
    forming a first photosensitive material over the first film pattern;
    forming a first mask pattern by irradiating a region where the first film pattern and the first photosensitive material are overlapped with a laser beam and by developing;
    forming a source electrode and a drain electrode having a desired shape by etching the first film pattern using the first mask pattern as a mask;
    forming a semiconductor film over the source electrode and the drain electrode;
    forming a second photosensitive material over the semiconductor film;
    forming a second mask pattern by irradiating the second photosensitive material with a laser beam and by developing;
    forming a semiconductor region having a desired shape by etching the semiconductor film using the second mask pattern as a mask; and
    forming an insulating film and a gate electrode over the semiconductor region.

2. A method for manufacturing a semiconductor device, according to claim 1, wherein the first photosensitive material and the second photosensitive material are negative photosensitive resins.

3. A method for manufacturing a semiconductor device, according to claim 1, wherein the first photosensitive material and the second photosensitive material are positive photosensitive resins.

4. A method for manufacturing a semiconductor device, according to claim 1, wherein one of the first photosensitive material and the second photosensitive material is a negative photosensitive resin and the other is a positive photosensitive resin.

5. A method for manufacturing a television set, comprising the steps of:
    forming a first film pattern by discharging a conductive material with a droplet discharge method;
    forming a first photosensitive material over the first film pattern;
    forming a first mask pattern by irradiating a region where the first film pattern and the first photosensitive material are overlapped with a laser beam and by developing;
    forming a source electrode and a drain electrode having a desired shape by etching the first film pattern using the first mask pattern as a mask;
    forming a semiconductor film over the source electrode and the drain electrode;
    forming a second photosensitive material over the semiconductor film;
    forming a second mask pattern by irradiating the second photosensitive material with a laser beam and by developing;
    forming a semiconductor region having a desired shape by etching the semiconductor film using the second mask pattern as a mask;
    forming an insulating film and a gate electrode over the semiconductor region; and
    forming a pixel electrode to be connected to the drain electrode.

6. A method for manufacturing a television set, according to claim 5, wherein the first photosensitive material and the second photosensitive material are negative photosensitive resins.

7. A method for manufacturing a television set, according to claim 5, wherein the first photosensitive material and the second photosensitive material are positive photosensitive resins.

8. A method for manufacturing a television set, according to claim 5, wherein one of the first photosensitive material and the second photosensitive material is a negative photosensitive resin and the other is a positive photosensitive resin.

9. A method for manufacturing a semiconductor device, according to claim 5, wherein the laser beam has any wavelength of from ultraviolet light to infrared light.

10. A method for manufacturing a television set, according to claim 5, wherein the television set is a liquid crystal television or an EL television.

11. A method for manufacturing a semiconductor device, comprising the steps of:
    forming a first film pattern over a substrate by a droplet discharge method;
    forming a photosensitive material over the first film pattern;
    forming a mask pattern by irradiating a region where the first film pattern and the photosensitive material are overlapped with a laser beam while changing a relative position between the substrate and the laser beam and by developing; and
    forming a second film pattern having a desired shape by etching the first film pattern using the mask pattern as a mask.

12. A method for manufacturing a semiconductor device according to claim 11, further comprising the step of:
    forming a third film pattern to be connected to the second film pattern by a droplet discharge method.

13. A method for manufacturing a semiconductor device according to claim 11, wherein the photosensitive material is a negative photosensitive resin.

14. A method for manufacturing a semiconductor device according to claim 11, wherein the photosensitive material is a positive photosensitive resin.

15. A method for manufacturing a semiconductor device according to claim 11, wherein the first film pattern is a conductive film.

16. A method for manufacturing a semiconductor device according to claim 11, wherein the second film pattern is at least one of a gate electrode, a source electrode, or a drain electrode.

17. A method for manufacturing a semiconductor device according to claim 12, wherein the third film pattern is a wiring.

18. A method for manufacturing a semiconductor device according to claim 11, wherein the first film pattern is a semiconductor film.

19. A method for manufacturing a semiconductor device according to claim 11, wherein the second film pattern has a channel formation region, source region, or a drain region.

20. A method for manufacturing a semiconductor device according to claim 11, wherein the first film pattern is an insulating film.

21. A method for manufacturing a semiconductor device according to claim 11, wherein the second film pattern is an insulating film having an opening.

22. A method for manufacturing a semiconductor device, according to claim 1, wherein the laser beam has any wavelength of from ultraviolet light to infrared light.

23. A method for manufacturing a semiconductor device according to claim 11, wherein the laser beam has any wavelength of from ultraviolet light to infrared light.

* * * * *